United States Patent [19]
Koyama et al.

[11] Patent Number: 5,939,746
[45] Date of Patent: Aug. 17, 1999

[54] SEMICONDUCTOR MEMORY DEVICE AND MANUFACTURING METHOD OF THE SAME

[75] Inventors: Kuniaki Koyama; John Mark Drynan, both of Tokyo, Japan

[73] Assignee: NEC Corporation, Tokyo, Japan

[21] Appl. No.: 08/766,464

[22] Filed: Dec. 12, 1996

[30] Foreign Application Priority Data

Dec. 14, 1995 [JP] Japan ................................. 7-325469

[51] Int. Cl.⁶ ................................................ H01L 27/108
[52] U.S. Cl. ........................................ 257/306; 257/308
[58] Field of Search ............................. 257/300, 303, 257/306–310, 296

[56] References Cited

U.S. PATENT DOCUMENTS

| | | | |
|---|---|---|---|
| 5,235,199 | 8/1993 | Hamamoto et al. | 257/308 |
| 5,338,955 | 8/1994 | Tamura et al. | 257/308 |
| 5,444,278 | 8/1995 | Katayama | 257/296 |
| 5,497,016 | 3/1996 | Kohn | 257/308 |
| 5,604,696 | 2/1997 | Takaishi | 257/303 |
| 5,608,248 | 3/1997 | Ohno | 257/296 |
| 5,686,747 | 11/1997 | Jost et al. | 257/309 |
| 5,693,970 | 12/1997 | Ikemasu | 257/306 |

FOREIGN PATENT DOCUMENTS

| | | |
|---|---|---|
| A-56-58254 | 5/1981 | Japan . |
| A-56-58255 | 5/1981 | Japan . |
| A-64-13756 | 1/1989 | Japan . |
| A-3205861 | 9/1991 | Japan . |
| 5-251657 | 9/1993 | Japan . |
| A-5259389 | 10/1993 | Japan . |

Primary Examiner—Sara Crane
Attorney, Agent, or Firm—Sughrue, Mion, Zinn, Macpeak & Seas, PLLC

[57] ABSTRACT

A storage node electrode is connected to a contact plug via an upper node contact hole. A lower cell plate electrode composed of an N type silicon film and an N type silicon film spacer is covered by the storage node electrode via a titanium oxide film as a lower capacitive insulating film and an upper cell plate electrode composed of an N type silicon film connected to the lower cell plate electrode covers the storage node electrode via a titanium oxide film as an upper capacitive insulating film. Thus, in a DRAM having a stacked and COB type memory, a surface ratio of the storage node electrode, contributing to a capacitor, is increased.

23 Claims, 25 Drawing Sheets

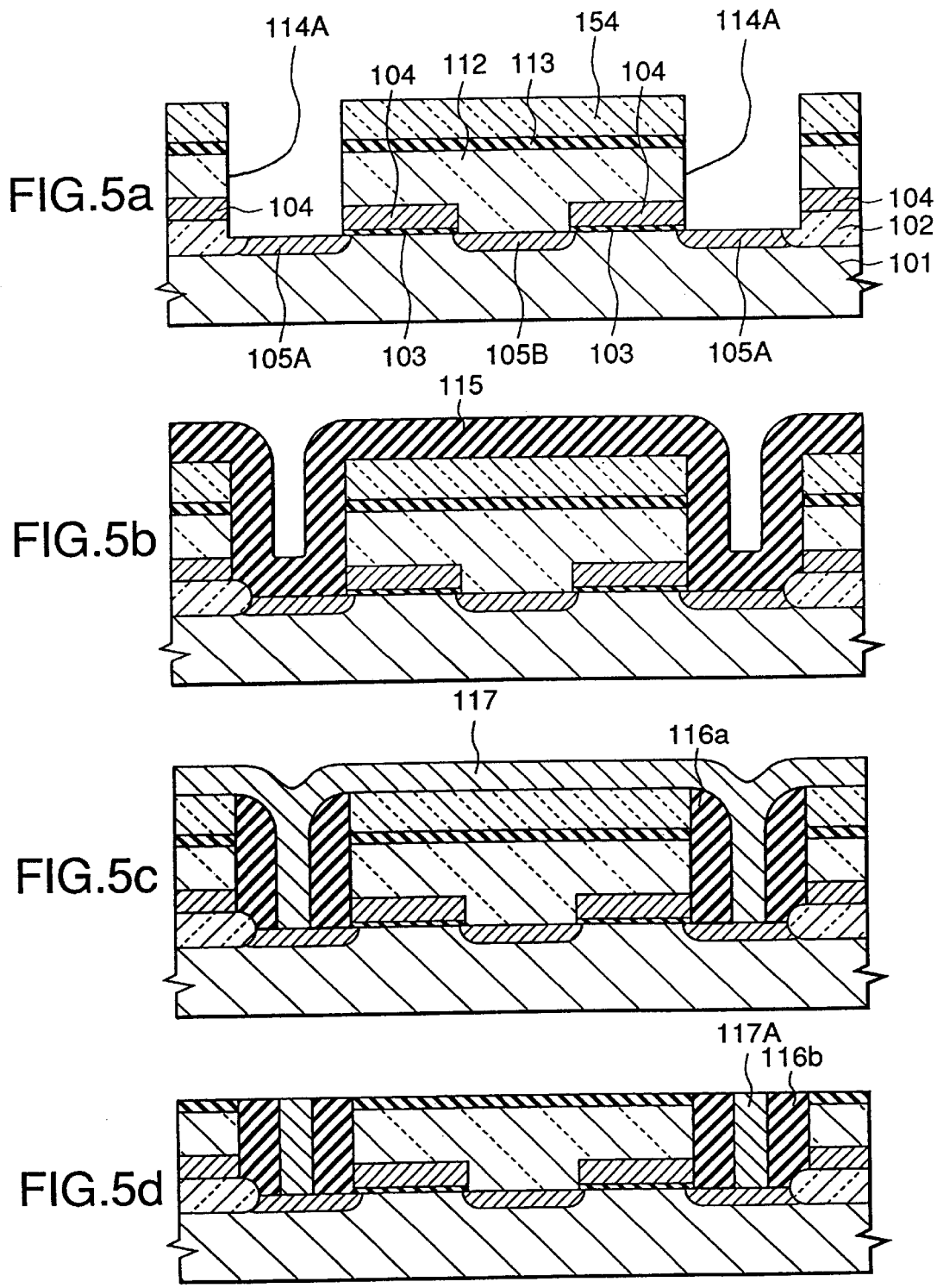

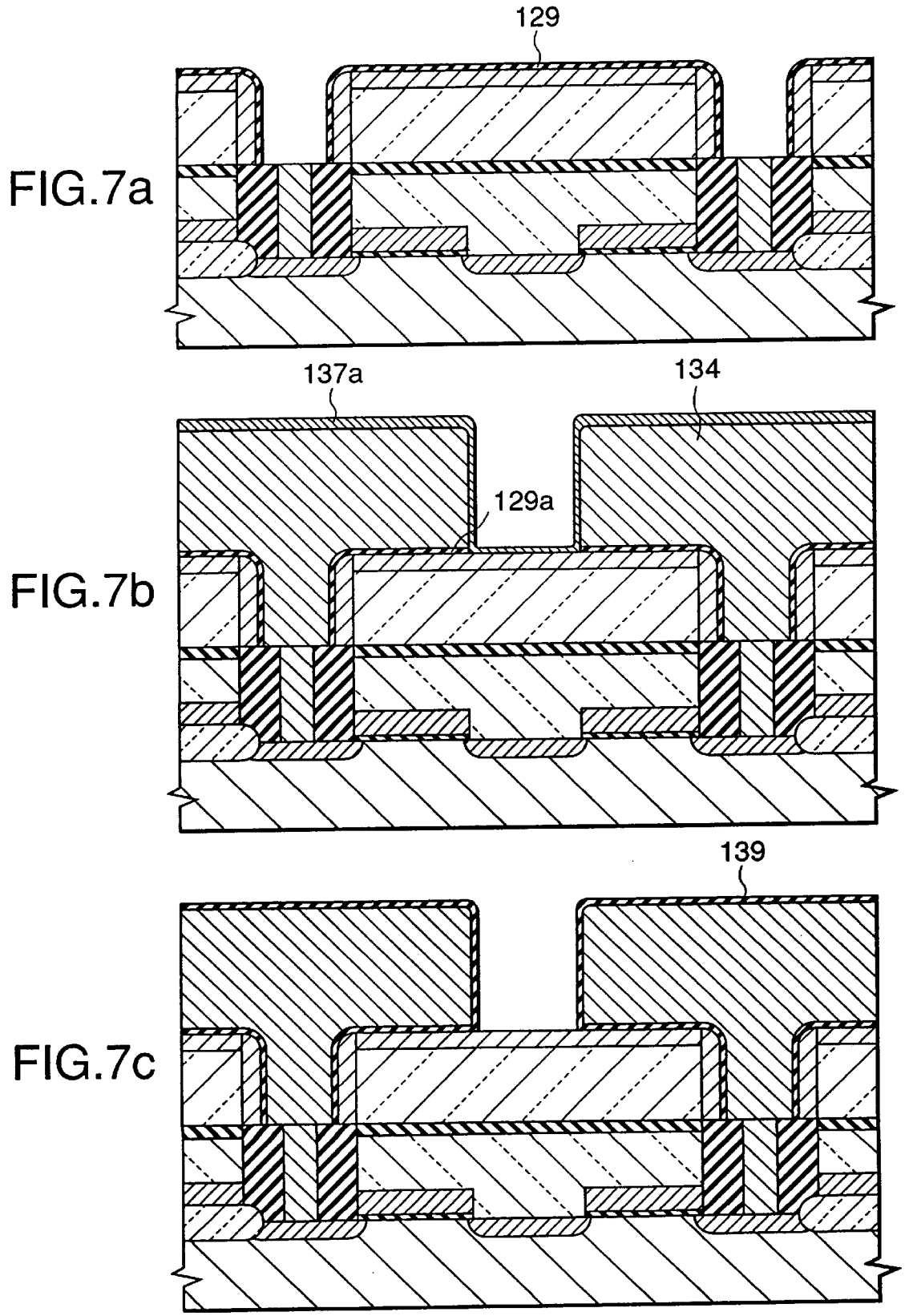

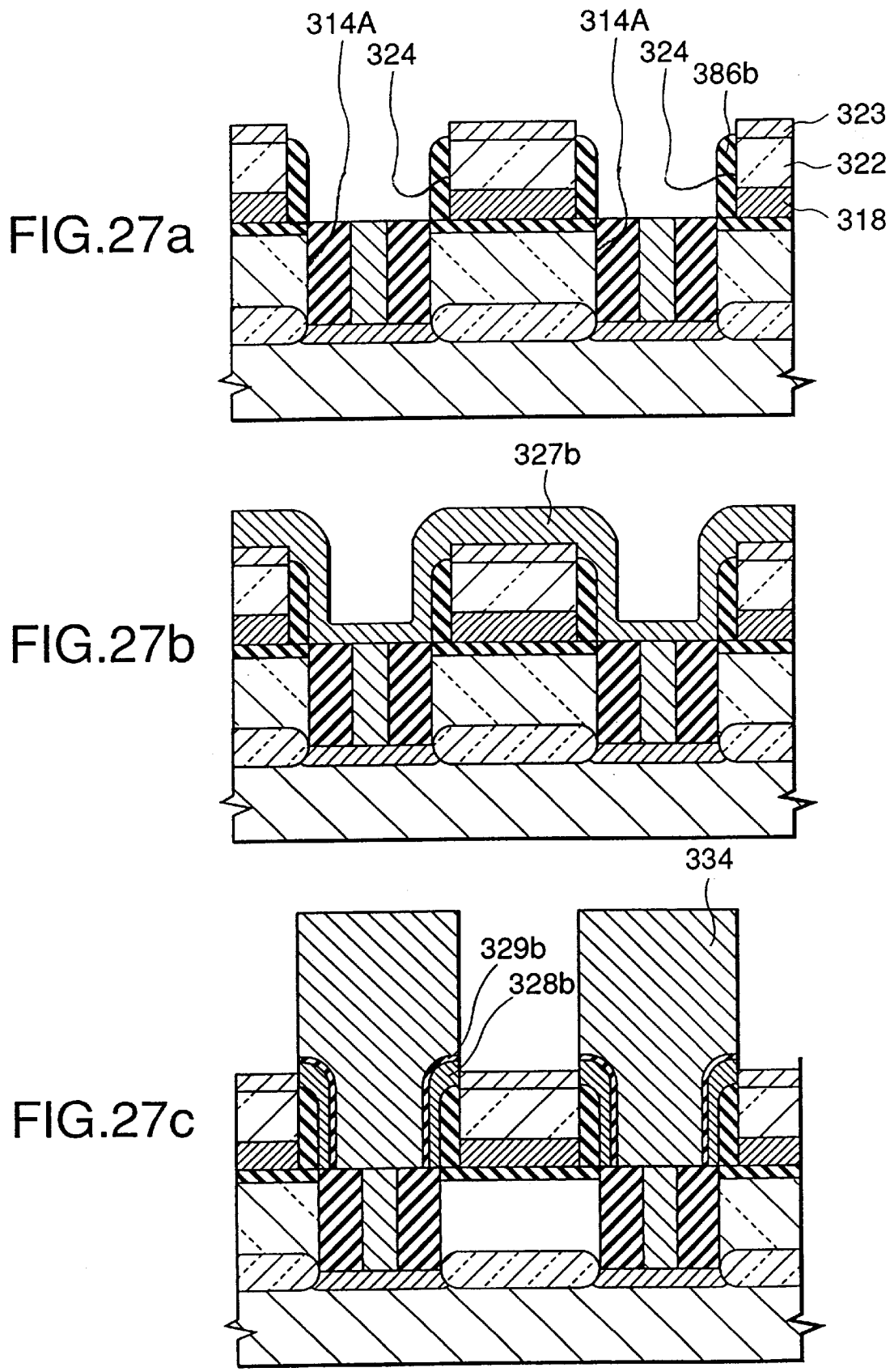

SEMICONDUCTOR MEMORY DEVICE AND MANUFACTURING METHOD OF THE SAME

BACKGROUND OF THE INVENTION

1. Field of the Invention

The present invention relates to a semiconductor memory device and a manufacturing method of the same, more particularly to a dynamic random access memory (hereinafter referred to as a DRAM) of a capacitor-over-bit-line type (referred to as COB type) in which a stacked type capacitor is arranged at a position higher than bit lines and a manufacturing method of the same.

2. Description of the Related Art

In the DRAM in which a memory cell consists of one transistor and one capacitor, an objective in developing the DRAM is to satisfy simultaneously a reduction in memory cell size and a reduction in memory cell capacitance in each memory cell with a good controllability, for requirements for a large capacitance of the DRAM. Reflecting in such technological trend, recent years, the DRAM having the stacked type capacitance has been mainly used. Furthermore, there has been a trend to increase an effective surface area of a storage node electrode, which is a member of the capacitor, per unit projection area by devising shapes of the storage node electrode three-dimensional. Corresponding to these trends, the COB type DRAM is coming to be mainly used. The adoption of the COB type DRAM offers such constitution that the storage node electrode, which has been arranged lower than the bit lines, is located at a position higher than the bit lines. Therefore, this facilitates to give a three dimensional shape to the storage node electrode.

When the descriptions for various proposals concerning the three dimensional shape of the storage node electrode are omitted, the structure of the conventional COB type DRAM having the stacked type capacitor will be summarized as follows.

In a region where memory cell arrays are formed in a surface of a P type silicon substrate, a plurality of element formation regions are arranged regularly which are defined by field oxide films. One word line traverses a plurality of the element formation regions interposing gate oxide films. The word lines are arranged in parallel in a Y-direction. In each of the element formation regions, at least one MOS transistor is formed which consists of a gate electrode formed of the word line, and N and N type source and drain regions which are formed in a surface of a P type silicon substrate in self-aligned with the word line. The surface of the P type substrate as well as the word lines is covered with a first underlayer insulating film. A bit contact hole reaching the N type drain region is formed in the first underlayer insulating film. A plurality of bit lines formed which are formed in parallel in a X-direction perpendicular to the Y-direction on the surface of the first underlayer insulating film are connected to the corresponding N type drain regions through the bit contact holes. The bit lines are arranged so as not to pass just above the N type source regions. The first underlayer insulating film as well as the bit lines is covered with a second underlayer insulating film.

Node contact holes, each of which penetrates the first and second underlayer insulating films and reaches the corresponding N type source region, are arranged at positions where the bit lines are not present. A capacitor consists of a cell plate electrode, a capacitive insulating film, and a storage node electrode connected to the corresponding N type source region. The storage node electrode connected to the N type source region through the node contact hole has a shape that it covers directly the surface of the second underlayer insulating film near the respective node contact hole. The capacitive insulating film covers directly a portion other than the portion of the surface of the second underlayer insulating film where the memory cell array is formed, the portion of the surface of the second underlayer insulating film being covered directly by the storage node electrode. The capacitive insulating film covers directly also a portion other than the portion of the surface of the storage node electrode which covers directly the node contact hole and the second underlayer insulating film. The cell plate electrode covers directly the entire surface of the capacitive insulating film positioned in the side which is not in contact with the second underlayer insulating film and the storage node electrode.

In the memory cell of the conventional COB type DRAM having the stacked type capacitor, to increase the capacitance value per projection area unit, the three-dimensional shape of the storage node electrode has been principally devised. As long as there is a restriction that each of the cell plate and the capacitive insulating film constituting the capacitor is formed of a sheet of a almost continuous film, the means to achieve an increase in the capacitance value is restricted only to the device of the shape of the storage node electrode. Whenever the present capacitive insulating film and cell plate are employed, of the portion of the surface of the storage node electrode, the portion other than the portion in which the node contact hole and the second underlayer insulating film are covered by the storage node electrode does not contribute to the formation of the capacitor.

SUMMARY OF THE INVENTION

The object of the present invention is to provide a semiconductor memory device in which a ratio of a surface of a storage node electrode is increased and a manufacturing method of the same.

A semiconductor memory device of the present invention comprises a first conductive layer serving as a first electrode of a capacitor in a memory cell, the first conductive layer having a first surface, a second surface extending in a direction so that the second surface intersects the first surface, and a third surface which extends from the second surface and faces to the first surface; a capacitive insulating film for the foregoing capacitor formed on the first, second, and third surfaces; and a second conductive layer serving as a second electrode of the foregoing capacitor, which is formed on the capacitive insulating film so as to face to the first, second, and third surfaces.

A semiconductor memory device of the present invention comprises an insulating film having a contact hole which covers a transistor in a memory cell; a contact hole formed in the insulating film so as to expose a portion of a transistor region; a first conductive layer formed on a surface of the insulating film; a second conductive layer which contacts partially with the transistor region through the contact hole and extends on the insulating film so as to overlap with at least a portion of the first conductive layer; a capacitive insulating film having first and second portions, the first portion being interposed between the foregoing portion of the first conductive layer and the second conductive layer formed on the portion of the first conductive layer, and the second portion being formed on the second conductive layer; and a third conductive layer formed on the second portion of the capacitive insulating layer, the third conductive layer contacting with the first conductive layer, wherein the first and third conductive layers constitute the cell plate of the capacitor in the memory cell, and the second conductive layer constitutes a storage node electrode of the capacitor.

A manufacturing method of the semiconductor memory device of the present invention comprises the steps of forming an impurity region for a transistor for a memory cell in a semiconductor substrate; forming an insulating film having a contact hole for exposing a portion of the impurity region in the semiconductor substrate; forming a first conductive layer at least in a portion of the surface of the insulating film; forming a first capacitive insulating film on the conductive layer; forming a second conductive layer coming into contact with a portion of the impurity region via the contact hole and placed oppositely to the first conductive layer via the first capacitive insulating film; forming a second capacitive insulating film coming into contact with the first capacitive insulating film and covering the second conductive layer; and forming a third conductive layer coming into contact with the first conductive layer and covering the second capacitive insulating film, wherein the first and third conductive layers, the first and second capacitive insulating films and the second conductive layer respectively constitute the first electrode, capacitive insulating film and second electrode of the capacitor.

It is preferred that the semiconductor memory device of the present invention is constructed in such a manner that a word line approximately in parallel with a first direction traverses the surfaces of element formation regions surrounded by field oxide films provided in element separation regions provided in the surface of a P type silicon substrate, having required shapes and regularly arranged in the first direction and a second direction orthogonal to this first direction via gate oxide films and N type source and drain regions self-aligned with such word lines are provided in these element formation regions; a first underlayer insulating film formed by laminating silicon nitride films on a first silicon oxide insulating film having a flat upper surface covers the surface of the P type silicon substrate including the word lines and a bit contact hole reaching the N type drain region and a lower node contact hole reaching the N type source region are provided in this first underlayer insulating film; the sides of the bit contact and lower node contact holes are directly covered by silicon nitride film spacers having flat surfaces coinciding with those of the silicon nitride films and filled with contact plugs via these silicon nitride film spacers; bit lines provided on the surface of the first underlayer insulating film approximately in parallel with a third direction intersecting the first direction are connected to the N type drain region via the bit contact hole, a second underlayer insulating film composed of a second silicon oxide film having a flat upper surface covers the surface of the first underlayer insulating film including the bit lines and an upper node contact hole having a shape containing at least the upper edge of the lower node contact hole and reaching the node contact holes is provided in this second underlayer insulating film; a lower cell plate electrode covering the upper surface of the second underlayer insulating film and the side of the upper node contact hole comes into contact with the upper surface of the silicon nitride film spacer in the upper edge of the lower contact hole; a lower capacitive insulating film directly covering the surface of the lower cell plate electrode in the upper node contact hole and the surface of this lower cell plate electrode in a specified region in the vicinity of these lower node contact holes comes into contact only with the upper surface of the silicon nitride film spacer in the upper edge of the lower node contact hole; a storage node electrode covering the lower cell plate electrode in the specified region via the surface of lower capacitive insulating film and having a shape for filling the upper node contact hole is directly connected to the upper surface of the contact plug with which the upper node contact hole is filled and comes into contact with the upper surface of the silicon nitride spacer in the vicinity of these contact plugs; an upper capacitive insulating film made of the same composition material for the lower capacitive insulating film directly covers a portion for filling the upper node contact hole and the surface of the storage node electrode excluding a portion for filling the lower cell plate electrode via these lower capacitive insulating films and is directly connected to these lower capacitive insulating films all around the periphery of the end of the specified region; and an upper cell plate electrode is provided, covering the storage node electrode via the upper capacitive insulating film and being directly connected to the lower cell plate electrode in a gap between these storage node electrodes.

It is also preferred that the foregoing bit contact hole and the lower node contact hole are provided self-aligned with the word line. Silicon oxide film spacers covering at least the sides of these upper node contact holes and coming into contact with the upper surfaces of the silicon nitride film spacers are provided in the upper node contact holes and these upper node contact holes are provided self-aligned with the bit lines. At least a portion of the upper surface of the contact plug for filling the lower node contact hole is made of a conductive oxide.

It is further preferred that the lower cell plate electrode is constituted of a first conductive layer provided only in the upper surface of the second underlayer insulating film and a second conductive film directly connected to the side of this first conductive film and covering the side of the upper node contact hole.

Alternatively, the lower cell plate electrode is constituted of a first conductive film provided only in the upper surface of the second underlayer insulating film, a second conductive film covering the side of at least the upper node contact hole and a third conductive film directly connected to the upper surface of this first conductive film in the specified region and the surface of the second conductive film. The upper surface of the first conductive film at least in the gap of the storage node electrode is made of a conductive oxide.

Alternatively, the lower cell plate electrode is constituted of a first conductive film provided only in the upper surface of the second underlayer insulating film, a second conductive film directly connected to the upper surface of this first conductive film and provided only in the upper surface of the first conductive film in the specified region and a third conductive film directly connected to the side of at least the second conductive film and covering the sides of the first conductive film and the upper node contact hole. The upper surface of the first conductive film at least in the gap of the storage node electrode is made of a conductive oxide.

Otherwise, the lower cell plate electrode is constituted of a first conductive film provided only in the upper surface of the second underlayer insulating film and a second conductive film directly connected to the upper surface of this first conductive film in the specified region and covering the side of the upper node contact hole. The upper surface of the first conductive film at least in the gap of the storage node electrode is made of a conductive oxide.

A first mode of the manufacturing method of the semiconductor memory device of the invention comprises the steps of forming field oxide films in the element separation regions of the surface of a P type silicon substrate, forming gate oxide films in element formation regions regularly arranged in the first direction of the surface of the P type silicon substrate and a second direction orthogonal to the first direction, forming word lines approximately in parallel with this first direction on the surface of the P type silicon substrate and forming N type source and drain regions self-aligned with these word lines in the element formation regions; forming a first underlayer insulating film formed by laminating first silicon nitride films on a first silicon oxide insulating film having a flat upper surface on the full surface thereof, forming a silicon oxide film of a required thickness on the full surface and forming lower node contact holes and bit contact holes penetrating this oxide silicon film and the first underlayer insulating film and reaching the N type source and drain regions; forming second silicon nitride films having first specified film thicknesses by means of LPCVD, etching back these second silicon nitride films and leaving the second silicon nitride films only in the sides of the lower node contact holes and the bit contact holes; forming a first conductive film on the full surface; performing CMP for the first conductive film, the left second silicon nitride films and the silicon oxide films until the upper surfaces of the first silicon nitride films are exposed and forming and leaving silicon nitride film spacers having flat surfaces coinciding with the upper surfaces of the first silicon nitride films and contact plugs composed of the first conductive film for filling the lower node contact holes and the bit contact holes via the silicon nitride film spacers; forming bit lines approximately in parallel with a third direction intersecting the first direction on the surface of the first underlayer insulating film and forming a second underlayer insulating film composed of second oxide silicon films having flat surfaces and a second conductive film on the full surface in sequence; forming upper contact node holes penetrating the second conductive film and the second underlayer insulating film and reaching the lower contact holes; forming a third conductive film having a second film thickness on the full surface by means of LPCVD; etching back the third conductive film until the upper surfaces of the contact plugs are exposed, leaving the third conductive film directly connected to the second conductive film in the vicinity of the upper ends of the lower node contact holes and coming into contact only with the upper surfaces of the silicon nitride film spacers in the upper ends of the lower node contact holes and forming a lower cell plate electrode composed of the second and third conductive films; forming a first nitride metal film composed of an interstitial compound having a film thickness of a third specified film thickness in the sides of the lower node contact holes by means of sputtering and LPCVD and a film thickness in the upper surface of the lower cell plate electrode thicker than the third film thickness; etching back the first nitride metal film until the upper surfaces of the contact plugs are exposed and the film thickness in the upper surface of the lower cell plate electrode and the film thickness in the sides of the lower node contact holes are equal to each other and leaving the first nitride metal film coming into contact only with the upper surfaces of the silicon nitride film spacers in the upper ends of the lower node contact holes; oxidizing the left first nitride metal film and converting this into a first capacitive insulating film; forming a fourth conductive film on the full surface, patterning the fourth conductive film and the first capacitive insulating film and forming a storage node electrode composed of the fourth conductive film directly connected to the contact plugs via the upper node contact holes and a lower capacitive insulating film composed of these first capacitive insulating films; forming a second nitride metal film having a film thickness of the third specified film thickness in the side of the storage node electrode, the same composition as the first nitride metal film and a film thickness larger than the third specified film thickness in the upper surface of the storage node electrode; etching back the second nitride metal film until the upper surface of the lower cell plate electrode n the gap of the storage node electrode is exposed and the film thickness in the upper surface of the storage node electrode is equal to that in the side of the storage node electrode and leaving the second nitride metal film covering the upper and side surfaces of the storage node electrode; oxidizing the left second nitride metal film and converting this into an upper capacitive insulating film; and forming a fifth conductive film on the full surface and forming an upper cell plate electrode directly connected to the upper surface of the lower cell plate electrode in the gap of the storage node electrode.

It is preferred that the lower node contact holes and the bit contact holes are formed self-aligned with the word lines. This mode further comprises the step of forming a second silicon oxide film on the full surface after the lower node contact holes are formed self-aligned with the bit lines, etching back this second silicon oxide film and forming silicon oxide film spacers with their upper ends positioned lower than the upper surface of the second conductive film for covering the bit lines exposed in the sides of the upper node contact holes in the sides of the same. The first and second nitride metal films are composed of titanium nitride films, tantalum nitride films, zirconium nitride films or niobium nitride films.

It is further preferred that at least the first, second and third conductive films and a fifth conductive film are formed by N type silicon films and plasma oxidation is used for oxidizing for forming the first capacitive insulating film and the upper capacitive insulating film. Alternatively, formation of the first conductive film is composed of forming a barrier film and a metal film selected from a ruthenium film, an iridium film, a rhodium film, a rhenium film or an osmium film, a conductive oxide of this metal film is formed at least on the upper surface of the contact plug for filling the lower node contact hole and at least the second, third and fifth conductive films are formed by N type silicon films. Otherwise, formation of the first conductive film is composed of forming a barrier film and forming a conductive film made of a conductive oxide selected from a ruthenium oxide, an iridium oxide, a rhodium oxide, a rhenium oxide or an osmium oxide and at least the second, third and fifth conductive films are formed by N type silicon films.

A second mode of the manufacturing method of the semiconductor memory device of the invention comprises the steps of forming field oxide films in the element separation regions of the surface of a P type silicon substrate, forming gate oxide films in element formation regions regularly arranged in the first direction of the surface of this P type silicon substrate and a second direction orthogonal to the first direction, forming word lines approximately in parallel with the first direction on the surface of the P type silicon substrate and forming N type source and drain regions self-aligned with these word lines in the element formation regions; forming a first underlayer insulating film created by laminating first nitride silicon films on a first silicon oxide insulating film having a flat surface on the full surface, a silicon oxide film having a required film thickness on the full surface and forming lower node contact holes and bit contact holes penetrating this silicon oxide film and the first underlayer insulating film and reaching the N type source and drain regions; forming a second silicon nitride film having a first specified film thickness on the full surface by means of LPCVD, etching back this second silicon nitride film and leaving these second silicon nitride films only in the sides of the lower node contact holes and the bit contact holes; forming a first conductive film on the full surface; performing CMP for the first conductive film, the left second silicon nitride films and the silicon oxide film until the upper surfaces of the first silicon nitride films are exposed and forming and leaving silicon nitride film spacers having flat upper surfaces coinciding with the upper surfaces of the first silicon nitride films and contact plugs composed of the first conductive film for filling the lower node contact holes and the bit contact holes via these silicon nitride film spacers; forming bit lines approximately in parallel with a third direction intersecting the first direction on the surface of the first underlayer insulating film and forming a second underlayer insulating film composed of a second silicon oxide film having a flat upper surface and a second conductive film on the full surface in sequence; forming upper node contact holes penetrating the second conductive film and the second underlayer insulating film and reaching the lower node contact holes; forming a third conductive film having a second specified film thickness on the full surface by means of LPCVD; etching back the third conductive film until the upper surfaces of the contact plugs are exposed, leaving the third conductive film directly connected to the second conductive film in the vicinity of the upper ends of the upper node contact holes and coming into contact only with the upper surfaces of the silicon nitride film spacers in the upper ends of the lower node contact holes and forming a lower cell plate electrode composed of this second conductive film and this third conductive film; forming a first nitride metal film composed of an interstitial compound having a film thickness of a third specified film thickness in the sides of the upper node contact holes by means of sputtering and LPCVD and a film thickness in the upper surface of the lower cell plate electrode larger than this third specified film thickness; etching back the first nitride metal film until the upper surfaces of the contact plugs are exposed and the film thickness in the upper surface of the lower cell plate electrode is equal to that in the sides of lower node contact holes and leaving the first nitride metal film coming into contact only with the upper surfaces of the silicon nitride film spacers in the upper ends of the lower node contact holes; oxidizing the left first nitride metal film and converting this into a first capacitive insulating film; forming a fourth conductive film on the full surface, forming a second nitride metal film having at least the third specified film thickness and the same composition as the first nitride metal film on the full surface, patterning this second nitride metal film, this fourth conductive film and the first capacitive insulating film and forming a storage node electrode composed of this fourth conductive film directly connected to the contact plugs via the upper node contact holes and a lower capacitive insulating film composed of this first capacitive insulating film; forming a third nitride metal film having a film thickness of the third specified film thickness and the same composition as the first nitride metal film on the full surface by means of LPCVD; etching back the second and third nitride metal films until the upper surface of the lower cell plate electrode in the gap of the storage node electrode is exposed and a film thickness in the upper surfaces of these storage node electrodes is equal to that in the sides thereof and leaving the second and third nitride metal films covering the upper surfaces and sides of these storage node electrodes; oxidizing the left second and third nitride metal films and converting these into upper capacitive insulating films covering the storage node electrodes; and forming a fifth conductive film on the full surface and forming an upper cell plate electrode directly connected to the upper surface of the lower cell plate electrode in the gap of the storage node electrode.

It is preferred that the lower node contact holes and the bit contact holes are formed self-aligned with the word lines. This mode further comprises the step of forming a second silicon oxide film on the full surface by means of LPCVD after the lower node contact holes are formed self-aligned with the bit lines, etching back this second silicon oxide film and forming silicon oxide film spacers having upper ends positioned lower than the upper surface of the second conductive film and covering the bit lines exposed in the sides of these upper node contact holes in the sides of the same. The first, second and third nitride metal films are composed of titanium nitride films, tantalum nitride films, zirconium nitride films or niobium nitride films.

It is further preferred that at least the first, second, third and fifth conductive films are formed by N type silicon films and plasma oxidation is used for oxidizing for formation of the first capacitive insulating film and the upper capacitive insulating film. Alternatively, formation of the first conductive film is composed of forming a barrier film and a metal film selected from a ruthenium film, an iridium film, a rhodium film, a rhenium film or an osmium film, the conductive oxides of this metal film are formed at least on the upper surfaces of the contact plugs for filling the lower node contact holes and at least the second, third and fifth conductive films are formed by N type silicon films. Otherwise, formation of the first conductive film is composed of forming a barrier film and a conductive film made of a conductive oxide selected from a ruthenium oxide, an iridium oxide, a rhodium oxide, a rhenium oxide or an osmium oxide and at least the second, third and fifth conductive films are formed by N type silicon films.

A third mode of the manufacturing method of the semiconductor memory device of the invention comprises the steps of forming field oxide films in the element separation regions of the surface of a P type silicon substrate, forming gate oxide films in element formation regions regularly arranged in the first direction of the surface of this P type silicon substrate and a second direction orthogonal to this first direction, forming word lines in parallel with the first direction on the surface of the P type silicon substrate and forming N type source and drain regions self-aligned with these word lines in these element formation regions; forming a first underlayer insulating film created by laminating first silicon nitride films on a first silicon oxide insulating film having a flat upper surface on the full surface, forming a silicon oxide film having a required film thickness on the full surface and forming lower node contact holes and bit contact holes penetrating this silicon oxide film and the first underlayer insulating film and reaching the N type source and drain regions; forming second silicon nitride films having first specified film thicknesses on the full surface by means of LPCVD, etching back these silicon nitride films and leaving these silicon nitride films only in the sides of the lower node contact holes and the bit contact holes; forming a first conductive film on the full surface; performing CMP for the first conductive film, the left second silicon nitride films and the silicon oxide film until the upper surfaces of the first silicon nitride films are exposed and forming and leaving silicon nitride film spacers having flat upper surfaces coinciding with the upper surfaces of the first silicon nitride films and contact plugs composed of the first conductive film for filling the lower node contact holes and the bit contact holes via these silicon nitride film spacers; forming bit lines approximately in parallel with a third direction intersecting the first direction on the surface of the first underlayer insulating film and forming a second underlayer insulating film composed of a second silicon oxide film having a flat upper surface and a second conductive film on the full surface in sequence; forming upper node contact holes penetrating the second conductive film and the second underlayer insulating film and reaching the lower node contact holes; forming a third conductive film having a second specified film thickness on the full surface by means of LPCVD; etching back the third conductive film until the upper surfaces of the contact plugs are exposed and leaving the third conductive film directly connected to the second conductive film in the vicinity of the upper ends of the lower node contact holes and coming into contact only with the upper surfaces of the silicon nitride films in the upper ends of the lower node contact holes; forming a first nitride metal film composed of an interstitial compound having a film thickness of a third specified film thickness in the sides of the lower node contact holes and a film thickness in the upper surface of the second conductive film thicker than the third specified film thickness; etching back the first nitride metal film until the upper surfaces of the contact plugs are exposed and the film thickness in the upper surface of the second conductive film is equal to that in the sides of the upper node contact holes and leaving the first nitride metal film coming into contact only with the upper surfaces of the silicon nitride film spacers in the upper ends of the lower node contact holes; forming a first capacitive insulating film by oxidizing the left nitride metal film and leaving a first nitride metal film of a fourth specified film thickness; forming a fourth conductive film on the full surface, patterning this fourth conductive film, the first capacitive insulating film and the left first nitride metal film and forming a storage node electrode composed of this fourth conductive film directly connected to the contact plugs via the upper node contact holes, a lower capacitive film composed of this first capacitive insulating film and a lower cell plate electrode composed of the second conductive film, the left third conductive film and the left and patterned first nitride metal film; forming a second nitride metal film having a film thickness of a fifth specified film thickness equal to a difference between the third specified film thickness and the fourth specified film thickness in the side of the storage node electrode and the same composition as the first nitride metal film having a film thickness larger than the fifth specified film thickness in the upper surface of the storage node electrode; etching back the second nitride metal film until the upper surface of the lower cell plate electrode in the gap of the storage node electrode is exposed and the film thickness in the storage node electrode is equal to that in the side thereof and leaving the second nitride metal film covering the upper and side surfaces of the storage node electrode; oxidizing the left second nitride metal film and converting this into an upper capacitive insulating film; and forming a third nitride metal film having the same composition as the first nitride metal film by means of LPCVD and forming an upper cell plate electrode directly connected to the upper surface of the lower cell plate electrode in the gap of the storage node electrode.

It is preferred that the lower node contact holes and the bit contact holes are formed self-aligned with the word lines. This mode further comprises the step of forming a second silicon oxide film on the full surface by means of LPCVD, etching back this second silicon oxide film and forming silicon oxide film spacers having upper ends positioned lower than the upper surface of the second conductive film and covering the bit lines exposed in the sides of the upper node contact holes in the sides of the same. The first, second and third nitride metal films are composed of titanium nitride films, tantalum nitride films, zirconium nitride films or niobium nitride films.

It is further preferred that at least the first, second and third conductive films are formed by N type silicon films and plasma oxidation is used for oxidizing for formation of the first capacitive insulating film and the upper capacitive insulating film. Alternatively, formation of the first conductive film is composed of forming a barrier film and forming a metal film selected from a ruthenium film, an iridium film, a rhodium film, a rhenium film or an osmium film, the conductive oxide of this metal film is formed at least in the upper surface of the contact plug for filling the lower node contact hole and at least the second and third conductive films are formed by N type silicon films. Otherwise, formation of the first conductive film is composed of forming a barrier film and forming a conductive film made of a conductive oxide selected from a ruthenium oxide, an iridium oxide, a rhodium oxide, a rhenium oxide or an osmium oxide and at least the second and third conductive films are formed by N type silicon films.

A fourth mode of the manufacturing method of the semiconductor memory device of the invention comprises the steps of forming field oxide films in the element separation regions of the surface of a P type silicon substrate, forming gate oxide films in element formation regions regularly arranged in the first direction of the surface of this P type silicon substrate and a second direction orthogonal to the first direction, forming word lines approximately in parallel with the first direction on the surface of the P type silicon substrate and forming N type source and drain regions self-aligned with these word lines in these element formation regions; forming a first underlayer insulating film created by laminating first silicon nitride films on a first silicon oxide insulating film having a flat surface on the full surface, forming a silicon oxide film having a required film thickness on the full surface and forming lower node contact holes and bit contact holes penetrating this silicon oxide film and the first underlayer insulating film and reaching the N type source and drain regions; forming second silicon nitride films of first specified film thicknesses by means of LPCVD on the full surface, etching back these second silicon nitride films and leaving the second silicon nitride films only in the sides of the lower node contact holes and the bit contact holes; forming a first conductive film created by laminating films selected from ruthenium films, iridium films, rhodium films, rhenium films, osmium films, ruthenium oxide films, iridium oxide films, rhodium oxide films, rhenium oxide films or osmium oxide films on a barrier film on the full surface; performing CMP for the first conductive film, the left second silicon nitride films and the silicon oxide film until the upper surfaces of the first nitride silicon films are exposed and forming and leaving silicon nitride film spacers having flat upper surfaces coinciding with the upper surfaces of the first silicon nitride films and contact plugs for filling the lower node contact holes and the bit contact holes via these silicon nitride film spacers; forming bit lines approximately in parallel with a third direction intersecting the first direction on the surface of the first underlayer insulating film and forming a second underlayer insulating film composed of a second silicon oxide insulating film having a flat upper surface on the full surface; forming a second conductive film composed of a ruthenium film, an iridium film, a rhodium film, a rhenium film, an osmium film, a ruthenium oxide film, an iridium oxide film, a rhodium oxide film, a rhenium oxide film or an osmium oxide film on the full surface; forming a third conductive film composed of an N type silicon film and forming upper node contact holes penetrating the third and second conductive films and the second underlayer insulating film and reaching the lower node contact holes; forming a fourth conductive film composed of an N type silicon film having a second specified film thickness on the full surface by means of LPCVD; etching back the fourth conductive film until the upper surfaces of the contact plugs are exposed and leaving the fourth conductive film directly connected to the second conducive film in the vicinity of the upper ends of the upper node contact holes and coming into contact only with the upper surfaces of the silicon nitride film spacers in the upper ends of the lower node contact holes; forming a first capacitive insulating film composed of a silicon oxide film by heat-oxidizing the exposed surfaces of the third and fourth conductive films; forming a fifth conductive film composed of an N type silicon film on the full surface, patterning this fifth conductive film, the first capacitive insulating film and the third conductive film and forming a storage node electrode composed of this fifth conductive film directly connected to the contact plug via the lower node contact hole, a lower capacitive insulating film constituted of this first capacitive insulating film and a lower cell plate electrode composed of the second, third and fourth conductive films; forming an upper capacitive insulating film composed of a silicon oxide film by heat-oxidizing the second conductive film of the lower cell plate and the exposed surface of the storage node electrode; and forming a sixth conductive film composed of an N type silicon film on the full surface and forming an upper cell plate electrode directly connected to the upper surface of the lower cell plate electrode in the gap of the storage node electrode.

It is preferred that the lower node contact holes and the bit lines are formed self-aligned with the word lines. This mode further comprises the step of forming a second silicon oxide film by means of LPCVD on the full surface after the upper node contact holes are formed self-aligned with the bit lines, etching back this second silicon oxide film and forming silicon oxide film spacers covering these upper node contact holes.

A fifth mode of the manufacturing method of the semiconductor memory device of the invention comprises the steps of forming field oxide films in the element separation regions of the surface of a P type silicon substrate, forming gate oxide films in element formation regions regularly arranged in the first direction of the surface of this P type silicon substrate and a second direction orthogonal to the first direction, forming word lines approximately in parallel with this first direction on the surface of the P type silicon substrate and forming N type source and drain regions self-aligned with these word lines in the element formation regions; forming a first underlayer insulating film created by laminating first silicon nitride films on a first silicon oxide insulating film having a flat surface on the full surface, forming a silicon oxide film having a required film thickness on the full surface and forming lower node contact holes and bit contact holes penetrating this silicon oxide film and the first underlayer insulating film and reaching the N type source and drain regions; forming second silicon nitride films having first specified film thicknesses on the full surface by means of LPCVD, etching back the second silicon nitride films and leaving the second nitride films only in the sides of the lower node contact holes and the bit contact holes; forming a first conductive film composed of a film created by laminating ruthenium films, iridium films, rhodium films, rhenium films, osmium films, ruthenium oxide films, iridium oxide films, rhodium oxide films, rhenium oxide films or osmium oxide films on a barrier film or an N type silicon film; performing CMP for the first conductive film, the left second silicon nitride films and the silicon oxide film until the upper surfaces of the first silicon nitride films are exposed and forming and leaving silicon nitride film spacers having flat upper surfaces coinciding with the upper surfaces of these first silicon nitride films and contact plugs composed of the first conductive films for filling the lower node contact holes and the bit contact holes via the silicon nitride film spacers; forming bit lines approximately in parallel with a third direction intersecting the first direction on the surface of the first underlayer insulating film and forming a second underlayer insulating film composed of a second silicon oxide film having a flat upper surface on the full surface; forming a second conductive film composed of a ruthenium film, an iridium film, a rhodium film, a rhenium film, an osmium film, a ruthenium oxide film, an iridium oxide film, a rhodium oxide film, a rhenium oxide film, an osmium oxide film or an N type silicon film; forming upper node contact holes penetrating the second conductive film and the second underlayer insulating film and reaching the lower node contact holes; forming a first nitride metal film composed of an interstitial compound having a film thickness of a second specified film thickness in the sides of the lower node contact holes and a film thickness larger than this second specified film thickness in the upper surface of the second conductive film; etching back the first nitride metal film until the upper surfaces of the contact plugs are exposed and the film thickness in the upper surface of the second conductive film is equal to that in the side of the lower contact hole and leaving the first nitride metal film coming into contact only with the upper surfaces of the silicon nitride film spacers in the upper ends of the lower node contact holes; forming a first capacitive insulating film by oxidizing the surface of the left first nitride metal film and leaving the first nitride metal film of a third specified film thickness; forming a third conductive film on the full surface, patterning this third conductive film, the first capacitive insulating film and the left first nitride metal film and forming a storage node electrode composed of this fourth conductive film directly connected to the contact plugs via the upper node contact holes, a lower capacitive insulating film composed of this first capacitive insulating film and a lower cell plate electrode composed of the second conductive film and the left and patterned first nitride metal film; forming a second nitride metal film having a film thickness of a fourth specified film thickness equal to a difference between the second specified film thickness and the third specified film thickness in the side of the storage node electrode and the same composition as the first nitride metal film having a film thickness larger than this fourth specified film thickness in the upper surface of the storage node electrode by means of sputtering and LPCVD; etching back the second nitride metal film until the upper surface of the lower cell plate electrode in the gap of the storage node electrode is exposed and the film thickness in the upper surface of the storage node electrode is equal to that in the side thereof and leaving the second nitride metal film covering the upper and side surfaces of the storage node electrode; oxidizing the left second nitride metal film and converting this into an upper capacitive insulating film; and forming a third nitride metal film having the same composition as the first nitride metal film on the full surface by means of LPCVD and forming an upper cell plate electrode directly connected to the lower cell plate electrode in the gap of the storage node electrode.

It is preferred that the lower node contact holes and the bit contact holes are formed self-aligned with the word lines. This mode further comprises the step of forming a second silicon oxide film on the full surface by means of LPCVD after the upper node contact holes are formed self-aligned with the bit lines, etching back this second silicon oxide film and forming silicon oxide film spacers covering the sides of the upper node contact holes.

BRIEF DESCRIPTION OF THE DRAWINGS

By way of example and to make the description more clear, reference is made to the accompanying drawings in which:

FIGS. 5(a) to 5(d) are schematic section views taken along the line A—A of FIG. 1, showing manufacturing steps of a first manufacturing method of the first application example of the first embodiment;

FIGS. 7(a), 7(b), and 7(c) are schematic section views taken along the line A—A of FIG. 1, showing manufacturing steps of the first manufacturing method of the first application example of the first embodiment;

FIGS. 27(a), 27(b), and 27(c) are schematic section views showing principal manufacturing steps of the second application example of the third embodiment.

DETAILED DESCRIPTION OF THE PREFERRED EMBODIMENTS

A semiconductor memory device and a manufacturing method of the present invention will be described with reference to the accompanying drawings in detail below.

Figure 1A:
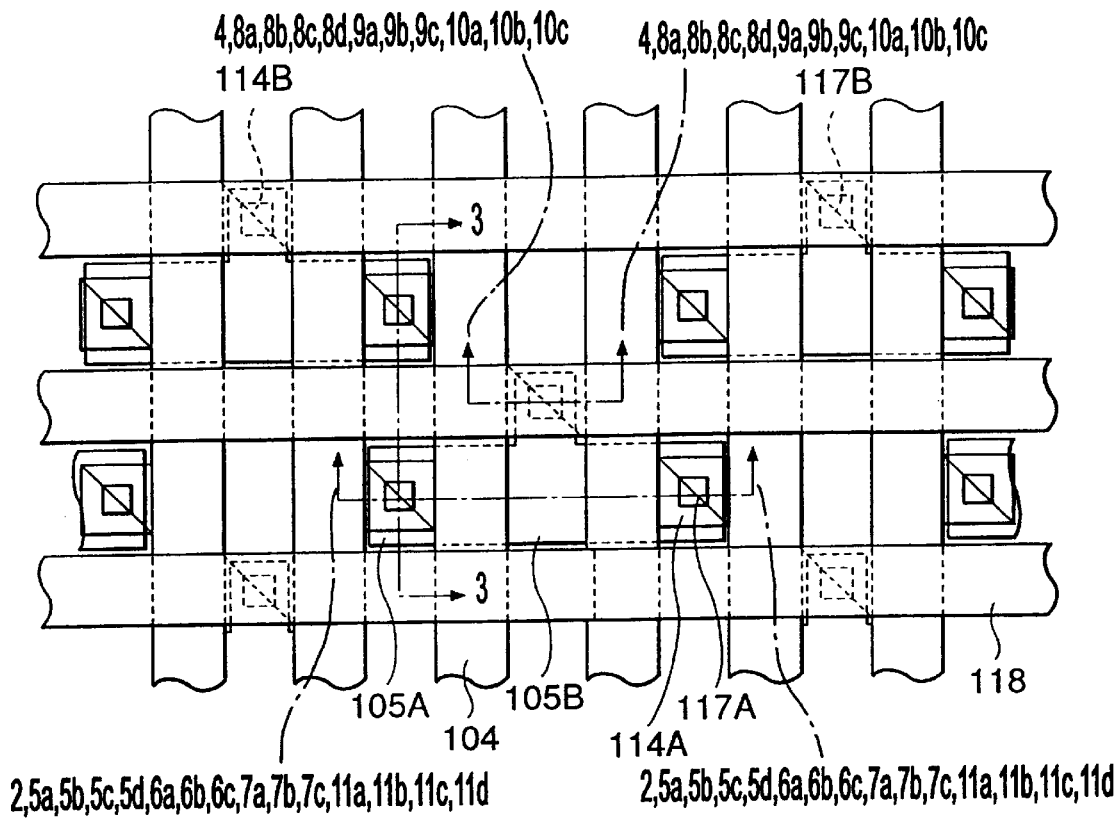
FIGS. 1(a) and 1(b) are schematic plan views of a first application example of a first embodiment of the present invention.
Figure 1B:
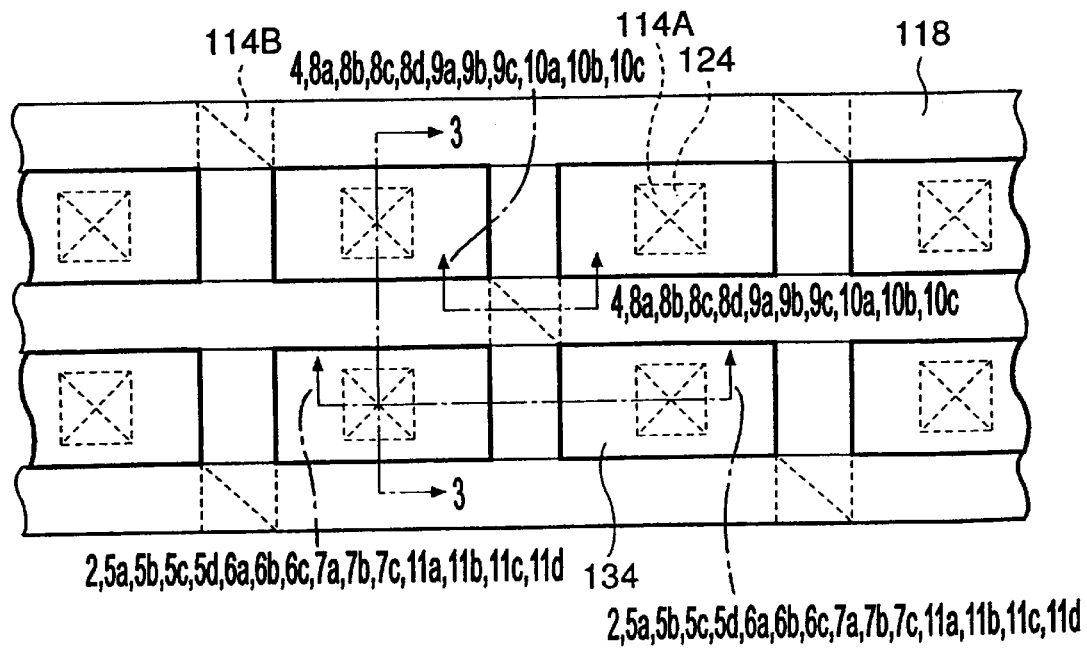
Figure 2:
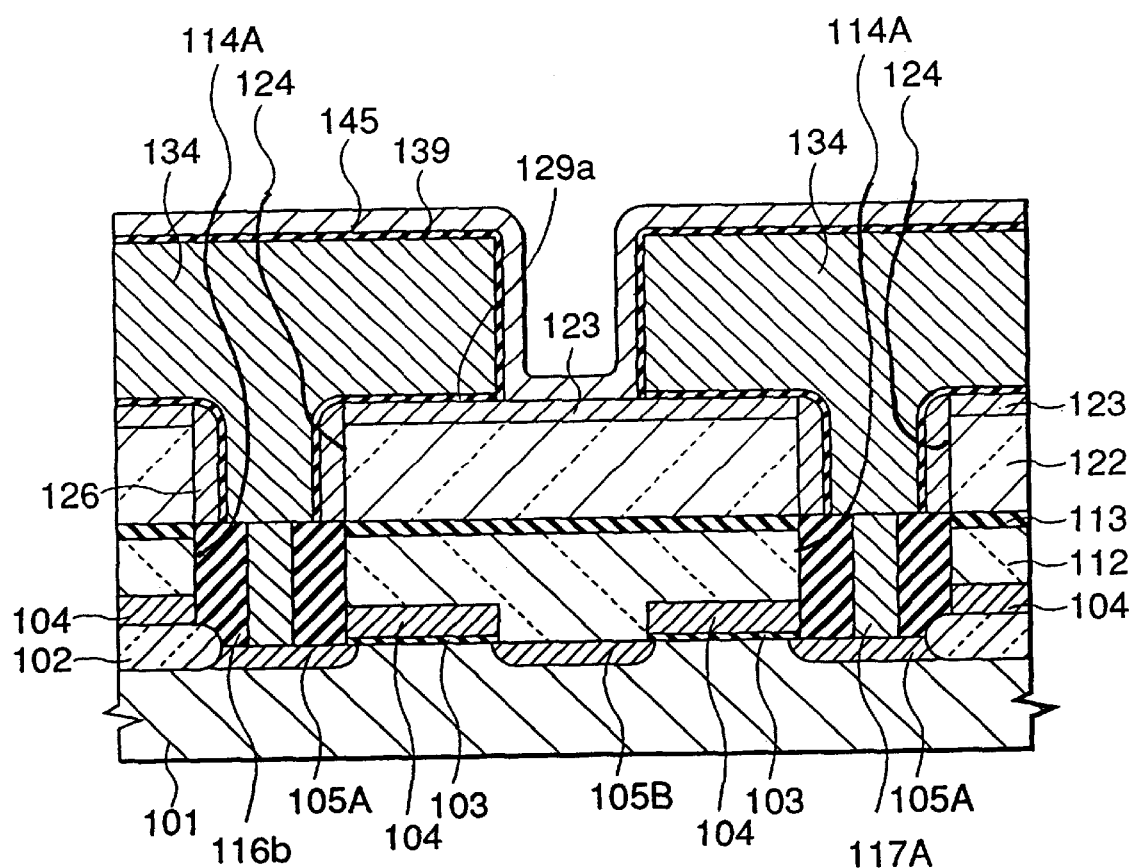
FIG. 2 is a schematic section view of the first embodiment of the present invention, taken along the line A—A of FIG. 1.
Figure 3:
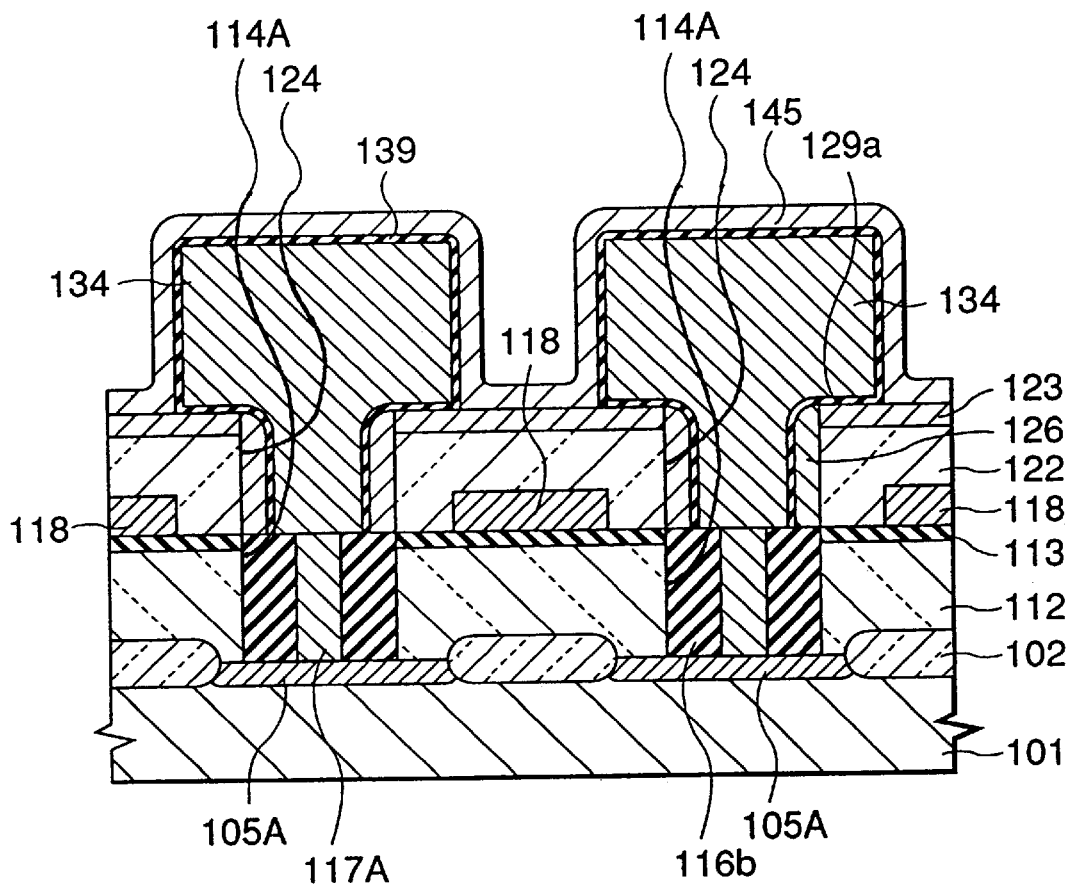
FIG. 3 is a schematic section view of the first embodiment of the present invention, taken along the line B—B of FIG. 1.
Figure 4:
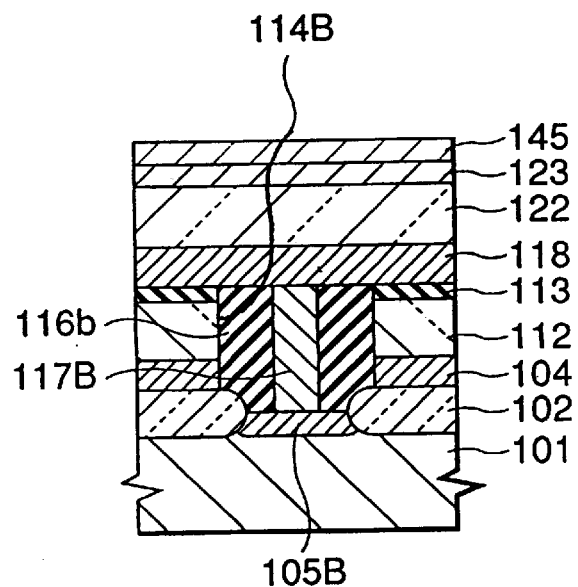
FIG. 4 is a schematic section view of the first embodiment of the present invention, taken along the line C—C of FIG. 1.
Figure 6A:
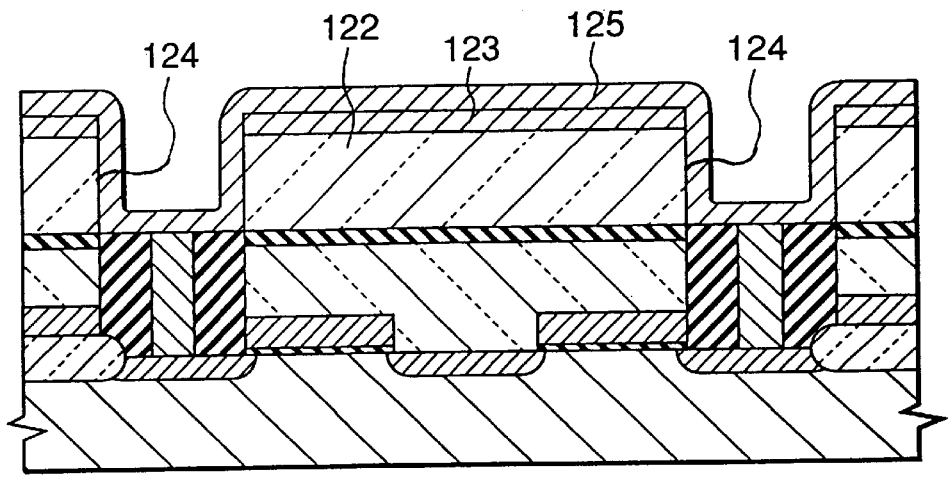
FIGS. 6(a), 6(b), and 6(c) are schematic section views taken along the line A—A of FIG. 1, showing manufacturing steps of the first manufacturing method of the first application example of the first embodiment.
Figure 6B:
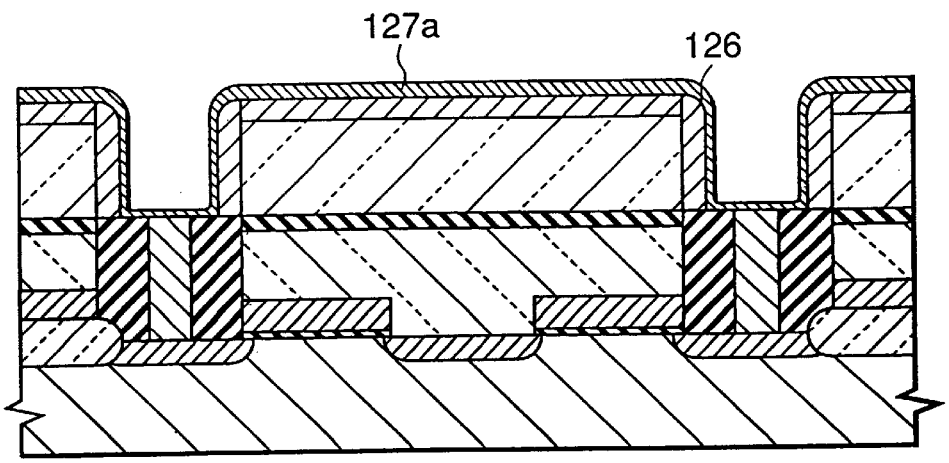
Figure 6C:
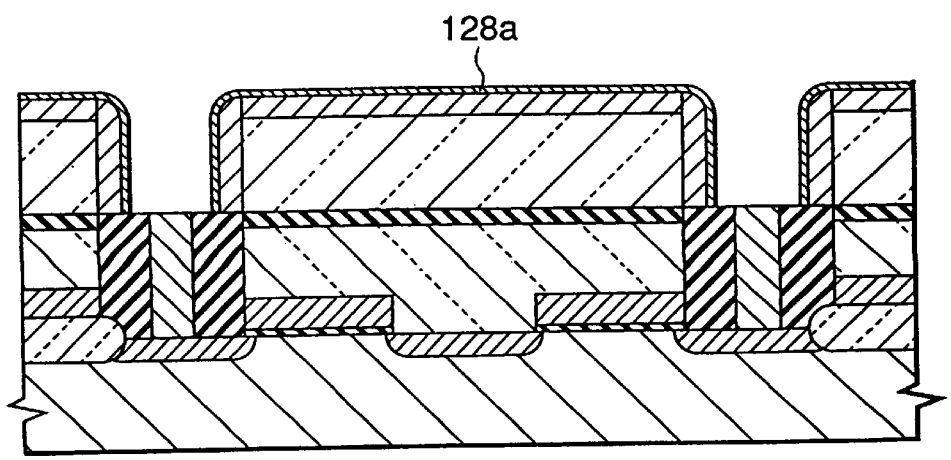

Referring to FIGS. 1(a) and 1(b) which are schematic plan views, each including word lines and bit lines of a memory cell array of a DRAM, and referring to FIGS. 2, 3, and 4 which are schematic section views taken along the lines A—A, B—B, and C—C, the DRAM according to a first application example of a first embodiment of the present invention is one of e.g. so called turning-up bit line form, including a COB type memory cell having a stacked type capacitor, formed based on a 0.5 μm rule. The memory cell of this DRAM has the following structure. For easiness for understanding, in FIG. 1(a) which is the schematic plan view, an element formation region including N-type source and N-type drain regions, word lines, and bit lines are illustrated as if they are separated from each other.

In the region 101 where the memory cell array in a surface of a P-type silicon substrate is formed, a plurality of element formation regions defined by field oxide films 102 of an LOCOS type having film thickness of about 400 nm are arranged regularly in an X-direction (lateral direction and a Y-direction perpendicular to the X-direction longitudinal direction). These element formation regions have approximately an oblong T-character shape. A plurality of word lines 104 formed in parallel in the Y-direction intersect the element formation regions interposing a gate oxide film 103 of about 10 nm thick. Line widths (gate length) and intervals of the word lines 104 are about 0.5 $\mu$m. Film thicknesses of the word lines 104 are about 200 nm. These word lines 104 are formed of such as a N-type polycrystalline silicon film and a tungsten polyside film. In each of the element formation regions, two N channel MOS transistors are formed, each of which is composed of a gate electrode formed of the word line 104, an N-type source region 105A, and a N-type drain region 105B. The N-type source and drain regions 105A and 105B are formed in self-alignment with the word line 104, and the drain region 105A is shared by these two MOS transistors. Depths of the N-type source and drain regions 105A and 105B are about 0.2 A width of the N-type source region 105A, i.e. a gate width, is about 0.8 $\mu$m.

A surface of the field oxide film 102 as well as the word lines 104 is covered with a first underlayer insulating film. The first underlayer insulating film 102 is composed of a first silicon oxide series insulating film having a flat surface, and a silicon nitride film 113 of about 300 nm thick covering this insulating film. The first silicon oxide series insulating film is composed of a silicon oxide film, for example, an HTO film, (not shown) of about 50 nm thick formed by an LPCVD method, which covers directly the word lines 104 and the field oxide film 102, and a BPSG film 112 having a flat surface. The film thickness of the portions of the BPSG film 104 just above the word lines 104 is about 250 nm.

In the first underlayer insulating film, lower layer node contact holes 114A having an area of about 0.5 $\mu$m$^2$, each of which extends to the N-type source region 105A, are formed. In this insulating film, bit contact holes 114B having an area of about 0.5 $\mu$m$^2$, each of which extends to the N-type drain region 105B, are also formed. Each of the bit contact holes 114B is arranged in a position which shifts from the lines connecting the lower layer node contact holes 114A in the X and Y-directions. These lower layer node contact holes and bit contact holes 114A and 114B are formed in self-alignment with the word lines 104. If the intervals between the word lines 104 are set to be larger than 0.5 $\mu$m, it is impossible to form the lower layer node contact holes and the bit contact holes 114A and 114B in self-alignment with the word lines 104.

Each side surface of the lower layer node contact hole and the bit contact hole 114A and 114B is covered directly with a silicon nitride film spacer 116*b*. The lower layer node contact hole and the bit contact hole 114A and 114B are filled with contact plugs 117A and 117B interposing the film spacers 116*b*, respectively. Each of the silicon nitride film spacers 116*b* has a flat upper surface at the same level as that of the silicon nitride film 116*b*. The width of the spacers 116*b* is about 150 nm. Upper surfaces of the contact plugs 117A and 117B are approximately at the same level as those of the film spacers 116*b*, and are almost flat. Each of these contact plugs 117A and 117B is formed of such as a stacked film formed by stacking a tungsten film on a barrier film composed of a titanium film and a titanium nitride film, or an N-type silicon film. Each of them is insulated from the word lines 104 by the corresponding silicon nitride film spacer 116*b*.

A plurality of bit lines 118 are formed at positions between the N-type source regions 105A in parallel with the X-direction. Each of the bit lines 118 is connected to the. plurality of the N-type drain regions 105A though the contact plugs 117B burying the corresponding bit contact holes 114B. The line width, interval, and film thickness of the bit lines 118 are about 0.5 $\mu$m, 0.8 $\mu$m, and 200 nm, respectively. The bit lines 118 are formed of such as a tungsten silicide film WSi$_2$) or a tungsten polycide film.

Surfaces of the first underlayer insulating film and the bit lines 118 are covered with a second silicon oxide series insulating film having a flat upper surface. The second silicon oxide series insulating film is formed of a stacked film composed of a second HTO film (not shown) of about 50 nm thick, which covers directly the bit lines 118, and a BPSG film 122 having a flat upper surface. The film thickness of the BPSG 122 located at the positions just above the bit line 118 is, for example, about 250 nm. An N-type silicon film 123 of about 150 nm thick, which is a first conductive film, is formed on the BPSG film located at the region where the memory cell array is formed. A silicon oxide film of about 50 nm thick, as a second silicon oxide series insulating film, should be further stacked on the BPSG film 122 according to a way to formation of the N-type silicon film 123.

Upper layer node contact holes 124 having an area of about 0.5 $\mu$m$^2$ are formed in the BPSG film 122, which extends to the corresponding lower layer node contact holes 114A through the N-type silicon film 123 and the BPSG film 122. Each of the upper layer node contact holes 124 is directly covered with corresponding N-type silicon film spacers 126 having a width of about 70 nm, which are second conductive films. A bottom surface of each of the N-type silicon film spacers 126 contacts only with an upper surface of each of the silicon nitride film spacers 116*b* at the upper ends of the lower layer node contact holes 114A. The bottom surface of each of the N-type silicon film spacers 126 is not in contact with the corresponding contact plugs 117A with a space having a width of about 80 nm between the contact plugs 117A and the N-type silicon film spacers 126. Furthermore, each of the N-type silicon film spacers 126 is connected to the side surface of the N-type silicon film 123 at the upper ends of the upper layer node contact holes 124. Specifically, the N-type silicon film spacers 126 are connected electrically each other through the N-type silicon film 123. In this application example, a lower cell plate electrode is constituted by the N-type silicon film 123 and the N-type silicon film spacers 126.

Each of storage node electrodes 134 formed of an N-type silicon film is connected to the upper end of the corresponding contact plugs 117A which fill the lower layer node contact holes 114A. Each of the storage node electrodes 134 has a contacting portion with a width of about 70 nm, which contacts with the upper surface of the corresponding silicon nitride film spacers 116*b* near the contact plugs 117A. A first titanium oxide (TiO$_2$) film 129*a* of about 10 nm thick as a lower capacitive insulating film is formed on the surfaces of the N-type silicon film 123 and the N-type silicon oxide film spacer 126 which are covered with the storage node electrode 134. The titanium oxide films 129*a* are selectively formed in self-aligned with the corresponding storage node electrode 134 only between the lower cell plate electrode and the storage node electrode 134. The films 129*a* are not formed at the positions between the storage node electrodes 134. The width of this positions are about 0.5 $\mu$m. Specifically, the titanium oxide films 129*a* are not shared by the plurality of the memory cells unlike the lower cell plate electrode, but each of the films 129*a* belong to the individual memory cell like the N-type silicon film spacers 126. Each of the titanium oxide films 129a as the capacitive insulating film corresponds to the silicon oxide film of about 2 μm thick.

According to the first embodiment, since the upper end of the nitride silicon film spacer 116b is flat, it is possible for the titanium oxide film 129a and the N-type silicon film spacer 126 to take the above-noted forms in the upper end section (lower end of the upper node contact hole 124) of the lower node contact hole 114.

The surface of each of the storage node electrodes 134 (this surface is referred to as upper and side surfaces for convenience) excluding a portion in contact with the lower node contact hole 114 and a portion in contact with the titanium oxide film 129a is covered by a second titanium oxide film 139 having a film thickness of about 10 nm as an upper capacitive insulating film. Each of these titanium oxide films 139 is directly connected to the titanium oxide film 129a all around the side lower end of the storage node electrode 134. Each of the upper cell plate electrodes formed by N-type silicon films having film thicknesses of about 150 nm covers the upper and side surfaces of the storage node electrode 134 via the titanium oxide film 139 and is directly connected to the N-type silicon film 123 in a portion (constituting the lower cell plate electrode) as a gap between the storage node electrodes 134 in the upper surface of the N-type silicon film 123.

The manufacturing method of the first application example of the first embodiment is not limited to one. Referring to FIGS. 1, 2, 3 and 4, FIGS. 5, 6 and 7 which are schematic section views taken along the line A—A of FIG. 1, showing the manufacturing steps of the DRAM memory cells, and FIGS. 8, 9 and 10 which are schematic section views taken along the line C—C of FIG. 1, showing the manufacturing steps of the DRAM memory cells, a first manufacturing method of the first application example of the first embodiment is as follows.

First, field oxide films 102 of a LOCOS type having film thicknesses of about 400 nm are formed in the element separation regions of the P-type silicon substrate 101 and gate oxide films 103 having film thicknesses of about 10 nm are formed in the element formation regions (of the memory cell arrays). An N-type silicon film having a film thickness of about 200 nm or a tungsten polycide film is formed on the full surface, this film is patterned and then a plurality of word lines 104 having line widths (gate lengths) of 0.5 μm and intervals of 0.5 μm are formed in parallel with a Y direction. By performing ion implantation of arsenic (As) having masked these word lines 104 (and photo resist films having openings at least in regions in which memory cell arrays are planned to be formed) masked, N-type source and drain regions 105A and 105B respectively having junctions depths of about 0.2 μm are formed in the element formation regions of the surface (of the memory cell arrays) of the P-type silicon substrate 101.

Among CMOS transistors constituting the peripheral circuit of the DRAM, an N channel MOS transistor is formed by the above-noted steps. In addition to these steps, by means of ion implantation of e.g. boron bifluoride ($Bf^2$) having masked the photo resist film covering a region in which memory cell arrays are to be formed and the region of the N channel MOS transistor constituting the peripheral circuit and having an opening in a region in which a P channel MOS transistor is to be formed, a P channel MOS transistor is formed, thereby finishing the formation of the CMOS transistor.

Then, after a first HTO film (not shown) having a film thickness of about 50 nm is formed on the full surface and a first BPSG film is formed, this BPSG film is caused to re-flow, CMP is performed and a BPSG film 112 having a flat upper surface is formed. Thus, the formation of the first silicon oxide insulating film constituting the first underlayer insulating film is finished. The reason for forming of the first HTO film is that this film is a good coating material for different levels and used for preventing the word lines 105 from directly touching the BPSG film 112. It should be noted that the constitution of the first silicon oxide film is not limited to a combination between the HTO film and the BPSG film. For instance, a first silicon insulating film can be constituted by making flat the upper surface of a silicon oxide film by means of CMP after forming a HTO film and this silicon oxide film by means of APCVD.

Subsequently, a first silicon nitride film 113 having a film thickness of about 30 nm is formed, finishing the formation of a first underlayer insulating film composed of the silicon nitride film 113, the BPSG film 112 and the first HTO film. A silicon oxide film 154 having a film thickness of at least 150 nm is further formed. The reasons for the flat surface of the BPSG film and providing of the silicon nitride film 113 will be described later. The silicon oxide film 154, the silicon nitride film 113, the BPSG film 112 and the first HTO film are etched in different directions in sequence by masking the photo resist film (not shown) and lower node contact holes 114A of about 0.5 $\mu m^2$ reaching the N-type source region 105A in self alignment with the word lines 104 and bit contact holes 114B of about 0.5 μm reaching the N-type drain region are formed. For this different direction etching, for instance trifluoro methane ($CHF_3$) is used as etching gas. Use of this etching gas enables reducing of a difference in etching speeds between the silicon nitride film and the silicon oxide film [FIGS. 1(a), 2, 3, 4, 5(a) and 8(a)].

Then, by means of LPCVD using di-chloro silane ($SiH_2Cl_2$) and ammonia as gaseous starting materials, a second silicon nitride film 115 having a film thickness of about 150 nm (as a first specified film thickness) is formed on the full surface. Use of LPCVD enables forming of the silicon nitride film 115 with different levels sufficiently coated and makes the film thickness of the silicon nitride film 115 covering the respective sides and bottoms of the lower node contact holes 114A and the bit contact holes 114B approximately equal to the film thickness of the same in the upper surface of the silicon oxide film 154. Filling of the lower node contact holes 114A and the bit contact holes 114B is prevented by means of this silicon nitride film 115 [FIGS. 5(b) and 8(b)].

Then, by means of different direction etching using mixed gas between trifluoro methane and tetrafluoro methane ($CF_4$), etching back is performed for the silicon nitride film 115 until the upper surface of the silicon oxide film 154 is exposed and silicon nitride film spacers 116a are formed in the respective sides of the lower node contact holes 114A and the bit contact holes 114B. During different direction etching using the mixed gas, the silicon oxide film 154 functions as an etching stopper at the time of etching back described above for the reason that the etching speed of the silicon nitride film is higher than that of the silicon oxide film. The sectional form of each of the silicon nitride spacers 116a is the same as that of a normal spacer, the upper end of the silicon nitride spacer 116a approximately coincides with the upper surface of the silicon oxide film 154 and the surfaces of the silicon nitride film spacers 116a (surfaces exposed in the lower node contact holes 114A and the bit contact holes 114B) opposite the surfaces in direct contact with the sides of the lower node contact holes 114A and the bit contact holes 114B reach the sides drawing curved surfaces from the upper ends without having any surfaces defined as upper surfaces.

Figure 8A:
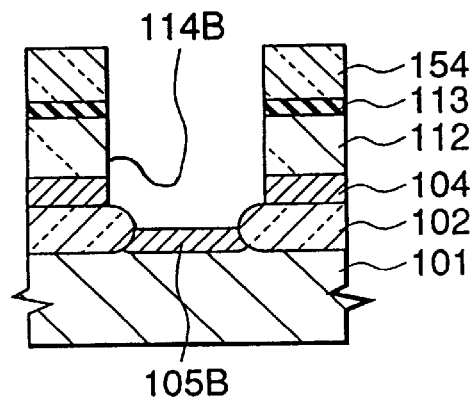
FIGS. 8(a) to 8(d) are schematic section views taken along the line C—C of FIG. 1, showing manufacturing steps of the first manufacturing method of the first application example of the first embodiment.
Figure 8B:
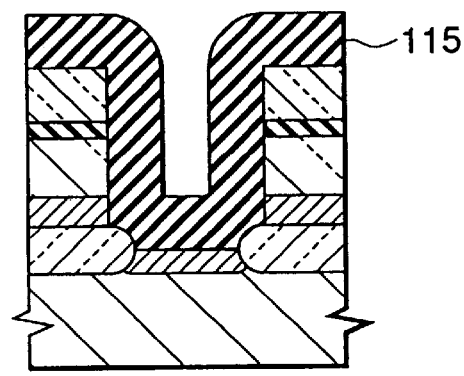
Figure 8C:
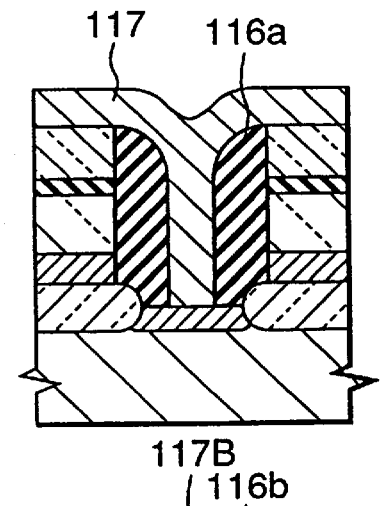
Figure 8D:
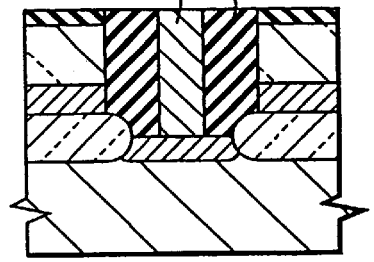
Figure 9A:
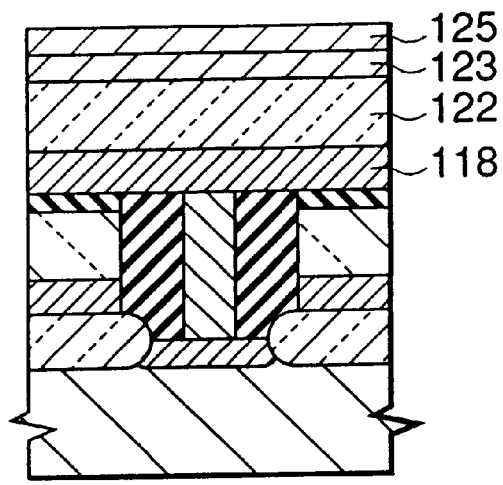
FIGS. 9(a), 9(b), and 9(c) are schematic views taken along the line C—C of FIG. 1, showing manufacturing steps of the first manufacturing steps of the first application example of the first embodiment.
Figure 9B:
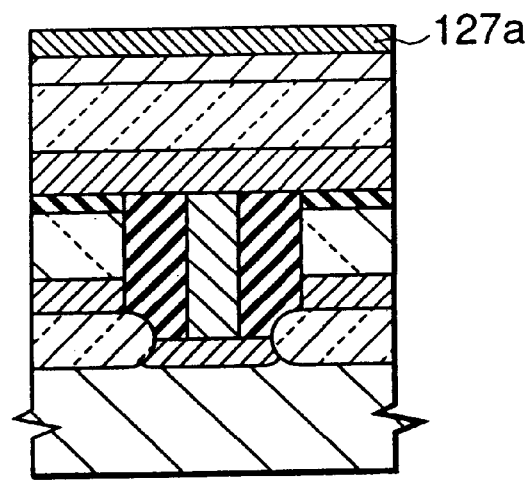
Figure 9C:
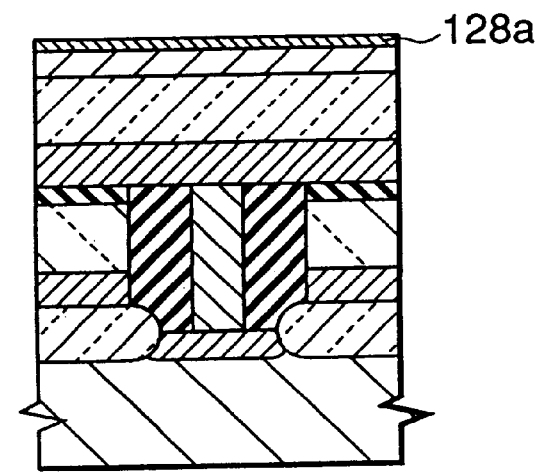

Subsequently, by means of a method mainly using LPCVD, a (first) conductive film 117 is formed on the full surface [FIGS. 5(c) and 8(c)]. This conductive film 117 is a film formed by laminating tungsten films on a barrier film composed of, e.g a titanium and a titanium nitride film or an N-type silicon film (in this case, this becomes an N-type amorphous silicon film during a film forming stage (in-situ) and an N-type poly crystalline silicon film at the time of completion of a DRAM. In order to prevent burdensome addition of expressions and codes, this is generically referred to as an N-type silicon film). LPCVD is utilized for forming of an N-type silicon film, mono silane ($SiH_4$) (alternatively di silane ($SiH_6$)) is used as a gaseous starting material and phosphine ($PH_3$) (alternatively arsine ($AsH_3$) is used as dopant gas.

When the conductive film 117 is a film formed by laminating titanium, titanium nitride and tungsten films, the titanium and titanium nitride films are formed by means of sputtering and the tungsten film is formed by means of LPCVD using silane reduction of hexa fluoride tungsten ($WF_6$). The barrier film composed of titanium and titanium nitride films contributes toward the adhesive strength of the tungsten film to the silicon nitride film spacer 16a and restraining of silicide chemical reaction among the N-type source region 105A, the N-type drain region 105B and the tungsten film. At this time, it is necessary to provide a barrier film of a film thickness of about 10 nm so as to directly cover the surfaces of the N-type source and drain regions 105A and 105B in the bottom sections of the lower node contact holes 114A and the bit contact holes 114B and thus e.g collimetory sputtering is preferably used for forming of titanium and titanium nitride films. The film thickness of a barrier film formed in the sides of the lower node contact holes 114A and the bit contact holes 114B is less than 1 nm and thus the lower node contact holes 114A and the bit contact holes 114B will never be filled only with a barrier film.

Then, CMP is performed for the conductive film 117, the silicon oxide film 154 and the silicon nitride film spacer 116a (at least in the last stage) until the upper surface of the silicon nitride film 113 is exposed. This makes it possible to form and leave silicon nitride film spacers 116b each having a width of about 150 nm for directly covering the sides of the lower node contact holes 114A and the bit contact holes 114B (and the exposed surfaces of the word lines 104) and contact plugs 117A and 117B of about 0.2 $\mu m^2$ (composed of the conductive film 117) for filling the lower node contact holes 114A and the bit contact holes 114B via the silicon nitride film spacers 116b. The silicon nitride film spacers 116b have flat upper surfaces coinciding with the upper surfaces of the silicon nitride films 113 and the contact plugs 117A and 117B have approximately flat upper surfaces coinciding with the upper surfaces of the silicon nitride films 113 at this stage. The silicon nitride film spacers 116b contribute toward insulation separation between the contact plugs 117A (exposed in the sides of the lower node contact holes 114A) and the word lines 104 and the contact plugs 117B (exposed in the sides of the bit contact holes 114B) and the word lines 104. In order to limit low a parasitic capacitance between the contact plugs 117A and 117B and the word lines 104 and form a capacitor of a stacked type, it is not preferable to form the widths of the silicon nitride film spacers 116b too thin. When these silicon nitride film spacers 116b and contact plugs 117A and 117B are fabricated, etching back can also be used together in the initial stage [FIGS. 1(a), 2, 3, 4, 5(b) and 8(d)]. The flat formation of the upper surface of the BPSG film 112 constituting the first silicon oxide film makes it easy to fabricate these silicon nitride film spacers 116b and contact plugs 117A and 117B. Moreover, since the silicon nitride films 113 are provided, the rotational load of CMP will rapidly increase when CMP reaches the upper surfaces thereof (due to a high area occupancy ratio of the silicon nitride films 113). As a result, detection of an end point targeted by CMP will be easy.

Depending on the degree of freedom of forming patterns for the arrangement, size, etc., of transistors, there are two ways of forming contact holes with respect to N channel MOS transistors of the CMOS transistors constituting the peripheral circuit of the DRAM. Wiring with contact resistance, etc., reduced is required for the CMOS transistors constituting the peripheral circuit of the DRAM different from the N channel MOS transistors constituting the memory cells and thus contact holes of about 0.2 $\mu m^2$ are not preferable for the contact holes in this case. If the sizes of these contact holes can be enlarged to about 0.8 $\mu m^2$, these contact holes will be formed simultaneously when the lower node contact holes 114A and the bit contact holes 114B are formed. Contact plugs of about 0.5 $\mu m^2$ will be formed in these contact holes thus formed. If the sizes of the contact holes cannot be enlarged, formation of these contact holes will be performed separately after formation of the contact plugs 117A and 117B.

Then, when the contact plugs 117A and 117B are composed of N-type silicon films, e.g tungsten silicide films of about 200 nm film thicknesses are formed on the full surface. When the contact plugs 117A and 117B are composed of laminated films containing tungsten films, e.g tungsten polycide films of about 200 nm film thicknesses are formed on the full surface, these are patterned and a plurality of bit lines 118 (and wiring for the N channel MOS transistors of the peripheral circuit) are formed in parallel with an X direction (in a portion immediately above the gap of the N-type source region in a Y direction). These bit lines 118 are connected to the N-type drain region 105B via the plurality of bit contact holes 114B (contact plugs 117B for filling these). The line widths and intervals of these bit lines are respectively set to about 0.5 $\mu m$ and 0.8 $\mu m$.

Selection of materials for constituting the bit lines 118 is made considering the constitutional materials of the contact plugs 117A and 117B. For example, when the contact plugs 117A and 117B are composed of N-type silicon films and the bit lines 118 are composed of tungsten silicide films, if different direction etching is performed by using mixed gas between chlorine ($Cl_2$) and oxygen ($O_2$), etching for the N-type silicon films constituting the contact plugs 117A and 117B will be limited small. When the contact plugs 117A and 117B are composed of laminate films containing tungsten films and the bit lines 118 are composed of tungsten polycide films, if different direction etching is performed for the N-type silicon films composing the lower layers of the tungsten polycide films by means of hydrogen bromide (HBr) after etching is performed for the tungsten silicide films composing the upper layer of the same, almost no etching will be performed for the contact plugs 117A and 117B. In addition, the titanium films and titanium nitride films constituting the barrier films formed in the sides of the silicon nitride film spacers 116b will also be exposed to etching. Since the film thicknesses of the barrier films are less than 1 nm in this portion, almost no etching will be performed for these due to a loading effect. As described above, selection of materials for constituting the bit lines 118 is made based on the selection of the constituting materials and etching (to a certain extent) for the contact plugs 117A and 117B and thus the materials are not limited to the tungsten silicide films or the tungsten polycide films.

Then, a second HTO film of a 50 nm film thickness (not shown) is formed on the full surface and a second BPSG films is also formed. This BPSG film is caused to re-flow and CMP is performed, thereby forming a BPSG film 122 having a flat upper surface. Thus, forming of a second underlayer insulating film composed of a second silicon oxide insulating film containing the second HTO film and the BPSG 122 is finished. The film thickness of the BPSG film 122 immediately above the bit lines 118 is set to about 250 nm. As in the case of the first silicon oxide insulating film constituting the first underlayer insulating film, the second silicon oxide insulating film constituting the second underlayer insulating film is not limited to such as structure. For example, the second underlayer insulating film can be formed by making flat the upper surface of a silicon oxide film by means of CMP after forming a second HTO film and the silicon oxide film by means of APCVD.

Subsequently, an N-type silicon film 123 of about 150 nm film thickness (as a second conductive film) is formed on the full surface. When this N-type silicon film 123 is an N-type amorphous film during in-situ, there will be no problem for the constitution of the second underlayer insulating film as described above. However, if an N-type silicon film 123 is formed by thermally diffusing N-type impurities on a non-dopant silicon film (this is an N-type poly crystalline film in this case), it will be preferable to further provide a silicon oxide film (of about 50 nm film thickness) on the upper surface of the BPSG film 122. Direct formation of the N-type silicon film on the upper surface of the BPSG film 122 by means of a method including thermal diffusion may result in wrinkles produced on the surface of this N-type silicon film, creating problems in processing, the obtained characteristics of the DRAM (especially its reliability), etc., thereafter. If a capacitor is formed by utilizing an N-type silicon film having a hemi-spherical grain field referred to as HSG (Hemi-Spherical Grain) in its surface, it will be preferable to use LPCVD so as to form an N-type silicon film during in-situ as a method of forming an N-type silicon film 123.

Then, different etching is performed for the N-type silicon film 123 and the second underlayer insulating film in sequence by masking a photo resist film (not shown) and upper node contact holes 124 of about 0.5 $\mu m^2$ film thicknesses reaching the lower node contact holes 114A are formed. There is formed a second underlayer insulating film having a width of about 150 nm between the upper node contact holes 124 and the bit lines 118. Then, an N-type silicon film 125 (as a third conductive film) having a film thickness of about 70 nm (second specified film thickness) is formed by means of LPCVD using mono silane (or di silane) as a gaseous starting material and phosphine (or arsine) as dopant gas [FIGS. 6(a) and 9(a)].

Then, the N-type silicon film 125 is etched back by means of different direction etching using hydrogen bromide as etching gas until the upper surfaces of the silicon nitride film spacers 116b are exposed and N-type silicon film spacers 126 directly covering the sides of the upper node contact holes 124 are formed. Thereby, the formation of a lower cell plate electrode in the application example is finished. The upper ends of these N-type silicon film spacers 126 coincide with the upper surfaces of the N-type silicon films 123, the bottom surfaces of the N-type silicon film spacers 126 are in contact only with the upper surfaces of the silicon nitride spacers 116b and intervals between the N-type silicon film spacers 126 and the contact plugs 117A are set to about 80 nm.

Then, a first titanium nitride film 127a (first nitride metal film composed of an interstitial compound) covering the full surface is formed by means of sputtering and LPCVD. First, a titanium nitride film having a film thickness of about 10 nm in the upper surface of the N-type silicon film 123 is formed by means of sputtering. At this time, the film thicknesses of this titanium nitride film are about 0.1 nm and 2 nm respectively in the side (side of the N-type silicon film spacer 126) and the bottom of the lower node contact hole 124. Subsequently, a titanium nitride film having a film thickness of about 5 nm is formed on the full surface by means of ECR-CVD (LPCVD including this) using titanium tetra-chlorine (TiCl$_4$) and ammonia (NH$_3$) as gaseous starting materials. The titanium nitride film 127a is composed of these two titanium nitride films and the film thickness of this titanium nitride film are about 17 nm, 7 nm (third specified film thickness) and 9 nm respectively in the upper surface of the N-type silicon film 123, the side (side of the N-type silicon spacer 126) and bottom of the upper node contact hole 124 [FIGS. 6(b) and 9(b)].

Then, the titanium nitride film 127a is etched back by means of different direction etching using chlorine until the film thickness in the upper surface of the N-type silicon film 123 is equal to that in the side (side of the N-type silicon film spacer 126) of the upper node contact hole 124 and a titanium nitride film 128a is formed and left. During this etching back, the titanium nitride film 127a having covered the upper end of the lower node contact hole 114A in parallel is eliminated and the lower end of this titanium nitride film 128a is in contact only with the upper surface of the silicon nitride film spacer 126b in this section [FIGS. 6(c) and 9(c)].

Figure 10A:
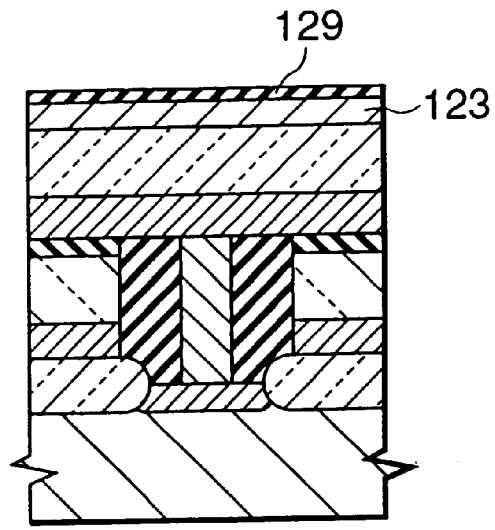
FIGS. 10(a), 10(b), and 10(c) are schematic views taken along the line C—C of FIG. 1, showing manufacturing steps of the first manufacturing method of the first application example of the first embodiment.
Figure 10B:
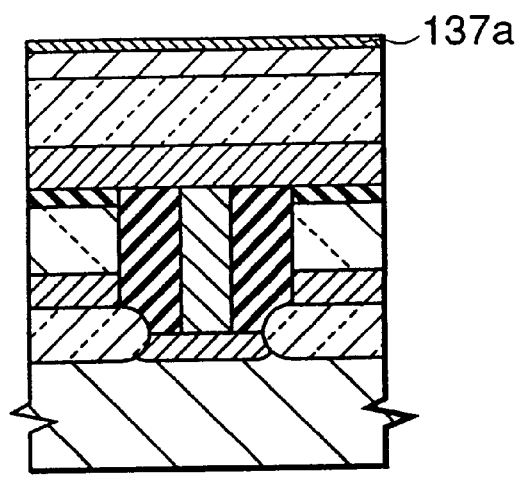
Figure 10C:
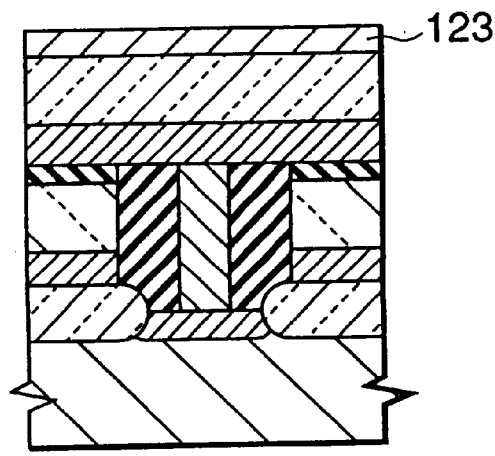

Then, plasma oxidation is performed by means of RF of 50 KHz and 100 W under a temperature of about 400° C. and a pressure of about 200 Pa and the titanium nitride film 128a is converted into a titanium oxide film 129 (as a first capacitive insulating film) [FIGS. 7(a) and 10(a)]. In the application example, N-type silicon film spacers 126 and titanium nitride films 128a (and titanium oxide films 129) having such forms can be formed in the sides of the upper node contact holes 124. This is because there are formed in the sides of the lower node contact holes 114A silicon nitride film spacers 116b having flat upper surfaces for covering these sides. If the sectional forms of these silicon nitride film spacers 116b have the same sectional forms as the silicon nitride film spacers 116a (shown in FIG. 5(c)), formation of N-type silicon film spacers 126 and titanium nitride films 128a (and titanium oxide films 129) having the above-noted forms would not be easy.

For forming of the titanium nitride film 127a, a titanium film having a film thickness of about 7 nm is first formed by means of LPCVD and then a titanium film can be further formed by means of sputtering. By employing such a method, the titanium nitride films 128a left by etching back are generally composed of only titanium nitride films formed by means of LPCVD. By converting these into titanium oxide films 129 by means of plasma oxidation, more uniform capacitive insulating films can be obtained than using the foregoing method.

The first nitride metal film composed of an interstitial compound in the application example is not limited to use of the titanium nitride film 127a. Instead of the titanium nitride film, a tantalum nitride (TaN) film, a zirconium nitride (ZrN) film or a niobium nitride (NbN) film can be used. Any of a tantalum oxide (Ti$_2$O$_2$), a zirconium oxide (ZrO$_2$) or a niobium oxide (Nb$_2$O$_5$) obtained by oxidizing these nitride metal films has a high dielectric constant. Generally, an interstitial compound has a high electrical conductivity. As such interstitial compounds, there are a hydride, an arsenide, and a carbide in addition to a nitride. If an interstitial compound other than a nitride is oxidized, a problem will remain in the leakage characteristic of an obtained oxide metal film due to remaining of hydrogen, boron or carbon or the mixture of reaction products including these. Thus, use of the nitride metal film is preferable as an interstitial compound since this satisfies the object of the embodiment. Another reason for using the nitride metal film is that its oxidizing speed is slow and it is easy to obtain an oxide film having a good film quality. For example, if a titanium film is used instead of the titanium nitride film 127a and this is oxidized, the crystalline grain field of n obtained titanium oxide film will be rough, creating a problem in its leakage characteristic, and therefore this is not preferable as a capacitive insulating film. Yet another reason for the use of the nitride metal film will be described in the section of another application example of the first embodiment.

Then, an N-type silicon film having a sufficient film thickness (fourth specified film thickness) is formed by employing the same method for, e.g the N-type silicon film 125. Patterning is performed for this N-type silicon film by means of different direction etching and storage node electrode 134 (composed of such N-type silicon films) directly connected to the upper surfaces of the contact plugs 117A (corresponding to the lower node contact holes 114A) via the upper node contact holes 124 are formed. These storage node electrodes 134 are in contact with the upper surface of the silicon nitride film spacers 116 by the width of about 70 nm in the vicinity of the contact plugs 117A in the upper ends of the lower node contact holes 114A. Different direction etching is subsequently performed for the titanium nitride films 129 and titanium nitride films 129a as lower capacitive insulating films are formed and left in self alignment with the storage node electrodes. The gap of the storage node electrodes 134 has a width of about 0.5 $\mu$m and is typically formed in a region excluding portions immediately above the word lines 104 and the bit lines 118. In the application example, a material for constituting the storage node electrode is not limited to an N-type silicon film. Subsequently, as in the case of forming the first titanium nitride film 127a, a second titanium oxide film 137a (as a second nitride metal film of an interstitial compound) is formed by using sputtering and LPCVD. The film thicknesses of this titanium nitride film 137a in the upper surface, side and gap of the storage node electrode 134 are respectively set to about 17 nm, 7 nm and 9 nm as in the case of those of the titanium nitride film 127a [FIGS. 7(b) and 10(b)].

Then, etching back is performed for the titanium nitride film 137a by means of different direction etching (as in the case of forming of the titanium nitride film 128a), plasma oxidation is performed (under the same condition as formation of the titanium oxide film 129) and an upper capacitive insulating film compose of a second titanium oxide film 139 directly covering the upper surface and side of each storage node electrode 134 is formed. The film thickness of this titanium oxide film 139 is also set to about 10 nm. Each titanium oxide film 139 is directly connected to each titanium oxide film 129a all around the lower end of the side of each storage node electrode 134 [FIGS. 1, 2, 3, 4, 7(c) and 10(c)]. As in the case of the first titanium nitride film 127a, in the application example, as a second nitride metal film of an interstitial compound a tantalum nitride film, a zirconium nitride film or a niobium nitride film can be used instead of the titanium nitride film 137a. However, the same material as the first nitride metal film is preferably used for the second nitride metal film. This is because it is preferable to use the same composition material for the lower and upper capacitive insulating films.

Subsequently, an N-type silicon film 145 having a film thickness of about 150 nm (as a fifth conductive film) is formed on the full surface by means of LPCVD as in the case of forming the N-type silicon film 125 and an upper cell plate electrode composed of this N-type silicon film 145 is formed. The N-type silicon film 145 covers the upper and side surfaces of the storage nod electrode 134 via the titanium oxide film 139 and is directly connected to the N-type silicon film 125 (constituting the lower cell plate electrode) in the gap of the storage node electrode 134 (FIGS. 1, 2, 3, 4). A reason for forming the upper cell plate electrode by the N-type silicon film 145 in the application example is that the constitutional material (including the N-type silicon film 123 and the N-type silicon film spacer 126) of the lower cell plate electrode in a portion in direct contact with the titanium oxide film 129 as a lower capacitive insulating film is caused to have the same composition as that (N-type silicon film 145) of the upper cell plate electrode in a portion in direct contact with the titanium oxide film 139 as an upper capacitive insulating film. Thereby, it is possible to prevent an electric characteristic of the capacitor from being locally different in one memory cell.

After formation of the N-type silicon film 145 (not shown), etching for the N-type silicon films 145 and 125 is eliminated except in regions in which the memory cell arrays have been formed. Then, a third underlayer insulating film is formed on the full surface, contact holes reaching the P channel MOS transistors constituting the peripheral circuit are formed and metal wiring is formed, completing the DRAM.

Figure 11A:
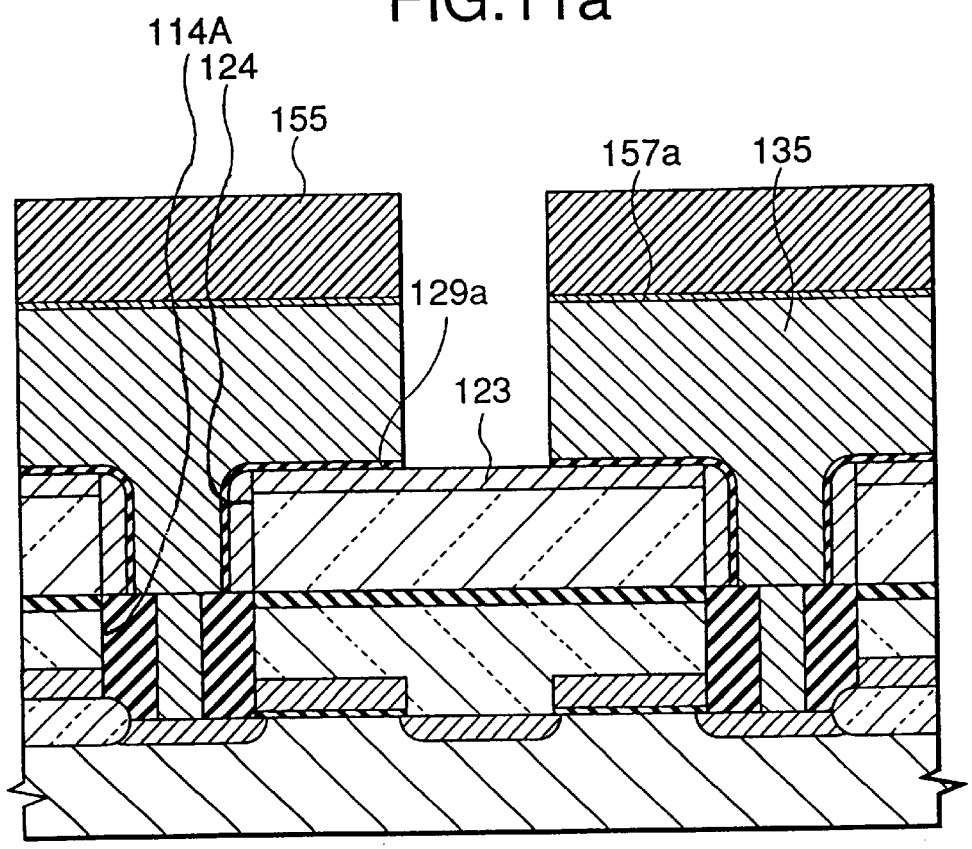
FIGS. 11(a) and 11(b) are schematic section views taken along the line A—A of FIG. 1, showing manufacturing steps of a second manufacturing method of the first application example of the first embodiment.
Figure 11B:
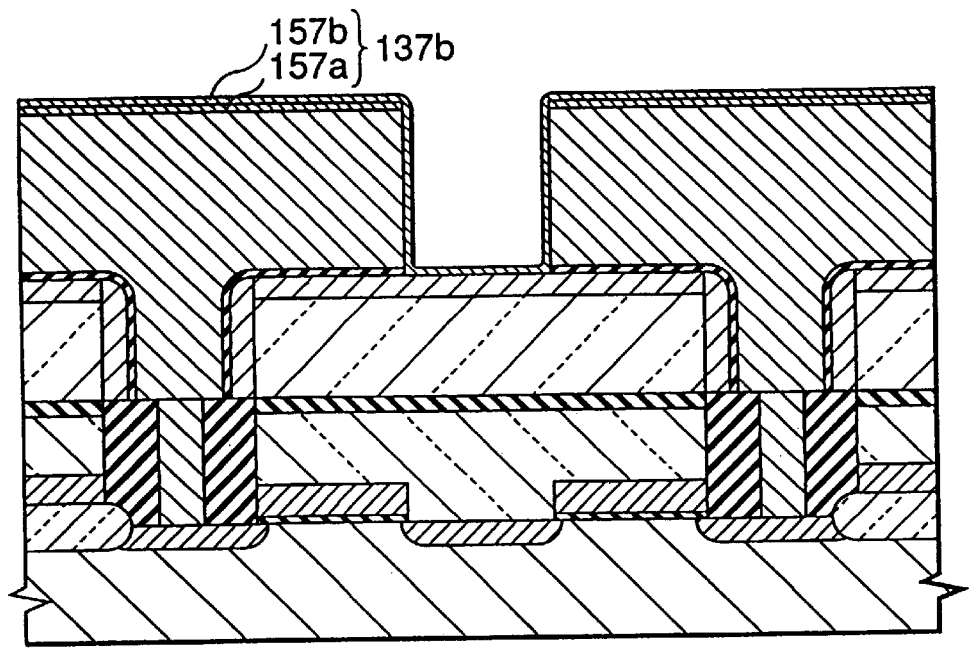

AS previously described, there are other manufacturing methods for the first application example of the first embodiment in addition to the above-noted first method. Referring to FIG. 11 which is a schematic section view taken along the line of A—A of FIG. 1, showing the main manufacturing steps of the memory cells of the DRAM, a second manufacturing method for the first application example of the first embodiment is different from the first method in terms of formation of a titanium nitride film converted into an upper capacitive insulating film.

The second manufacturing method first follows the steps of the first until formation of a titanium oxide film 129 (as a first capacitive insulating film) [see FIG. 7(a)]. Subsequently, an N-type silicon film (as a fourth conductive film) is formed on the full surface by means of LPCVD and a second titanium nitride film (as a second nitride metal film) having a film thickness of at least 7 nm (third specified film thickness) is also formed on the full surface. This second titanium nitride film may be formed by means of sputtering. However, it is more preferable to form this by means of LPCVD considering the controllability of the film thickness. With a photo resist film 155 masked, different direction etching is performed for the second titanium nitride film, the N-type silicon film and the titanium oxide film 129 in sequence, a storage node electrode 135 composed of this N-type silicon film is formed, a titanium nitride film 157a is formed and left only in the upper surface of each storage node electrode 135 and a titanium oxide film 129a as a lower capacitive insulating film is formed and left in self-alignment with each storage node electrode 135 [FIG. 11(a)].

After the photo resist film 155 is eliminated, a third titanium nitride film 157 (as a third nitride metal film)

having a film thickness of about 7 nm (third specified film thickness) is formed on the full surface by means of LPCVD. A titanium nitride film composed of a titanium nitride film 157a and a titanium nitride film 157b corresponds to the titanium nitride film 137a [FIG. 7(b)] formed by the first manufacturing method [FIG. 11(b)]. The steps of the manufacturing method thereafter are the same as those of the first method. Compared with the first manufacturing method, the second method has an advantage that it has a better controllability of the film thickness in the formation of titanium nitride films directly covering the upper and side surfaces of the storage node electrode as an upper capacitive insulating film and the surface of the lower cell plate electrode in the gap thereof.

The first application example of the first embodiment relates to the DRAM of a folded bit line system in which the linear word lines and the linear bit lines orthogonally cross one another via the first underlayer insulating film. However, the application example is not limited to this. As long as it is a DRAM having memory cells of stacked and COB types, the application example can be applied to an open bit line system in which the form of an element formation region is not limited to the above-noted T form long sideways or a system in which the word lines and the bit lines are approximately straight and these do not orthogonally cross one another (but intersect one another) via the first underlayer insulating film. Also, in the application example, constitutional materials and various numerical values are not limited to those described above.

Outline of the memory cell structure in the first application example of the first embodiment is as follows:

A capacitive insulating film of the application example is not shared by a plurality of memory cells unlike the memory cells of the conventional DRAM, belonging to each individual memory cell. Specifically, the capacitive insulating film of the application example is composed of lower and upper capacitive insulating films belonging to each memory cell. Different from the conventional type, a cell plate electrode of the application example is composed of lower and upper cell plate electrodes. Storage node electrodes of the application example are connected to an N-type source region via lower node contact holes provided in the first underlayer insulating film having a flat upper surface and upper node contact holes provided in the second underlayer insulating film having a flat upper surface. Silicon nitride film spacers having flat upper surfaces coinciding with the upper surface of the first underlayer insulating film are provided in the sides of the lower node contact holes and the lower node contact holes are filled with contact plugs via the silicon nitride spacers.

The lower cell plate electrode directly covers the upper surface of the second underlayer insulating film and the side of the upper contact hole and is in contact only with the upper surface of the nitride silicon film spacer in the upper end of the lower node contact hole. The lower capacitive insulating film is formed in self alignment with the storage node electrode, directly covering the surface of the lower cell plate electrode in a region excluding the gap of the storage node electrode, and is in contact only with the upper surface of the silicon nitride film spacer in the upper end of the lower node contact hole. In the lower node contact hole, the storage node electrode has a form for filling the upper node contact hole via the lower capacitive insulating film and the lower cell plate electrode. The upper capacitive insulating film directly covers only the side and upper surface of the storage node electrode, being directly connected to the lower capacitive insulating film all around the lower end of the side of the storage node electrode. The upper cell plate electrode covers the side and upper surface of the storage node electrode via the upper capacitive insulating film, being directly connected to the surface of the lower cell plate electrode in the gap of the storage node electrode.

The second manufacturing method of the application example enables manufacturing of the above-described structure.

The memory cell of the application example has, as clear from the above-noted structure, the lower capacitive insulating film and the lower cell plate electrode and thus a capacitor is formed in a region in which the storage node electrode covers the upper surface of the underlayer insulating film and the side of the node contact hole. As a result, compared with the conventional memory cell, the memory cell of the application example has an effect that the surface ratio of the storage node electrode contributing toward the capacitor increases more.

In the first application example of the first embodiment, the lower and upper cell plate electrodes are respectively composed of N-type silicon films, the lower cell plate electrode in the capacitor formation section is directly covered by the lower capacitive insulating film composed of a titanium oxide film and the upper cell plate electrode directly covers the upper capacitive insulating film composed of a titanium oxide film. More particularly, the upper sections of portions in direct contact with the upper and lower capacitive insulating films and the lower cell plate electrode are respectively composed of N-type silicon films. However, according to the first embodiment, the upper sections of the portions in direct contact with the upper and lower capacitive insulating films and the lower cell plate electrode are limited to N-type silicon films.

Figure 12A:
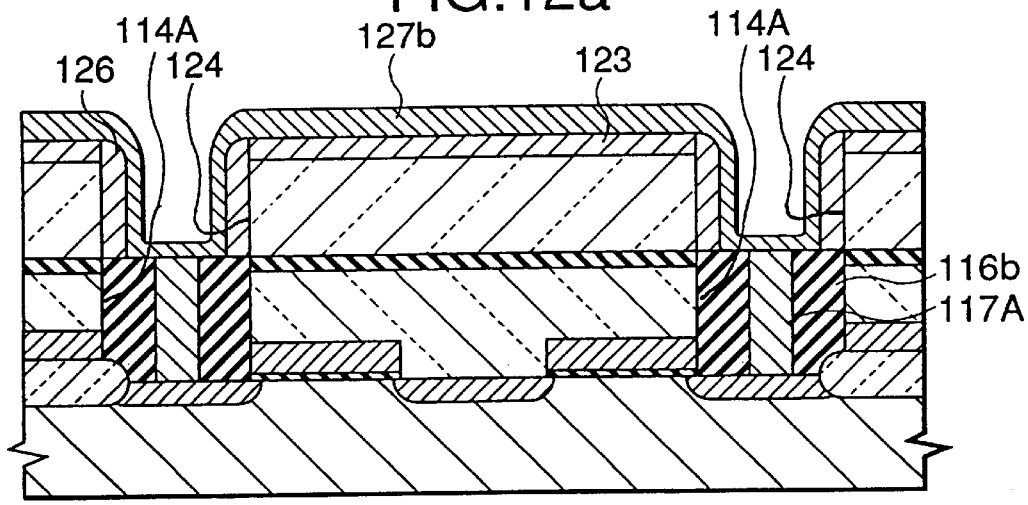
FIGS. 12(a), 12(b), and 12(c) are schematic section views showing principal manufacturing steps of a second application example of the first embodiment.
Figure 12B:
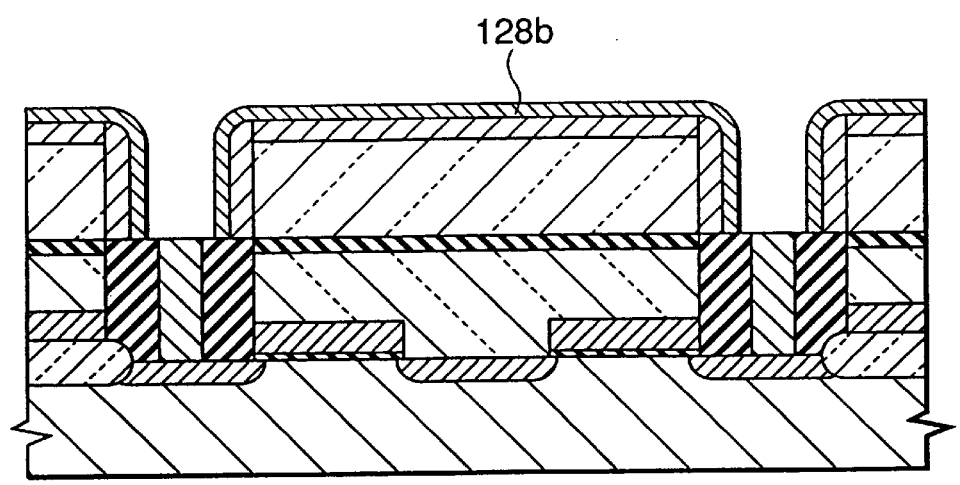
Figure 12C:
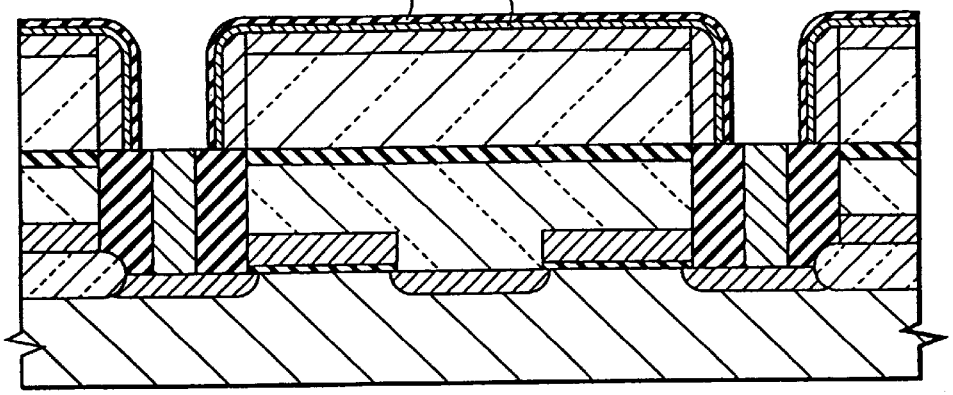
Figure 13A:
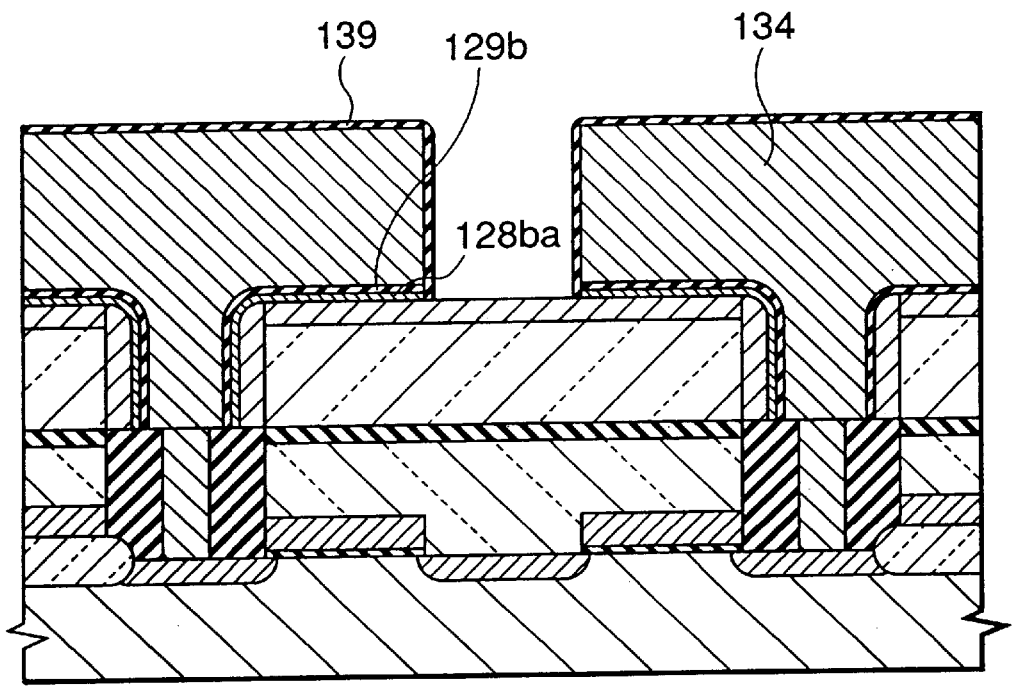
FIGS. 13(a) and 13(b) are schematic section views showing principal manufacturing steps of the second application example of the first embodiment.
Figure 13B:
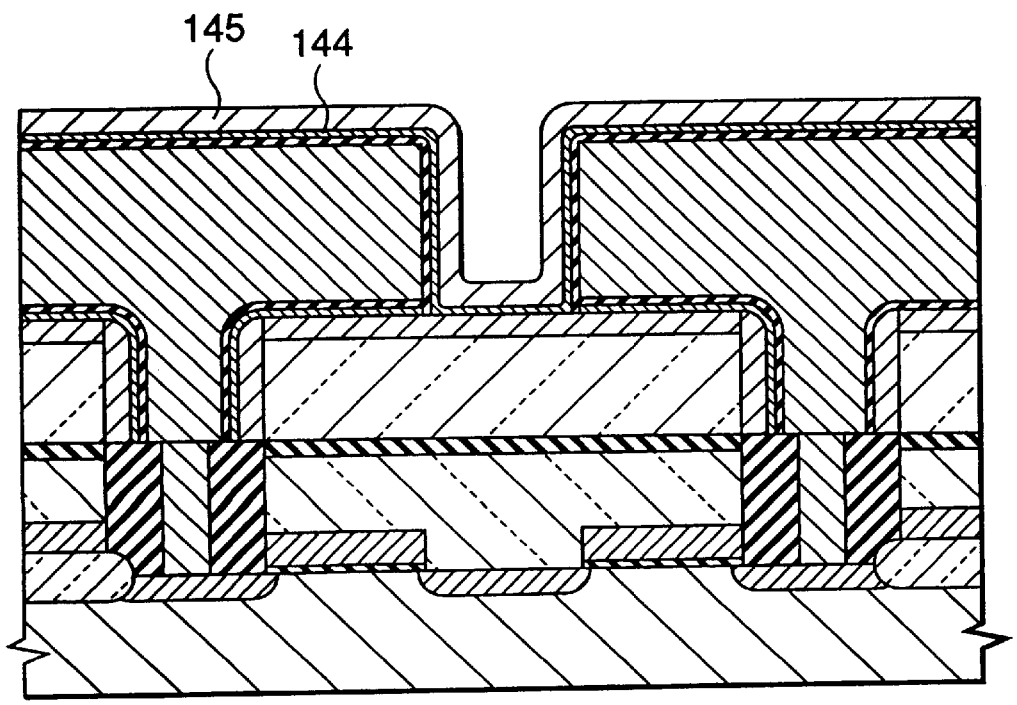

Referring to FIGS. 12 and 13 which schematic section views showing the main manufacturing steps of the memory cell of the DRAM, the upper section of the memory cell of the DRAM of the second application example of the first embodiment and the lower cell plate electrode are composed of films formed by laminating a titanium nitride film (as a nitride metal film of an interstitial compound) and an N-type silicon film. That is, the application example is an application example of the first application example and the memory cell thereof is formed as follows.

The manufacturing steps are the same as those of the first application example until forming of an upper node contact hole 124. Thereafter, an N-type silicon film (as a third conductive film) having a film thickness of about 50 nm (second specified film thickness) is formed by means of LPCVD. This N-type silicon film is etched back by means of different direction etching and an N-type silicon film spacer 126 for directly covering the side of the upper node contact hole 124 is formed and left. As in the case of the first application example, by means of sputtering and then LPCVD or LPCVD and then sputtering, a first titanium nitride film 127b (as a first nitride metal film of an interstitial compound) having a film thickness of about 30 nm (third specified film thickness) in the side of the N-type silicon film spacer 126 is formed [FIG. 12(a)]. In the application example, if a second underlayer insulating film is composed only of a silicon oxide film, it is possible to form a spacer directly covering the side of the upper node contact hole 124 by a nondoped silicon film. When the second underlayer insulating film includes a BPSG film and the BPSG film is exposed in the side of the upper node contact hole, the N-type silicon film spacer 126 functions as a barrier film for boron thermal diffusion to the titanium nitride film 127b during heat treatment in later step.

Then, as in the case of the first application example, the titanium nitride film 127b is etched back, leaving a titanium nitride film 128b. This titanium nitride film 128b directly covers the upper surface of the N-type silicon film 123 and the side of the N-type silicon film spacer 126 and comes into contact only with the upper surface of the silicon nitride film spacer 116b in the upper end of the lower node contact hole 114A. The film thickness (width) of the titanium nitride film 128b in the side of the N-type silicon film spacer 126 is set to about 30 nm and an interval between the contact plug 117 A and the titanium nitride film 128b in the upper end of the lower node contact hole 114A is set to about 70 nm [FIG. 12(b)].

Then, as in the case of the first application example, a titanium oxide film 129b (as a first capacitive insulating film) having a film thickness of about 10 nm is formed in the surface of the titanium nitride film 128b by means of plasma oxidation, leaving a titanium nitride film 128ba. The film thickness (width) of the titanium nitride film 128ba in the side of the N-type silicon film spacer 126 is about 23 nm (fourth specified film thickness). At this time, the film thickness of the titanium nitride film 128ba on the upper surface of the N-type silicon film 123 need not be about 23 nm. That is, in the application example, compared with the formation of the first titanium nitride film 127a in the first application example, accuracy of a film thickness required during forming of the first titanium nitride film 127b is not so strict [FIG. 12(c)]. The upper limit of the fourth specified film thickness may be set such that in the upper end of the lower node contact hole 114A, the titanium oxide film 129b remains in the upper surface of the silicon nitride film spacer 116b, not reaching the contact plug 117A. There is no positive reason for making thinner the film thickness of the titanium nitride film 128ba. However, the lower limit of the fourth specified film thickness needs about 5 nm such that the influence of a quantum effect from energy band by the N-type silicon film 123 and the N-type silicon film spacer 126 is made small for the titanium nitride film 128ba. Now, complementary explanation will be made of the N-type silicon film spacer 126. When the second underlayer insulating film includes the BPSG film, if a nondoped silicon film spacer is employed instead of the N-type silicon film spacer 126, a titanium arsenide (TiB$_2$) (titanium arsenide is also an interstitial compound), etc., will be locally formed in the titanium nitride film 128ba in the vicinity of this nondoped silicon film spacer, resulting in a local change of the physical property of the titanium nitride film 128ba. In this case, boron will be further diffused into the titanium oxide film 129b, also resulting in a local change of the dielectric characteristic (and insulating characteristic) of the capacitive insulating film.

Subsequently, an N-type silicon film (as a fourth conductive film) is formed on the full surface by means of LPCVD. Patterning is performed for this N-type silicon film, the titanium oxide film 129b and the titanium nitride film 128ba by means of different direction etching. This makes it possible to form a storage node electrode 134 composed of this N-type silicon film, a lower capacitive insulating film composed of the left titanium oxide film 129b and a lower cell plate electrode composed of an N-type silicon film 123, an N-type silicon film spacer 126 and the left and patterned titanium nitride film 128ba (to use expressions relating to the structure of a memory cell, the silicon nitride film 128ba is a third conductive film, the N-type silicon film spacer 126 is a second conductive film and the N-type silicon film 123 is a first conductive film). Because of the existence of the N-type silicon film 123, a plurality of memory cells can share the lower cell plate electrode. As described above, in the application example, accuracy required for the film thickness of the first titanium nitride film 127b is not so strict as in the first application example. A reason for this is as follows. Since the titanium nitride film 127b is an interstitial compound, when a first titanium film 127b is formed thicker than the first titanium nitride film 127a of the first application example [see FIG. 6(b)] and oxidized, a titanium nitride film 128ba left without having been oxidized constitutes a portion of the lower cell plate electrode.

Then, as in the case of the first manufacturing method of the first application example, by means of sputtering and then LPCVD or by means of LPCVD and then sputtering, a second titanium nitride film (as a second nitride metal film of an interstitial compound) having a film thickness of about 7 nm (fifth specified film thickness) in the side of the storage node electrode 134. This second titanium nitride film is etched back by means of different direction etching and a titanium nitride film having a film thickness of about 7 nm is left only in the side and upper surface of the storage node electrode 134. Subsequently, plasma oxidation is performed and an upper capacitive insulating film composed of a titanium oxide film 139 having a film thickness of about 10 nm directly covering the side and upper surface of the storage node electrode 134 is formed [FIG. 13(a)]. In the application example, by employing the same method as the second manufacturing method of the first application example, it is also possible to form the storage node electrode and the second titanium nitride film.

Then, a third titanium nitride film 144 (as a third nitride metal film of an interstitial compound) having a required film thickness (e.g about 20 nm) is formed on the full surface by means of LPCVD. Also by means of LPCVD, an N-type silicon film 145 having a film thickness of e.g 150 nm is formed on the full surface. In this case, an upper cell plate electrode is formed by the titanium nitride film 144 and the N-type silicon film 145. Connection between the upper cell plate electrode and the lower cell plate electrode is achieved by directly covering the upper surface of the N-type silicon film 123 with the titanium nitride film 144 in is the gap of the storage node electrode 134 [FIG. 13(b)].

In the application example, if the film thickness of the titanium nitride film 128ba in direct contact with the titanium oxide film 129b as a lower capacitve insulating film is thinner than 5 nm, it is necessary to form the film thickness of the titanium nitride film 144 similarly thin and provide an N-type silicon film 145. However, if the film thickness of the titanium nitride film 128ba is thicker than 5 nm, it is not necessary to provide an N-type silicon film 145. That is, the upper cell plate electrode may include only a titanium nitride film 144. If the first nitride metal film is a titanium nitride film, the second nitride metal film must also be formed by a titanium nitride film for the same reason as in the first application example. Furthermore, in the application example, for the same reason that the upper cell plate electrode is formed by the N-type silicon film as in the first application example, a portion directly covering the upper capacitive insulating film in the upper cell plate electrode must be formed by a titanium nitride film. In addition, also in the application example, as in the first application example, as first, second and third nitride metal films which are interstitial compounds, tantalum nitride films, zirconium nitride films or niobium nitride films can be used instead of silicon nitride films.

As in the first application example of the first embodiment, the second application example of the first embodiment can be applied to a folded bit line system, an open bit line system or a system in which the word lines and the bit lines are approximately straight and these do not orthogonally cross one another via the first underlayer insulating film, as long as it is a DRAM having memory cells of stacked and COB types. Furthermore, also in the application example, constitutional materials and various numerical values are not limited to those described above.

The second application example of the first embodiment has the effect which the first application example of the first embodiment has. Furthermore, the second application example has, compared with the first, an advantage that it is easier to form a first titanium film as a base for the lower capacitive insulating film, apart from a difference in the electrical characteristics of the capacitors due to a difference in the structures of the upper and lower cell plate electrodes.

Figure 14A:
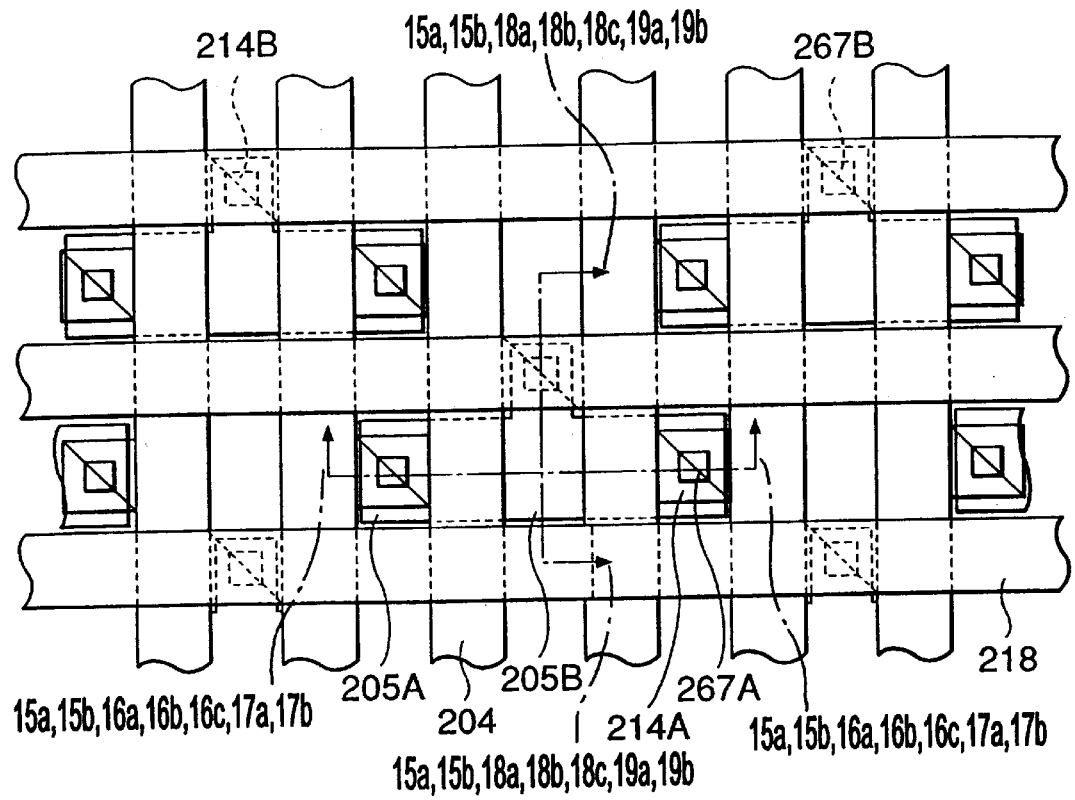
FIGS. 14(a) and 14(b) are schematic plan views of an application example of a second embodiment of the present invention.
Figure 14B:
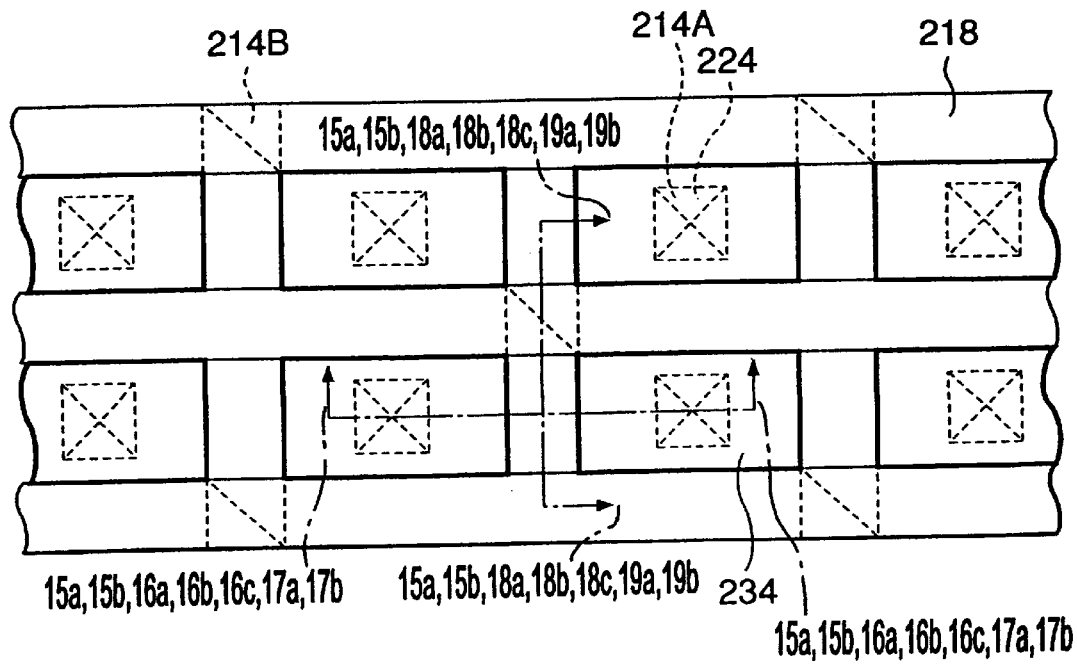
Figure 15A:
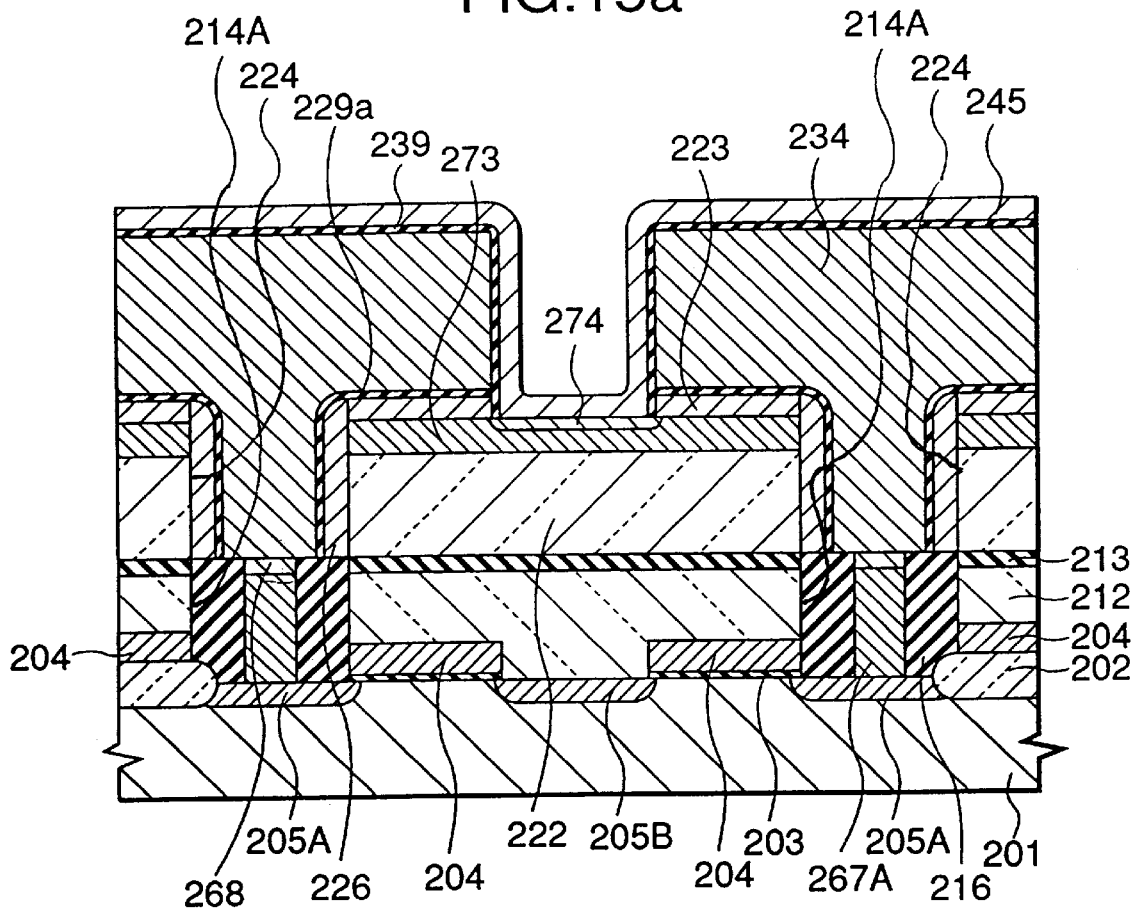
FIGS. 15(a) and 15(b) are schematic section views taken along the line A—A and B—B of FIG. 14, showing an application example of the second embodiment.
Figure 15B:
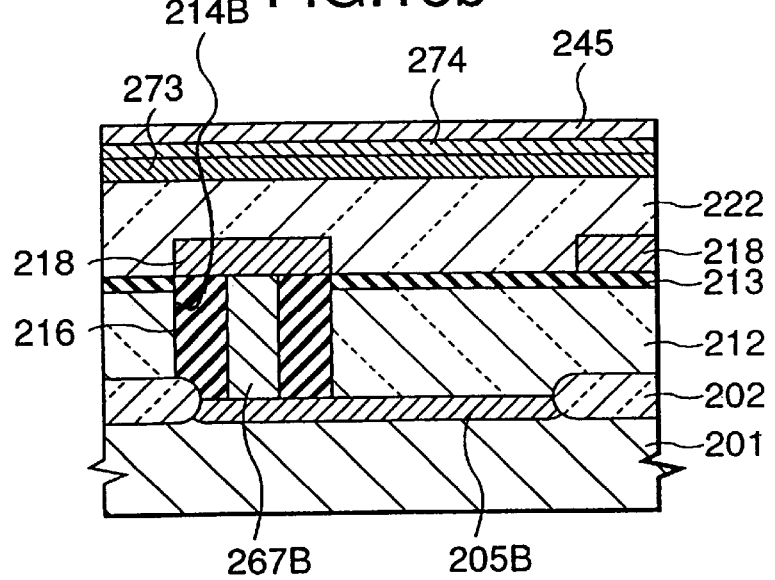

Referring to FIGS. 14(a) and 14(b) which are schematic plan views showing the word lines and bit lines of the memory cells of the DRAM and the bit lines and the storage node electrodes, and FIGS. 15(a) and 15(b) which are schematic section views taken along the lines A—A and B—B of FIG. 14, a DRAM of a first application example of a second embodiment of the invention is also a DRAM of for instance, a folded bit line system having memory cells of stacked and COB types formed under the design rule of 0.5 $\mu$m. The main differences from the memory cells of the first embodiment lie in the structures of the lower node contact holes and the contact plugs provided in the bit contact holes, the structure of the lower cell plate electrode and the structures of the lower and upper capacitive insulating films. The structure of such a memory cell is as follows. In FIG. 14(a) which is a schematic plan view, for easiness for understanding, the element formation regions (N-type source and drain regions), the word lines and the bit lines are shown to be separated from one another.

In a region in which a memory cell array is formed on the surface of a P-type silicon substrate, element formation regions plotted by field oxide films 202 of LOCOS types having film thicknesses of about 400 nm are regularly arranged in X and Y (orthogonal to X) directions. A plurality of word lines 204 provided in parallel with the Y direction traverse the plurality of element formation regions via gate oxide films 203 each having a film thickness of about 10 nm. The line width and interval of each of the word lines 204 are both about 0.5 $\mu$m and each has a film thickness of about 200 nm. These word lines 204 are composed of N-type poly crystalline silicon films, tungsten polycide films, etc. In each of the element formation region, there are provided N-type source and drain regions 205A and 205B in self alignment with the word lines 204. The depth of junction of each of the N-type source and drain regions 205A and 205B is about 0.2 $\mu$m and the width of the N-type source region 205A is about 0.8 $\mu$m.

The surface of each of the field oxide films 202 including the word lines 204 is covered by a first underlayer insulating film. This first underlayer insulating film is composed of a first silicon oxide insulating film having a flat upper surface and a silicon nitride film having a film thickness of about 30 nm covering the upper surface thereof. The first silicon oxide insulating film is composed of the word lines 204, an HTO film (not shown) having a film thickness of bout 50 nm for directly covering the surface of the field oxide film 202 and a BPSG film 212 having a flat upper surface. The film thickness of the BPSG film immediately above the word lines 204 is about 250 nm. This first underlayer insulating film is provided with lower node contact holes 214A of about 0.5 $m^2$ reaching the N-type source region 205A and bit contact holes 214B of about 0.5 $\mu m^2$ reaching the N-type drain region 205B. These lower node contact holes 214A and bit contact holes 214B are formed in self alignment with the word lines 204.

The sides of the lower node contact holes 214A and bit contact holes 214B are directly covered by silicon nitride film spacers 216 and these lower node contact holes 214A and bit contact holes 214B are filled with contact plugs 267A and 267B via the silicon nitride film spacers 216. These contact plugs 267A and 267B are composed of films formed by laminating ruthenium (Ru) films (reason for employing this ruthenium film will be described later in the section of a manufacturing method) on e.g a barrier film (composed of a titanium film and a titanium nitride film) and the upper surfaces f the contact holes 267A are covered by ruthenium oxide ($RuO_2$) films 268 (reason for forming this ruthenium film will also be described later in the section of the manufacturing method). A ruthenium oxide is a conductive oxide. The silicon nitride film spacers 216 have flat upper surfaces coinciding with the upper surfaces of the silicon nitride films 213 and widths of about 150 nm. The upper surfaces of the ruthenium oxide films 268 and the contact plugs 267B approximately coincide with the upper surfaces of the silicon nitride film spacers 216 and are approximately flat. The contact plugs 267A (and the ruthenium oxide films 268) and the contact plugs 267B are insulated from the word lines via the silicon nitride film spacers 216.

In the embodiment, the contact plugs 267B provided in the bit contact holes 214B may be composed of laminated films between barrier films and iridium films (Ir), barrier films and rhodium films (Rh), barrier films and rhenium films (Re) or barrier films and osmium films (Os), instead of laminated films between barrier films and ruthenium films. At this time, the lower nod contact holes 214A are provided, instead of the contact plugs 267A composed of laminated films between barrier films and ruthenium films with the upper surfaces covered by the ruthenium oxide films 268, with contact plugs composed of laminated films between barrier films and iridium films with the upper surfaces covered by iridium oxide ($IrO_2$) films, contact plugs composed of laminated films between barrier films and rhodium films with the upper surfaces covered by rhodium oxide ($RhO_2$) films, contact plugs composed of laminated films between barrier films and rhenium films with the upper surfaces covered by rhenium oxide ($ReO_2$) films or contact plugs composed of laminated films between barrier films and osmium films with the upper surfaces covered by osmium oxide ($OsO_2$) films. These iridium, rhodium, rhenium and osmium oxides are conductive oxides as in the case of a ruthenium oxide. Furthermore, in the embodiment, for the contact plugs provided in the lower node contact holes 214A and the bit contact holes 214B, laminated films between barrier films and ruthenium oxide films, laminated films between barrier films and iridium oxide films, laminated films between barrier films and rhodium oxide films, laminated films between barrier films and rhenium oxide films or laminated films between barrier films and osmium oxide films may be employed.

A plurality of bit lines 218 in parallel with the X direction are provided on the surface of the first underlayer insulating film. The line width, interval and film thickness of each of the bit line 218 are respectively about 0.5 $\mu$m, 0.8 $\mu$m and 200 nm and the bit line 218 is formed by e.g a tungsten silicide film or a tungsten polycide film. The surface of the first underlayer insulating film including the bit line 218 is covered by a second silicon oxide insulating film having a flat upper surface. The second silicon oxide insulating film is composed of a film formed by laminating a second HTO film (not shown) of a film thickness of about 50 nm directly covering the bit line 218 and a BPSG film 222 having a flat upper surface. The film thickness of the BPSG film 222 immediately above the bit line 218 is set to, e.g 250 nm. A ruthenium film 273 (as a first conductive film) of a film thickness of about 100 nm is provided on the surface of the BPSG film 222 (in a region in which a memory cell array is formed). In the embodiment, instead of the ruthenium film 273 as the first conductive film, an iridium film, a rhodium film, a rhenium film, an osmium film, ruthenium oxide film, an iridium oxide film, a rhodium oxide film, rhenium oxide film or an osmium oxide film can be utilized. An N-type silicon film 223 (as a second conductive film) having a film thickness of about 100 nm coming into direct contact with the upper surface of the ruthenium film 273 immediately below a region having a capacitor formed is provided in the upper surface of the ruthenium film 273 in self alignment with a storage node electrode (described later). A ruthenium oxide film 274 is formed on the surface of the ruthenium film 273 not directly covered by the N-type silicon film 223.

The BPSG film 222 is provided with upper node contact holes 224 of about 0.5 $\mu m^2$ reaching the lower node contact holes 214A (penetrating the N-type silicon film 223, the ruthenium film 273 and this BPSG film 222). Each of the upper node contact holes 224 is directly covered by an N-type silicon film spacer 226 (as a third conductive film) having a width of about 43 nm. The bottom surfaces of such N-type silicon film spacers 226 come into contact only with the upper surfaces of the silicon nitride film spacers 216 in the upper ends of the lower node contact holes 214A, not with the ruthenium oxide films 268 on the upper surfaces of the contact plugs 267A, having intervals of about 107 nm therewith. Furthermore, these N-type silicon film spacers 226 are in direct contact with the sides of the N-type silicon films 223 and the ruthenium films 273. In the application example, a lower cell plate electrode is composed of this ruthenium film 273 (and a ruthenium oxide film 274), this N-type silicon film 223 and these N-type silicon film spacers 226.

The storage node electrode composed of the N-type silicon film is brought into direct contact with the ruthenium oxide film 268 constituting the upper surface of each contact plug 267A (for filling the lower node contact hole 214A) via each upper node contact hole 224, touching the upper surface of the silicon nitride film spacer 216 by a width of about 97 nm in the vicinity of the ruthenium oxide film 268. Silicon oxide films 229a each having a film thickness of e.g about 10 nm as lower capacitive insulating films are provided on the surfaces of the N-type silicon film 223 and the N-type silicon film spacer 226 covered by the storage node electrodes 234. The silicon oxide films 229a are formed only between the lower cell plate electrodes and the storage node electrodes 234 (in self alignment with each storage node electrode 234).

The surface of the storage node electrode 234 excluding a portion in contact with the lower node contact hole 214A and a portion in contact with the silicon oxide film 229a and the side of the N-type silicon film 223 connected to the side of the storage node electrode 223 via the silicon oxide film 229a are covered by silicon oxide films 239 each having a film thickness of about 10 nm as upper capacitive films. These silicon oxide films 239 are directly connected to the silicon oxide films 229a all around the side lower ends of the storage nod electrodes 234. An upper cell plate electrode formed by an N-type silicon film 245 having a film thickness of about 150 nm covers the upper surface and side of each storage node electrode 234 via the silicon oxide film 239 and is directly connected to the lower cell plate electrode in the upper surface of the ruthenium oxide film 274.

Figure 16A:
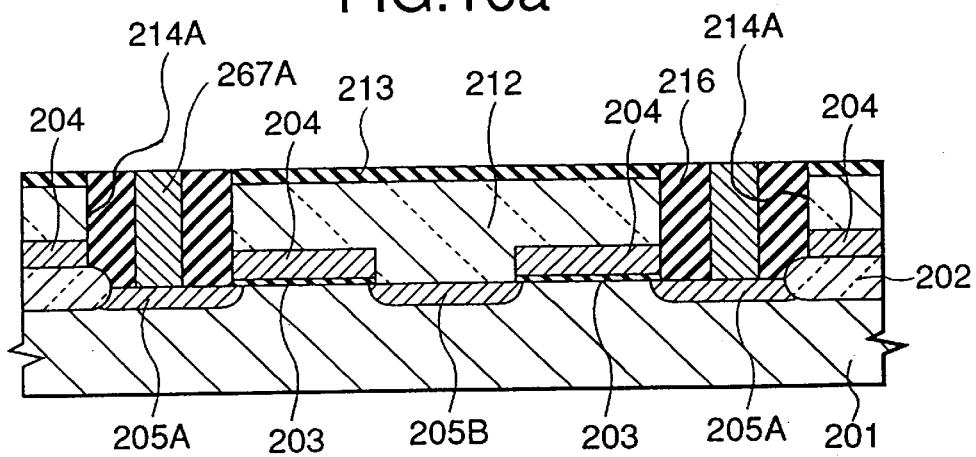
FIGS. 16(a), 16(b), and 16(c) are schematic section views taken along the line A—A of FIG. 14, showing principal manufacturing steps of an application example of the second embodiment.
Figure 16B:
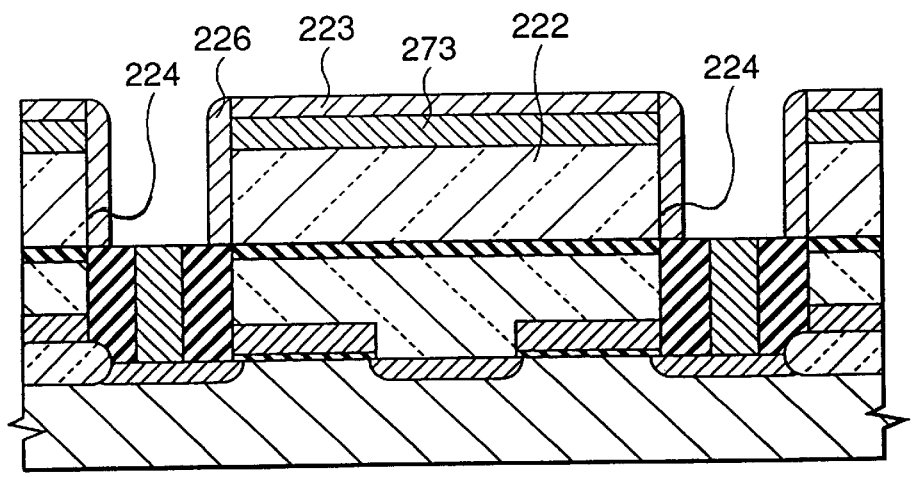
Figure 16C:
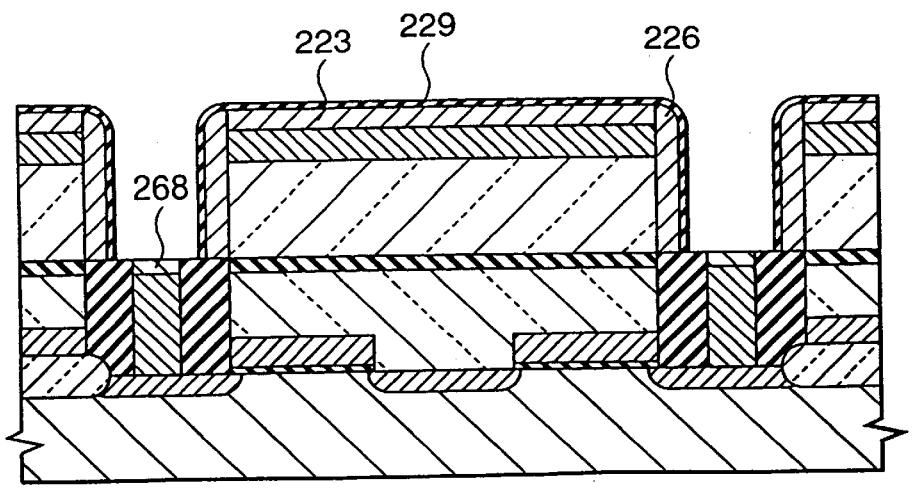
Figure 17A:
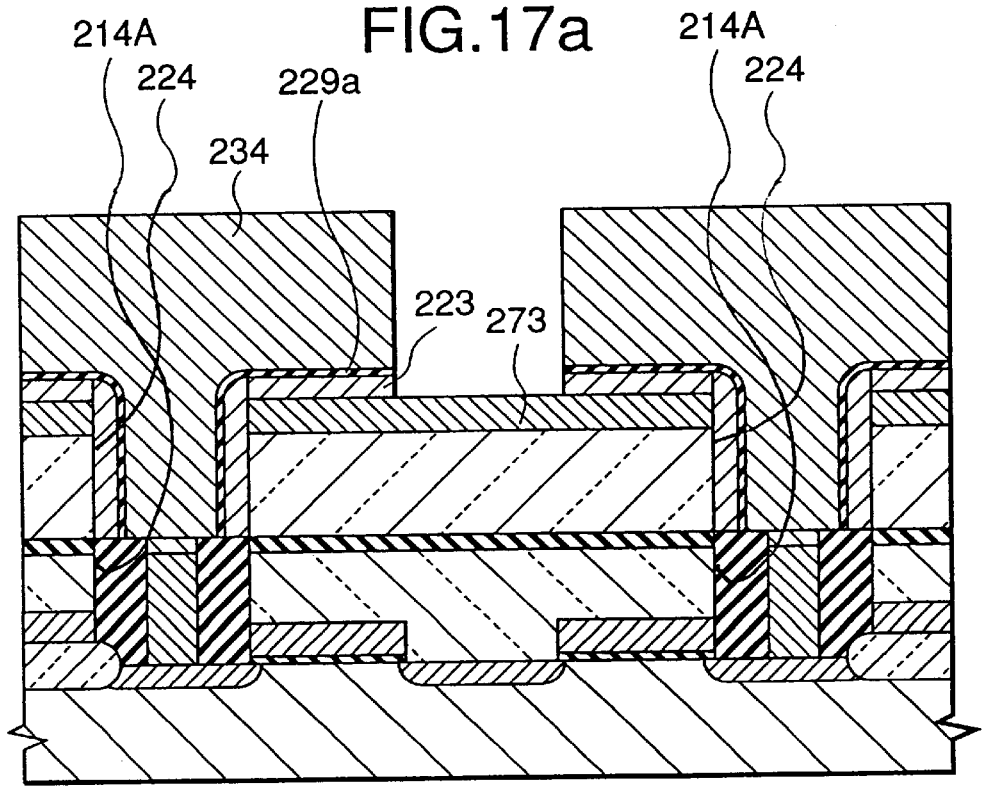
FIGS. 17(a) and 17(b) are schematic section views taken along the line A—A of FIG. 14, showing principal manufacturing steps of an application example of the second embodiment.
Figure 17B:
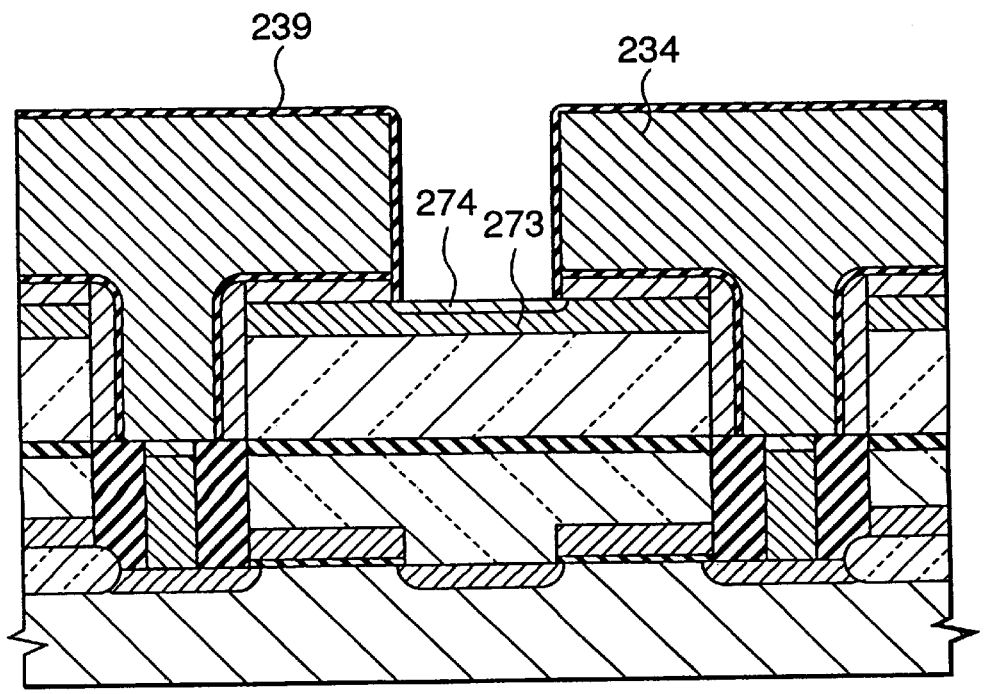
Figure 18A:
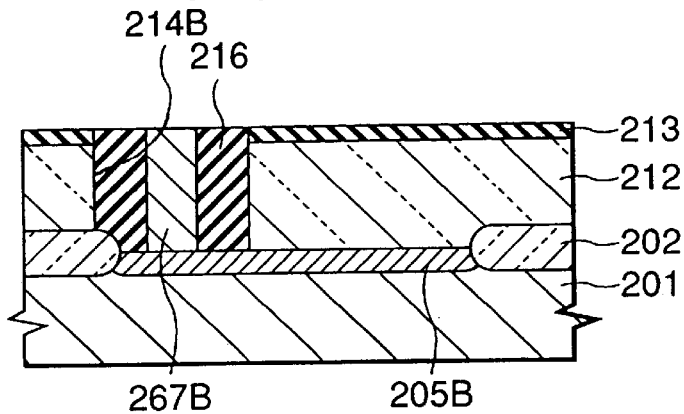
FIGS. 18(a), 18(b), and 18(c) are schematic section views taken along the line B—B of FIG. 14, showing principal manufacturing steps of an application example of the second embodiment.
Figure 18B:
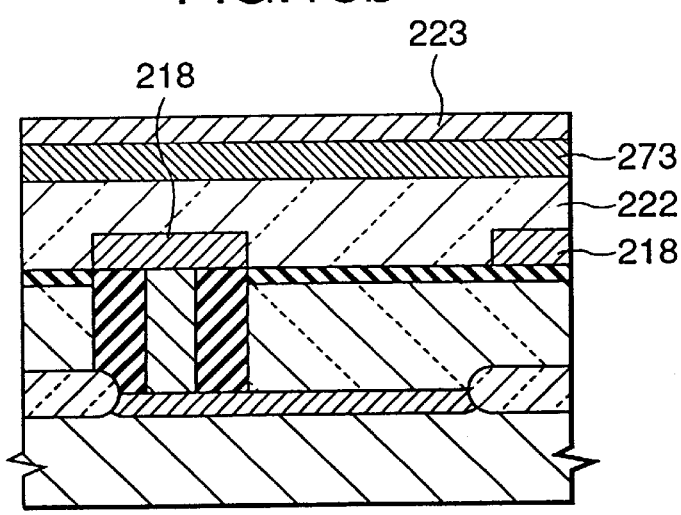
Figure 18C:
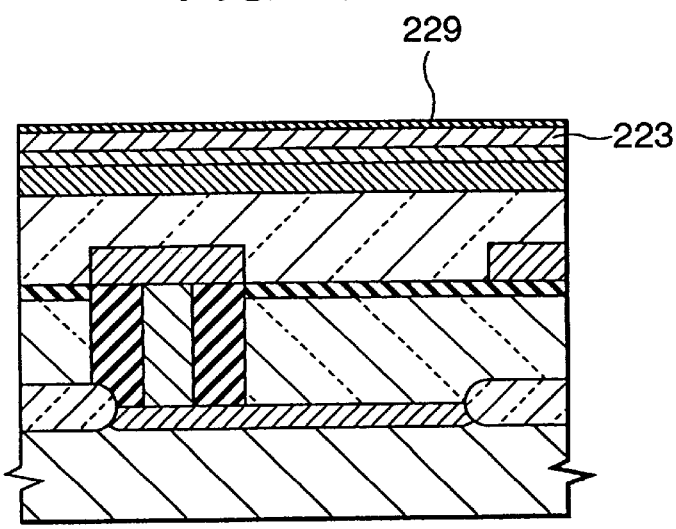
Figure 19A:
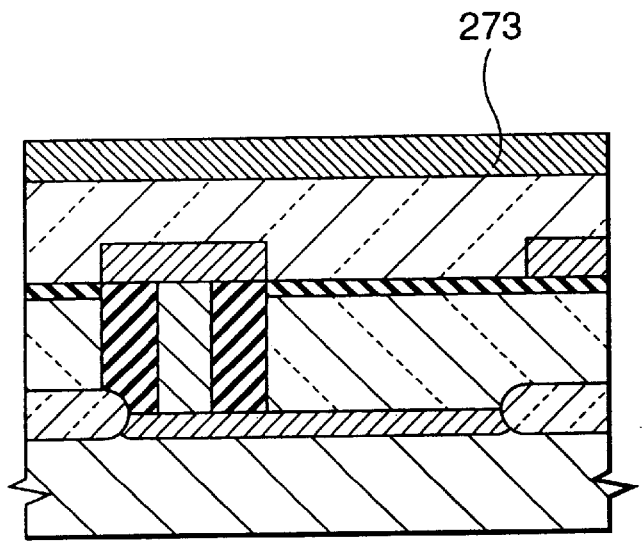
FIGS. 19(a) and 19(b) are schematic views taken along the line B—B of FIG. 14, showing principal manufacturing steps of an application example of the second embodiment.
Figure 19B:
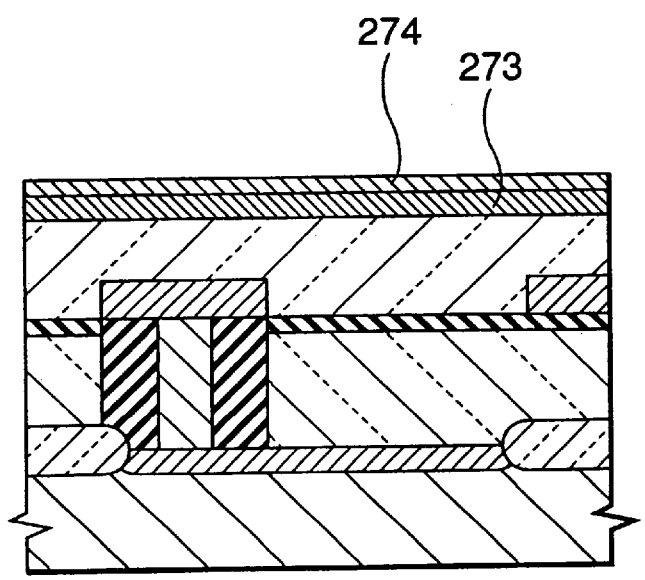

Referring to FIGS. 14 and 15 which are schematic section views of the manufacturing steps of the memory cells of the DRAM, FIGS. 16 and 17 which are schematic section views taken along the line A—A of FIG. 14 and FIGS. 18 and 19 which are respectively a schematic section view of the manufacturing steps of the memory cells of the DRAM and a schematic section view taken along the line B—B of FIG. 14, the memory cell of the first application example of the second embodiment is formed as follows.

First, field oxide films 202 each having a film thickness of about 400 nm are formed in the element separation regions of the surface of a P-type silicon substrate and gate oxide films 203 each having a film thickness of about 10 nm are formed in the element formation regions. An N-type silicon film having a film thickness of about 200 nm or a tungsten polycide film is formed on the full surface, this film is patterned and a plurality of word lines 204 each having a line width (gate length) of about 0.5 $\mu m$ and an interval of about 0.5 $\mu m$ are formed in parallel with the Y direction. By masking these word lines 204, N-type source and drain regions 205A and 205B each having a junction depth of about 0.2 $\mu m$ are formed in each element formation region. Then, a first HTO film having a film thickness of about 50 nm is formed on the full surface, a BPSG film is formed and caused to re-flow, CMP is performed and a BPSG film 212 having a flat upper surface is formed. Thereby, forming of a first silicon oxide insulating film constituting a first underlayer insulating film is finished. The structure of this first silicon oxide insulating film is not limited to a combination between the HTO film and the BPSG film. Subsequently, a first silicon nitride film having a film thickness of about 30 nm is formed, thereby finishing forming of the first underlayer insulating film composed of the silicon nitride film 213, the BPSC film 212 and the first HTO film. Furthermore, a silicon oxide film having a film thickness of at least about 150 nm (not shown) is formed. By masking a photo resist film (not shown), different direction etching is performed for the silicon oxide film, the silicon nitride film 213, the BPSG film 212 and the HTO film in sequence and lower node contact holes 214A of about 0.5 $\mu m^2$ reaching the N-type source region 205A self-aligned with the word lines 204 and bit contact holes 214B of about 0.5 $\mu m^2$ reaching the N-type drain region 205B are formed.

Then, by means of LPCVD, a second silicon nitride film having a film thickness of about 150 nm (first specified film thickness) is formed on the full surface (not shown). Etching back is performed for the second silicon nitride film by means of different direction etching until the upper surface of the silicon oxide film is exposed and silicon nitride film spacers (not shown) each having a normal sectional shape are formed in the sides of the lower node contact holes 214A and bit contact holes 214B. Subsequently, by forming a film created by laminating titanium nitride films (not shown) on a barrier film (titanium film, not shown) using collimated sputtering and a first ruthenium film using LPCVD, a first conductive film of the application example is formed. The film thickness of the first ruthenium film is thick enough to fill each of the lower node contact hole 214A and bit contact holes 214B covering the side of the silicon nitride film spacer.

Then, CMP is performed for the first conductive film, the silicon oxide film and the silicon nitride film spacer (at least in the last stage) until the upper surface of the silicon nitride film 213 is exposed. This makes it possible to form and leave silicon nitride film spacers 216 each having a width of about 150 nm for directly covering the sides of the lower node contact holes 214A and the bit contact holes 214B (and the exposed sides of the word lines 204) and contact plugs 267A and 267B of 0.2 $\mu m^2$ (composed of first conductive films) for filling the lower node contact holes 214A and the bit contact holes 214B via the silicon nitride film spacers 216. The silicon nitride film spacers 216 have flat upper surfaces coinciding with the upper surfaces of the silicon nitride films 213 and the contact plugs 267A and 267B have flat upper surfaces approximately coinciding with the upper surfaces of the silicon nitride films 213 at this stage. The silicon nitride film spacers 216 contribute toward insulation separation between the contact plugs 267A and the word lines 204 (exposed in the sides of the lower node contact holes 214A) and between the contact plugs 267B and the word lines 204 (exposed in the sides of the bit contact holes 214B) [FIGS. 1, 4(a), 15, 16(a) and 18(a)]. Prior to performing of CMP, it is possible to perform etching back for the ruthenium film constituting the first conductive film. At this time, gas created by adding chlorine to oxygen is used as etching gas.

Then, a tungsten silicide film or a tungsten polycide film having a film thickness of about 200 nm is formed on the full surface, this is patterned and a plurality of bit lines 218 in parallel with the X direction are formed. The line width and interval of each of these bit lines 218 are respectively about 0.5 $\mu m$ and 0.8 $\mu m$. Selection of constituting materials for the bit lines in the embodiment is not so strict as that of the constituting materials for the bit lines 218 in the first embodiment. Then, a second HTO film (not shown) having a film thickness of about 50 nm on the full surface and a second BPSG films is formed. This BPSG film is caused to re-flow, CMP is performed and a BPSG film 222 having a flat upper surface is formed. Thereby, forming of a second underlayer insulating film composed of a second silicon oxide insulating film including the second HTO film and the BPSG film 222 is finished. The film thickness of the BPSG film 222 immediately above the bit lines 218 is about 250 nm. As in the case of the first silicon oxide film insulating film constituting the first underlayer insulating film, the second silicon oxide insulating film constituting the second underlayer insulating film is not limited to such a structure.

Then, a second ruthenium film 273 having a film thickness of about 100 nm (as a second conductive film) is formed on the full surface by means of LPCVD. Subsequently, a first N-type silicon nitride film 223 having a film thickness of about 100 nm (as a third conductive film) is formed on the full surface by means of e.g LPCVD. By masking a photo resist film (not shown), different direction etching is performed for the N-type silicon film 223, the ruthenium film 273 and the second underlayer insulating film in sequence and upper node contact holes 224 of about 0.5 $\mu m^2$ reaching the lower node contact holes 214A are formed. A second underlayer insulating film having a width of about 150 nm is provided between the upper node contact hole 24 and the bit line 218. Then, a second N-type silicon film (not shown) having a film thickness of about 50 nm (second specified film thickness) (as a fourth conductive film) is formed on the full surface by means of LPCVD. The second N-type silicon film is etched back by means of different direction etching using hydrogen bromide as etching gas until the upper surface of the silicon nitride film spacer 216 is exposed and N-type silicon film spacers 226 directly covering the sides of the upper node contact holes 224 are formed. The upper ends of these N-type silicon film spacers 226 coincide with the upper surfaces of the N-type silicon films 223, the bottom surfaces thereof are in contact only with the upper surfaces of the silicon nitride film spacers 216 and an interval between the N-type silicon spacer 226 and the contact plug 267A is about 100 nm [FIGS. 14, 15, 16(b) and 18(b)].

Then, by means of rapid thermal oxidizing (RTO) or oxidizing in a dry oxygen atmosphere of about 700° C., silicon oxide films 229 each having a film thickness of about 10 nm (as first capacitive insulating films) are formed on the surfaces of the N-type silicon films 223 and the N-type silicon film spacers 226. At this time, the surfaces of the contact plugs 267A provided in the lower node contact holes 214A are also oxidized and ruthenium oxide films 268 are formed in the upper ends of the contact plugs 267A [FIGS. 16(c) and 18(c)]. The application example makes use of the fact that a ruthenium oxide is a conductive oxide. Thus, in the application example, when a silicon oxide film 229 as a capacitive insulating film is to be formed, it is not necessary to employ the manufacturing method made difficult due to forming of oxide films on the surfaces of the contact plugs as in the first embodiment.

As described above, LPCVD is used for forming the ruthenium film of the application example. However, as a method of forming ruthenium films, in addition to the above-noted method, there is available a method of sputtering or spin-on-coating, etc., utilizing or organic solvents. If the spin-on-coating method is used, it is difficult to avoid the problem of reliability due to remaining of carbon. Use of sputtering for forming of ruthenium films is not preferable, because local oxidization progresses to the barrier film or even to the N-type source region 205A during oxidizing of the capacitive insulating film due to the creation of a grain field having a columnar structure.

In the embodiment, instead of the ruthenium film constituting the first conductive film, an iridium film, a rhodium film, a rhenium film or an osmium film can be used. These films should preferably be formed by means of LPCVD. Furthermore, the oxide films thereof formed by means of LPCVD may be used. Likewise, instead of the ruthenium film 273 as the second conductive film, an iridium film, a rhodium film, a rhenium film or an osmium film, or any of oxide films thereof can be used. In the embodiment, it is not necessary to form the first and second conductive films (excluding the barrier films) by the same materials.

Furthermore, during oxidizing for the formation of the silicon oxide film 229, silicide chemical reaction occurs somewhat between the N-type silicon film 223 and the ruthenium film 173 and between the N-type silicon film spacer 226 and the same. In order to avoid this, a manufacturing method like the following will be employed. After the ruthenium film 273 is formed, a titanium nitride film having a film thickness of about 10 nm (as a second barrier film) is formed and then an N-type silicon film 223 is formed. After the upper node contact holes 224 are formed, a titanium nitride film having a film thickness of about 10 nm (as a third barrier film) is formed by means of LPCVD and a second N-type silicon film is formed. After an N-type silicon film spacer 226 is formed by etching back this second N-type silicon film, etching back is performed for the titanium nitride film as the third barrier film. In this case, during oxidizing, titanium nitride films existing between the N-type silicon film 223 and the N-type silicon film spacer 226 and the silicon nitride film spacer 216 and the N-type silicon film spacer 226 are also oxidized, forming titanium oxide films. However, these will not create any problems.

Then, after a silicon oxide film 229 as a first capacitive insulating film is formed, a third N-type silicon film (as a fifth conductive film) is formed on the full surface by means of LOCVD. Patterning is performed for the N-type silicon film, the silicon oxide film 229 and the N-type silicon film 223 in sequence by means of different direction etching, a storage node electrode 234 composed of the third N-type silicon film is formed and a lower capacitive insulating film composed of the left silicon oxide film 229a is formed [FIGS. 14(b), 15, 17(a) and 19(a)].

Then, by means of rapid thermal oxidizing (RTO) or oxidizing in a dry oxygen atmosphere of about 700° C., silicon oxide films 239 each having a film thickness of about 10 nm as upper capacitive insulating films are formed in the upper and side surfaces of the storage node electrode and the side of the patterned N-type silicon film 223. These silicon oxide films 239 are directly connected to the silicon oxide films 229a all around the lower end of the side of the storage node electrode 234. This oxidizing enables forming of a ruthenium oxide film 274 on the surface of the ruthenium film 273 exposed in the gap of the storage node electrode 234. Thereby, forming of a lower cell plate electrode composed of the N-type silicon film 223, the N-type silicon film spacer 226 and the ruthenium film 273 (and the ruthenium oxide film 274) is finished [FIGS. 14(b), 15, 17(b) and 19(b)].

Thereafter, by means of LPCVD, etc., an upper cell plate electrode composed of a fourth N-type silicon film 245 (as a sixth conductive film) is formed. This N-type silicon film 245 is directly connected to the surface of the ruthenium oxide film 274 constituting the lower cell plate electrode. Thus, forming of the memory cell of the application example is finished [FIGS. 14(b) and 15].

The second embodiment can be applied, as in the case of the first embodiment, to any of a folded bit line system, an open bit line system or a system in which the word lines and the bit lines are approximately straight and these lines do not orthogonally cross one another via the first underlayer insulating film, as long as it is a DRAM of stacked and COB types. In the application example, constituting materials and various numerical values are not limited to those described above.

Aside from the capacity value of each memory cell, as in the first application example, the second embodiment has an effect that the surface ratio of the storage node electrode increases more than the conventional memory cell, contributing toward the capacitor. Moreover, according to the manufacturing method of the second embodiment, the method of forming the lower capacitive insulating film is easier than that of the first embodiment.

The method of composing and forming the contact plugs of the second embodiment can be applied to the first embodiment.

Figure 20A:
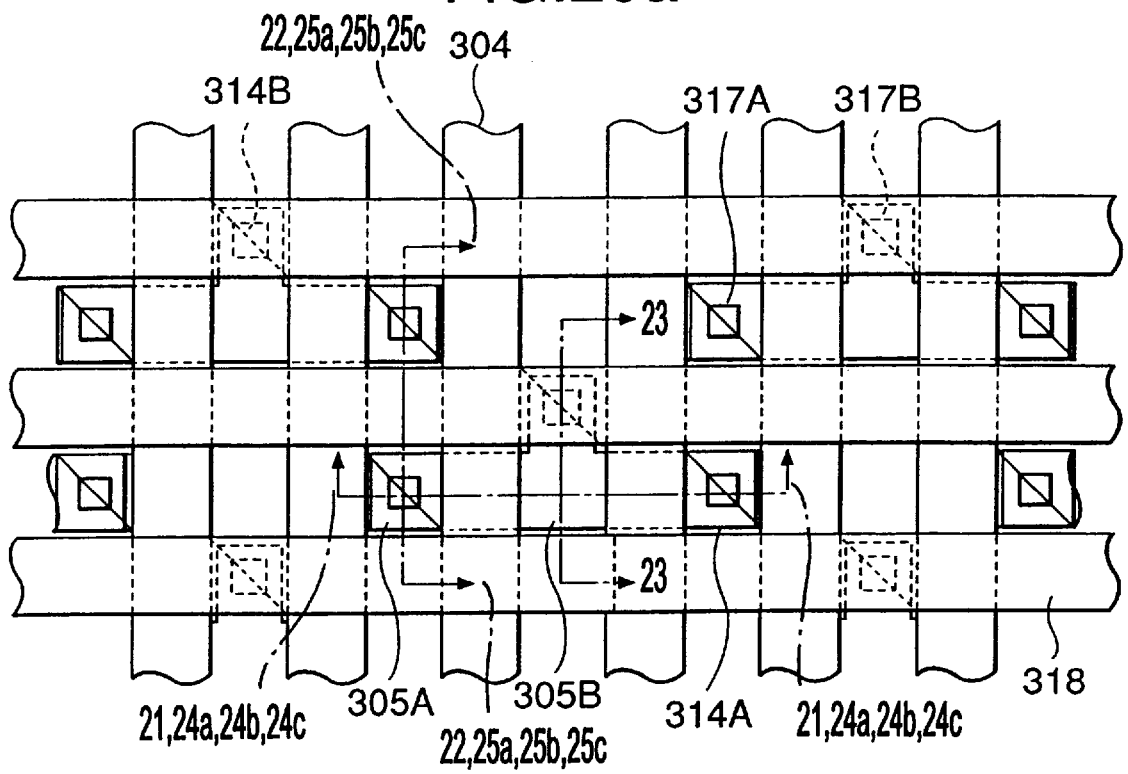
FIGS. 20(a) and 20(b) are schematic plan views of a first application example of a third embodiment of the present invention.
Figure 20B:
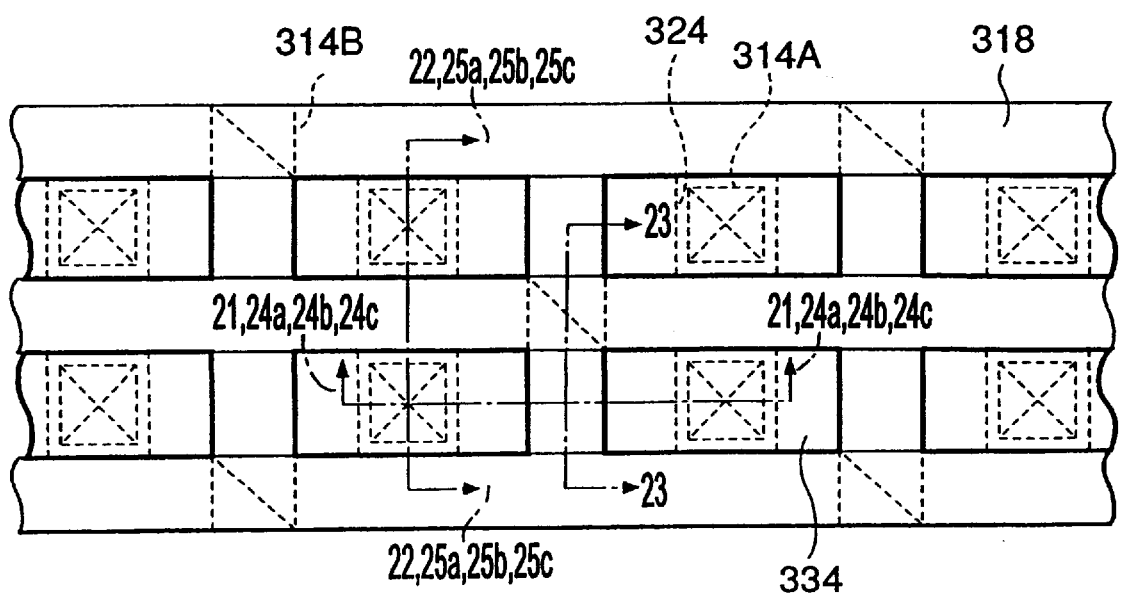
Figure 21:
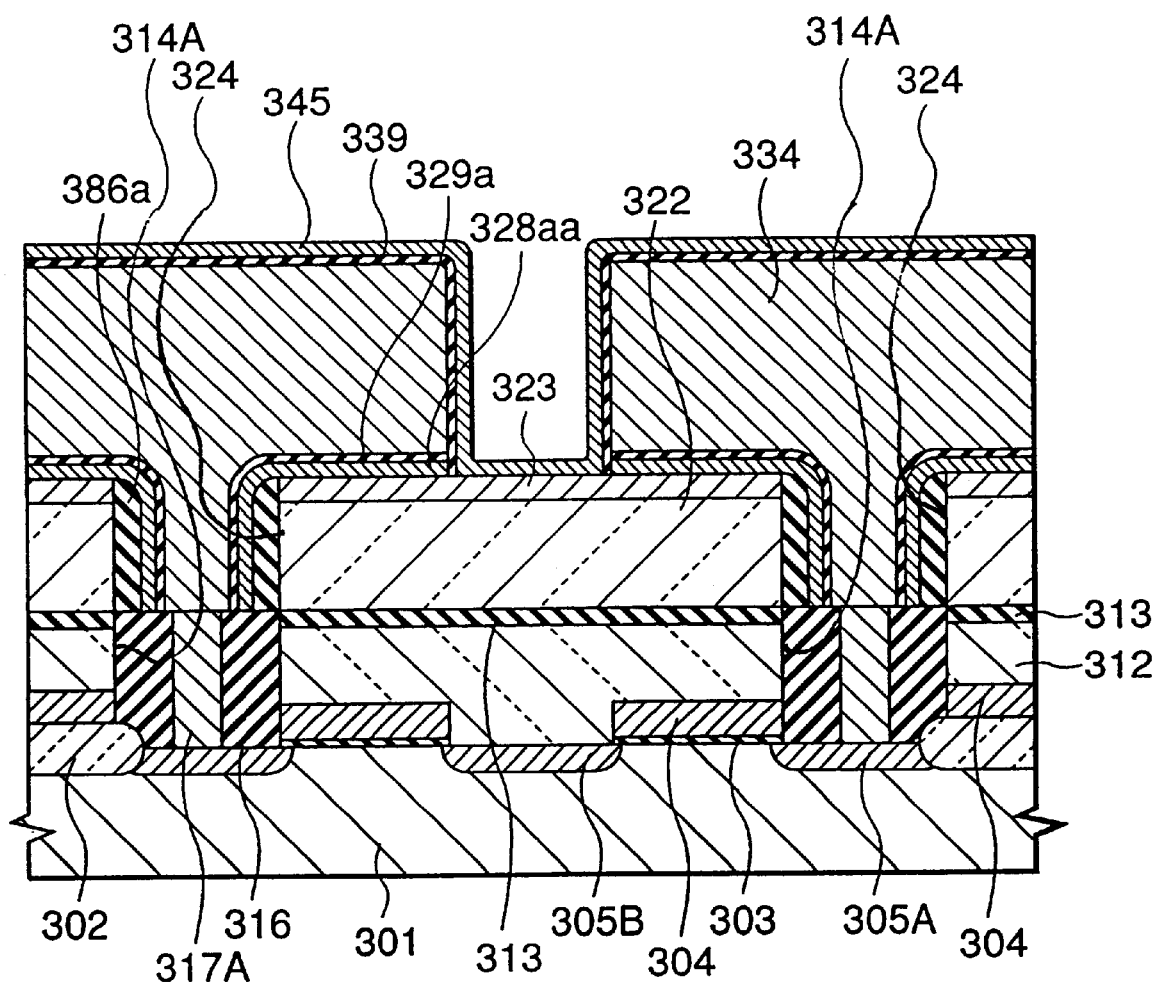
FIG. 21 is a schematic section view taken along the line A—A of FIG. 20, showing the first application example of the third embodiment.
Figure 22:
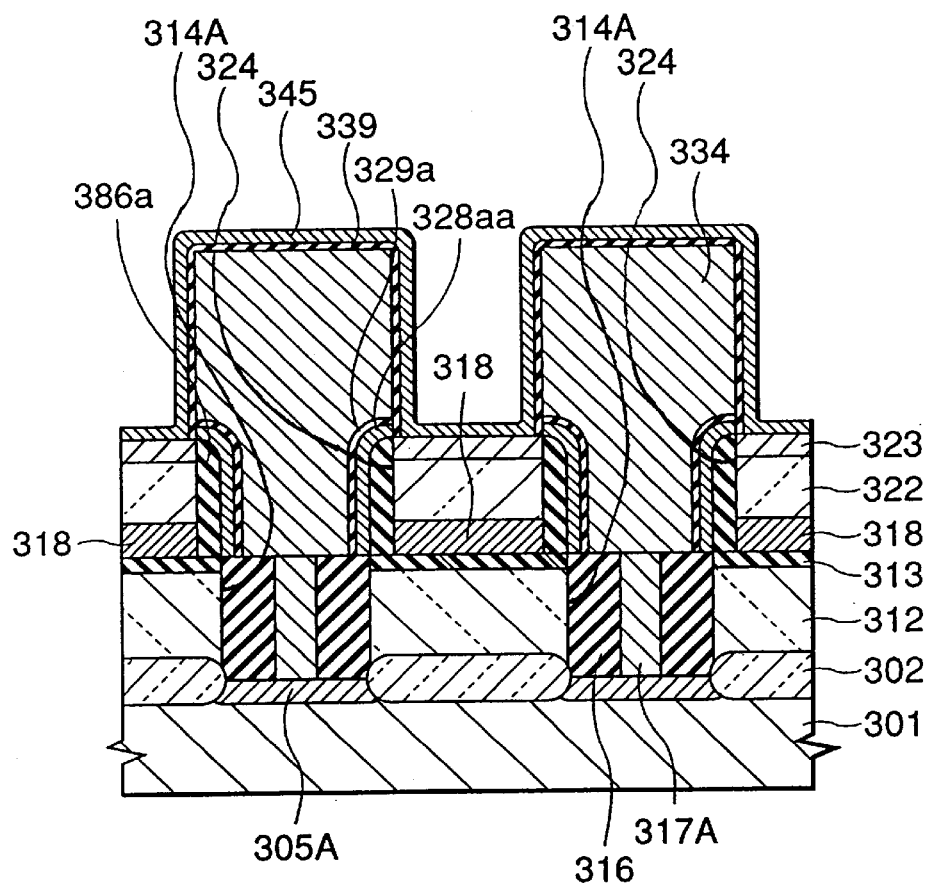
FIG. 22 is a schematic section view taken along the line B—B of FIG. 20, showing the first application example of the third embodiment.
Figure 23:
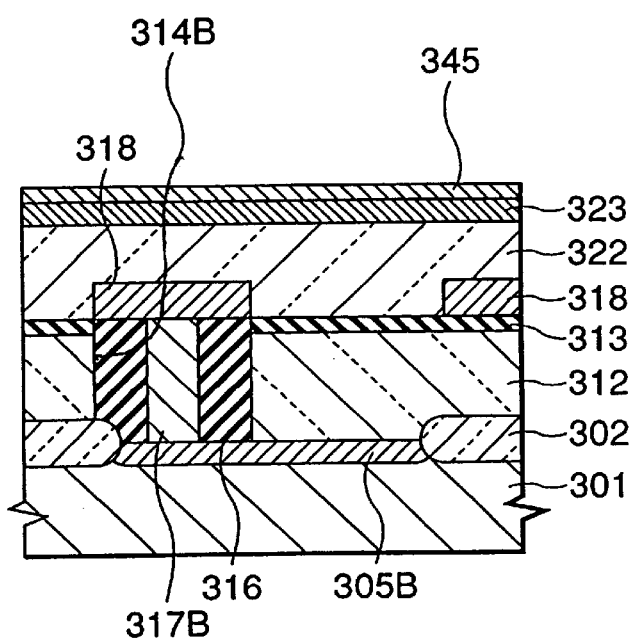
FIG. 23 is a schematic section view taken along the line C—C of FIG. 20, showing the first application example of the third embodiment.
Figure 24A:
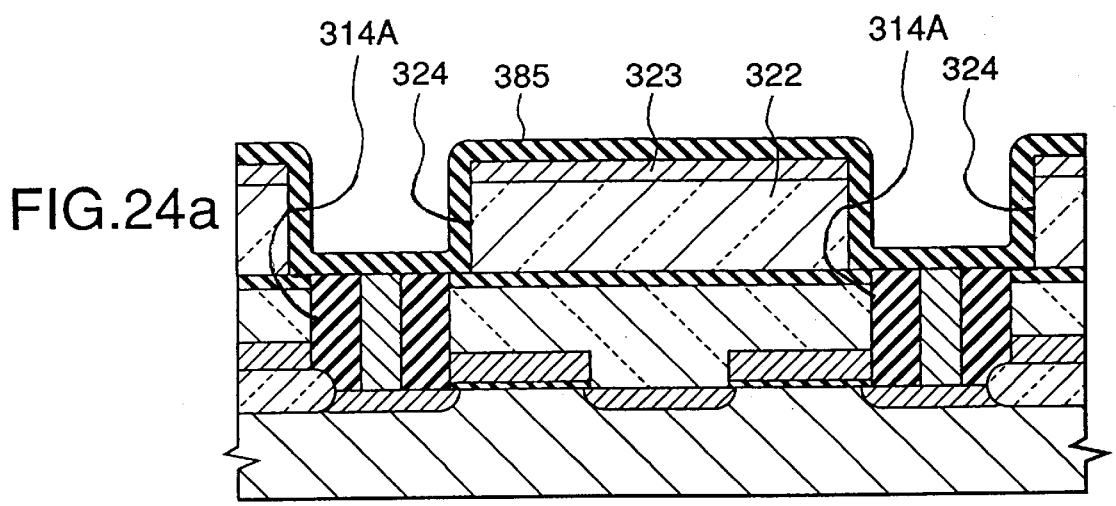
FIGS. 24(a), 24(b), and 24(c) are schematic section views taken along the line A—A of FIG. 20, showing principal manufacturing steps of the first application example of the third embodiment.
Figure 24B:
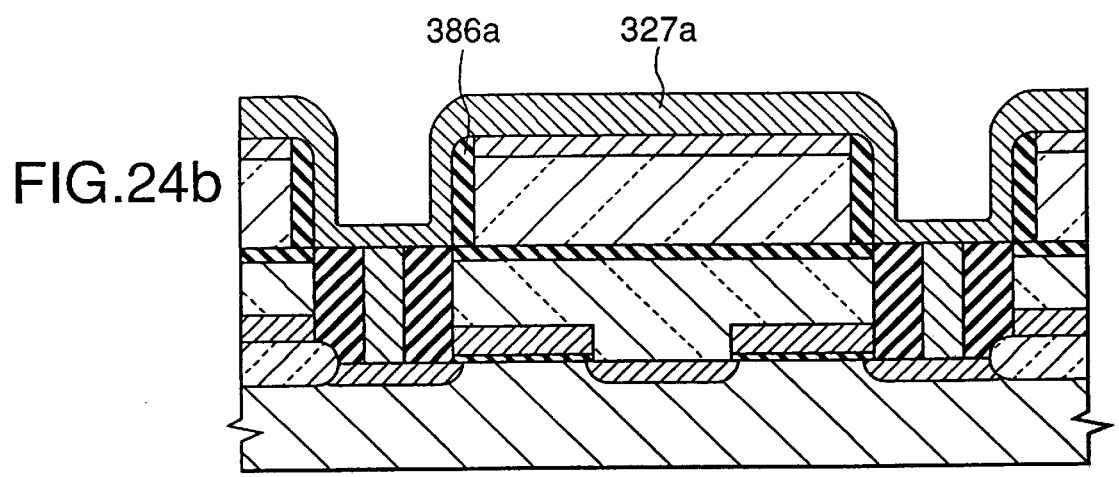
Figure 24C:
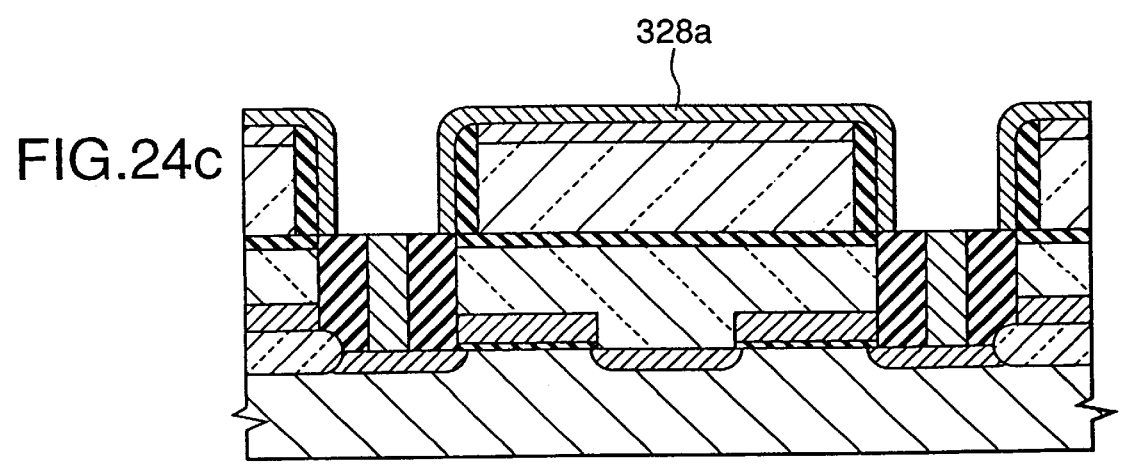

Referring to FIGS. 20(a) and 20(b) which are schematic plan views showing the word lines and bit lines of the memory cell of the DRAM and the bit lines and storage node electrode and FIGS. 21, 22 and 23 which are schematic section views respectively taken along the lines of A—A, B—B and C—C of FIG. 20, a DRAM of a first application example of a third embodiment is also a DRAM of a folded bit line system having, e.g a stacked and COB type memory cell formed under a 0.5 μm design rule, basic difference from the first and second embodiments is that its upper node contact holes are self-aligned with bit lines and this memory cell has a structure as follows. In FIG. 20 which is a schematic plan view, to facilitate understanding, the positions of element formation regions, lower node contact holes and upper node contact holes re shown to be shifted from those of the word lines, bit lines and storage node electrodes, etc., so as to prevent overlapping.

In a region in which a memory cell array is formed on the surface of a P-type silicon substrate 301, element formation regions plotted by LOCOS type field oxide films 302 each having a film thickness of about 400 nm are regularly arranged in X and Y directions. A plurality of word lines 304 provided in parallel with the Y direction traverse the plurality of element formation regions via gate oxide films 303 each having a film thickness of about 10 nm. The line width and interval of each word line 304 are both 0.5 μm and its film thickness is about 200 nm. These word lines 304 are formed by N-type poly crystalline silicon films, tungsten polycide films, etc. N-type source and drain regions 305A and 305B are provided in each element formation region in self alignment with the word lines 304. Junction depths of the N-type source and drain regions 305A and 305B are both about 0.2 μm and the N-type source region 305A has a width of about 0.6 μm.

The surface of each field oxide film 302 including the word lines 304 is covered by a first underlayer insulating film. This first underlayer insulating film composed of a first silicon oxide insulating film having a flat upper surface and a silicon nitride film 313 having a film thickness of about 30 nm for covering the same. The first silicon oxide insulating film is composed of an HTO film having a film thickness of about 50 nm (not shown) directly covering the surfaces of the word lines 304 and the field oxide film 302 and a BPSG film 312 having a flat upper surface. The film thickness of the BPSG film 312 immediately above the word lines 304 is about 250 nm. This first underlayer insulating film is provided with lower node contact holes 314A of about 0.5 μm² reaching the N-type source region 305A and bit contact holes 314B of about 0.5 μm² reaching the N-type drain region 305B. The lower node contact holes 314A and the bit contact holes 314B are formed in self alignment with the word lines 304. The sides of the lower node contact holes 314A and the bit contact holes 314B are directly covered by silicon nitride film spacers 316 and filled with contact plugs 317A and 317B via these silicon nitride film spacers 316. The structures of these contact plugs 317A and 317B are the same as in the case of the first embodiment. The silicon nitride film spacers 316 have flat upper surfaces coinciding with the upper surfaces of the silicon nitride films 313, each having a width of about 150 nm. The upper surfaces of the contact plugs 317A and 317B approximately coincide with the upper surfaces of the silicon nitride film spacers 316, being approximately flat. The contact plugs 317A and 317B are insulated from the word lines via the silicon nitride film spacers 316.

In the embodiment, the contact plugs 317A and 317B are not limited, as described above, to the N-type silicon films or the laminated films between the barrier film and the tungsten films. As in the second embodiment, the contact plugs 317B provided in the bit contact holes 314B may be composed of laminated films between a barrier film and an iridium film, a barrier film and a rhodium film, a barrier film and a rhenium film or a barrier film and an osmium film. At this time, the contact plugs 317A are composed of laminated films between a barrier film and a ruthenium film with the upper surface covered by a ruthenium oxide film, a barrier film an iridium film with the upper surface covered by an iridium oxide film, a barrier film and a rhodium film with the upper surface covered by a rhodium oxide film, a barrier film and a rhenium film with the upper surface covered by a rhenium oxide film or a barrier film and an osmium film with the upper surface covered by an osmium oxide film.

Furthermore, for these contact plugs, laminated films between a barrier film and a ruthenium oxide film, a barrier film and an iridium oxide film, a barrier film and a rhodium oxide film, a barrier film and a rhenium oxide film or a barrier film and an osmium oxide film may be utilized.

A plurality of bit lines 318 in parallel with the x direction are provided on the surface of the first underlayer insulating film. The line width, interval and film width of each bit line are respectively about 0.5 µm, 0.6 µm and 200 nm and the bit lines 318 are formed by e.g tungsten silicide films or tungsten polycide films (under the same limitation as in the first embodiment). The surface of the first underlayer insulating film including the bit lines 318 is covered by a second silicon oxide insulating film having a flat upper surface. The second silicon insulating film is composed of a second HTO film (not shown) having a film thickness of about 50 nm for directly covering, e.g the bit lines 318 and a BPSG film 322 having a flat upper surface. The film thickness of the BPSG film 322 immediately above the bit lines 318 is set to e.g 250 nm.

In the upper surface of the BPSG film 322 (in a region in which a memory cell array is formed), an N-type silicon film 323 having film thickness of about 100 nm (as a first conductive film) for directly covering the same is provided. A second underlayer insulating film is provided with upper node contact holes 324 penetrating the N-type silicon film 323, the BPSG film 322 and the second HTO film and reaching the lower node contact holes 314A. These upper node contact holes 324 are formed in self alignment with the bit lines 318 and the diameter of each of these upper node contact holes 324 is 0.5 µm (X direction)×0.6 µm (Y direction). The diameter of the upper nod contact hole 324 is not set to 0.6 µm² intentionally. This is to prevent a storage node electrode (described later) from reducing an area covering the upper surface of the second underlayer insulating film via a lower capacitive insulating film (described later). Silicon oxide film spacers 386a are provided in the sides of these upper node contact holes 324. The upper ends of the silicon oxide film spacers 386a approximately coincide with the upper surfaces of the N-type silicon films 323. The sides of the silicon oxide film spacers 386a and the upper surfaces of the N-type silicon films 323 immediately below a region in which a capacitor is formed in self alignment with the storage node electrode, are directly covered by titanium nitride films 328aa each having a film thickness of about 23 nm (as second conductive films). The titanium nitride films 328aa come into contact only with the upper surfaces of the silicon nitride film spacers 316 in the upper ends of the lower node contact holes 314A and intervals between the titanium nitride films 328a and the contact plugs 317A in the X direction are 83 nm. A lower cell plate electrode of the application example is composed of a N-type silicon film 323 and a titanium nitride film 328aa. The bit lines 318 and the titanium nitride films 328aa are insulation-separated via the silicon oxide film spacers 386a. For this insulation separation, a film thickness of about 20 nm is enough for the silicon oxide film spacer 386a. The titanium nitride film 328aa is isolated from the BPSG film 322 via the silicon nitride spacer 386a and thermal diffusion of boron to the titanium nitride film 328a is controlled. The surface (in the side with which the N-type silicon film 323, the silicon oxide film spacer 386a and the silicon nitride film spacer 316 are not in contact) excluding the side of the titanium nitride film 328aa (in the gap of the titanium nitride film 328aa in the upper surface of the N-type silicon film 323) is directly covered by a titanium oxide film 329a having a film thickness of about 10 nm as a lower capacitive insulating film.

As in the second embodiment, in third embodiment, instead of the N-type silicon film 323, a ruthenium film, an iridium film, a rhodium film, a rhenium film, an osmium film, a ruthenium oxide film, an iridium oxide film, a rhodium oxide film, a rhenium oxide film or an osmium oxide film can be utilized as a first conductive film. If a ruthenium film, an iridium film, a rhodium film, a rhenium film, or an osmium film is used, a ruthenium oxide film, an iridium oxide film, a rhodium oxide film, a rhenium oxide film or an osmium oxide film will be formed on the surface thereof in the gap of the titanium nitride film 328aa.

The storage node electrode 334 composed of the N-type silicon film is directly connected to the contact plugs 317A for filling the lower node contact holes 314A via the upper node contact holes 324 and in contact with the upper surface of the silicon nitride film spacer 316 by a width of about 77 nm in the vicinity of the contact plugs 317A. The surface of the storage node electrode 334 excluding the portions in contact with the lower node contact holes 314A and the titanium oxide film 329a and the side of the titanium nitride film 328aa connected to the side of the storage node electrode 323 via the titanium oxide film 329a are covered by second titanium oxide films 339 each having a film thickness of about 10 nm as upper capacitive insulating films. These titanium oxide films 339 are directly connected to the titanium oxide films 329a all around the side lower end of each storage node electrode 334. An upper cell plate electrode formed by a titanium nitride film 345 having a film thickness of about 40 nm directly covers the upper and side surfaces of each storage node electrode 334 via the titanium oxide film 339, being directly connected to a lower cell plate electrode in the upper surface of the N-type silicon film 323 in the gap of the storage node electrode 334.

Figure 25A:
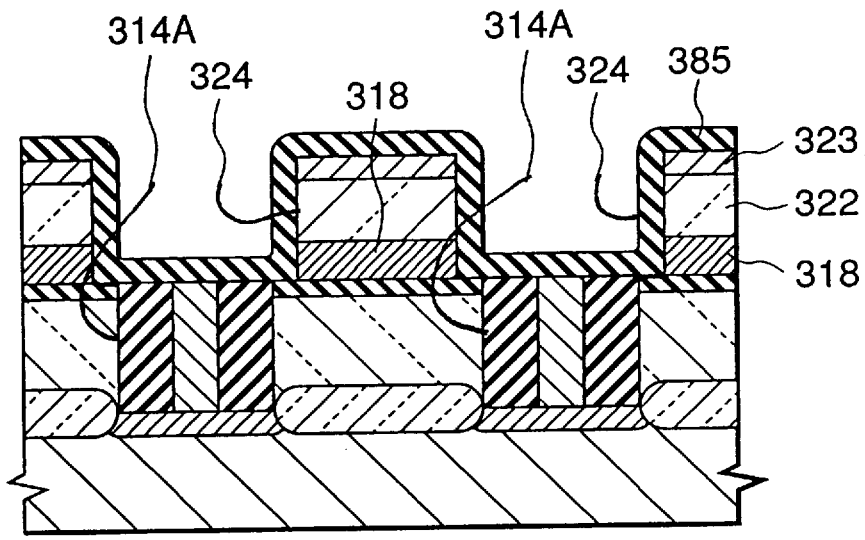
FIGS. 25(a), 25(b), and 25(c) are schematic section views taken along the line B—B of FIG. 20, showing principal manufacturing steps of the first application example of the third embodiment.
Figure 25B:
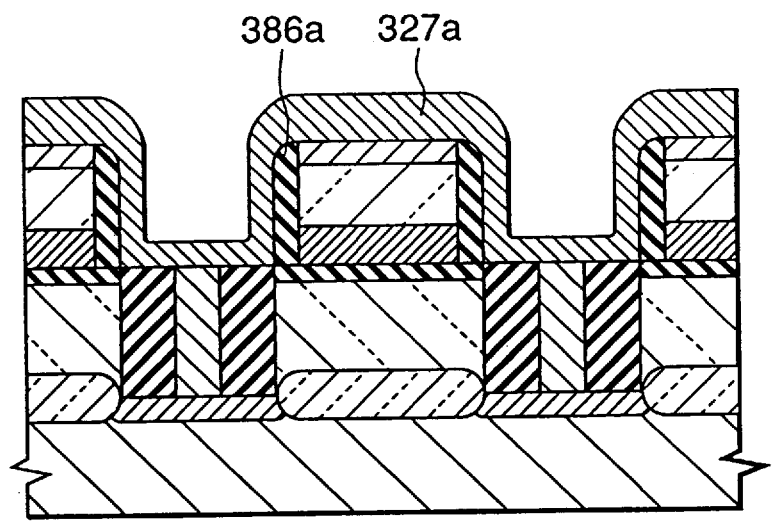
Figure 25C:
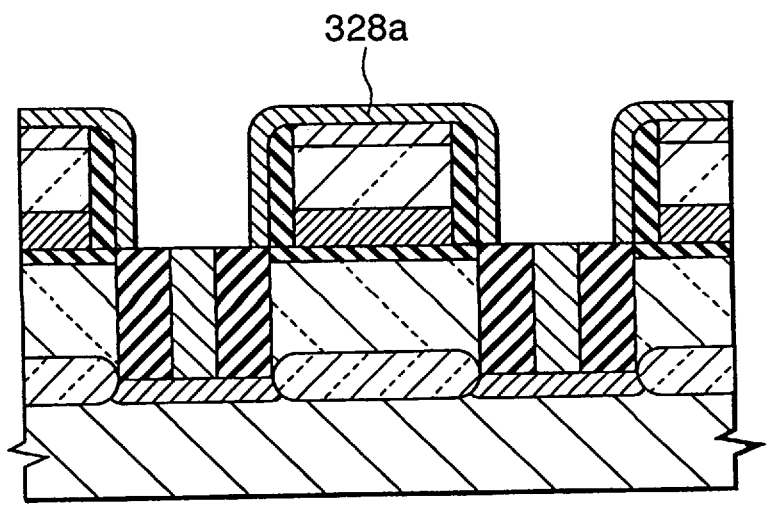

Referring to FIGS. 20, 21, 22 and 23, FIG. 24 which is a schematic main section view taken along the line A—A of FIG. 20, showing the main manufacturing steps of the memory cell of the DRAM, and FIG. 25 which is a schematic section view taken along the line B—B of FIG. 20m showing the manufacturing steps of the memory cell of the DRAM, a memory cell of the first application example of the third embodiment is formed as follows.

First, by means of the same method as the manufacturing method of the first embodiment, formation of field oxide films 302 and gate oxide films 303, formation of word lines 304, formation of N-type source and drain regions 305A and 305B and formation of a first interlayer insulating film composed of a first silicon oxide insulating film composed of a first HTO film having a film thickness of about 50 nm and a BPSG film 312 having a flat upper surface and a first silicon nitride film 313 are respectively performed. Then, by means of the same method, a silicon oxide film (not shown) having a film thickness of at least 150 nm is formed, formation of lower node contact holes 314A of about 0.5 µm² reaching the N-type source region 305A in self alignment with the word lines 304 and bit contact holes 305B of about 0.5 µm² reaching the N-type drain region 305B and formation of a second silicon nitride film (not shown) having a film thickness of about 150 nm (first specified film thickness) by means of LPCVD are performed, etching back is performed for the second silicon nitride film by means of different direction etching until the upper surface of the silicon oxide film is exposed and silicon nitride film spacers (not shown) having normal sectional shapes are formed in the sides of the lower node contact holes 314A and the bit contact holes 314B.

Furthermore, by means of the same method as the manufacturing method of the first embodiment, a first conductive film is formed on the full surface by means of LPCVD, etc., CMP is performed for the first conductive film, the silicon oxide film and the silicon nitride film spacers (at least in the last stage) until the upper surface of the silicon nitride film 313 is exposed, formation and leaving of silicon nitride film spacers 316 each having a width of about 150 nm for directly covering the respective sides of the lower node contact holes 313A and the bit contact holes 314B (and the exposed sides of the word lines) are performed and formation and leaving of contact plugs 317A and 317B of about 0.2 $\mu m^2$ (composed of a first conductive film) for filling the lower node contact holes 314A and the bit holes 314B via the silicon nitride film spacers 316 are performed.

Subsequently, by means of the same method as the manufacturing method of the first embodiment, a tungsten silicide film or a tungsten polycide film having a film thickness of about 200 nm is formed on the full surface, this is patterned and bit lines 318 are formed. Each of these bit lines 318 has a line width of about 0.5 $\mu$m and an interval of about 0.6 $\mu$m. A second silicon oxide insulating film composed of a second HTO film (not shown) and a second BPSG film 222 having a flat upper surface is formed and thereby forming of a second interlayer insulating film is finished. The film thickness of the BPSG film immediately above the bit lines 318 is about 250 nm [FIGS. 20(a), 21, 22 and 23].

Then, an N-type silicon film 323 having a film thickness of about 100 nm (as a second conductive film) is formed on the full surface by means of LPCVD. By masking a photo resist film (not shown), different direction etching is performed for the N-type silicon film 323 and the second interlayer insulating film in sequence and upper node contact holes 324 of diameters of 0.6 $\mu$m×0.5 $\mu$m reaching the lower node contact holes 314A are formed. The upper node contact holes 324 are formed in self alignment with the bit lines 318. Subsequently, a silicon oxide film 385 having a film thickness of about 40 nm (as a third HTO film) is formed on the full surface [FIGS. 24(a) and 25(a)].

Such silicon oxide films 385 are selectively etched back and silicon oxide film spacers 386a directly covering the sides of the upper node contact holes 324 are formed. The upper ends of these silicon oxide film spacers 386a approximately coincide with the upper surfaces of the N-type silicon films 323. During etching back carried out for forming the silicon oxide film spacers 386a, the silicon nitride films 313 and the silicon nitride film spacers 316 function as etching stoppers. Then, by means of the same method as that of the first embodiment, titanium nitride films 327a (as first nitride metal films of interstitial compounds) each having a film thickness of about 30 nm (second specified film thickness) in the sides of the silicon nitride film spacers 386a are formed by using LPCVD and sputtering [FIGS. 24(b) and 25(b)]. As in the first embodiment, in the third embodiment, instead of the titanium nitride films 327a as first nitride metal films, tantalum nitride films, zirconium nitride films or niobium nitride films may be used.

Then, by means of the same method as that of the first embodiment, the titanium nitride films 327a are etched back until the upper surfaces of the silicon nitride film spacers 316 are exposed, leaving titanium nitride films 328a. These titanium nitride films 328a are in contact only with the upper surfaces of the silicon nitride film spacers 316 in the upper ends of the lower node contact holes 314A and intervals between the titanium nitride films 328a and the contact plugs 317A are about 80 nm [FIGS. 24(c) and 25(c)].

Then, by means of oxidizing (RTO or oxidizing in a dry oxygen atmosphere of about 700° C. can be utilized for the constitutional materials for the contact plugs), titanium oxide films 329a each having a film thickness of about 10 nm are formed on the surfaces of the titanium nitride films 328a and titanium nitride films 328aa each having a film thickness of about 23 nm (third specified film thickness) are left in portions directly covering the silicon oxide film spacers 386a. Subsequently, by means of LPCVD, an N-type silicon film (as a third conductive film) is formed on the full surface. Patterning is performed for this N-type silicon film, the titanium oxide film 329a and the titanium nitride film 328aa in sequence by means of different direction etching, thereby finishing forming of a storage node electrode 334 composed of this N-type silicon film, a lower capacitive insulating film composed of the left titanium oxide film 329a and a lower cell plate electrode composed of the left and patterned titanium nitride film 328aa and the N-type silicon film 323.

Then, by means of the same method as that of the first embodiment, a titanium nitride film (not shown) (as a second nitride metal film of an interstitial compound) having a film thickness of about 7 nm (fourth specified film thickness) in the side of the storage node electrode 334 is formed by using LPCVD and sputtering, this titanium nitride film is etched back by means of different direction etching and plasma-oxidized and then a titanium oxide film 339 having a film thickness of about 10 nm as an upper capacitive insulating film is formed. Subsequently, by means of LPCVD, a titanium nitride film 345 having a film thickness of about 40 nm (as a third nitride metal film of an interstitial compound) is formed on the full surface, forming an upper cell plate electrode. The upper cell plate electrode directly covers the upper and side surfaces of each storage node electrode 334 via the titanium oxide film 339, being directly connected to the lower cell plate electrode in the upper surface of the N-type silicon film 323 in the gap of the storage node electrode 334 [FIGS. 20(b), 21, 22 and 23].

As in the first embodiment, the first application example of the third embodiment can be applied to a folded bit line system, an open bit line system or a system in which the word lines and the bit lines are approximately straight and these lines do not orthogonally cross one another via the first interlayer insulating film, as long as a DRAM having a memory cell of stacked and COB types is used. Moreover, in the application example, constitutional materials and various numerical values are not limited to those described above.

As in the case of the first application example of the first embodiment, the first application example of the third embodiment has, compared with the conventional memory cell, an effect that the surface ratio of the storage node electrode increases more, contributing to the capacitor. Furthermore, the application example has an advantage that the structure of the lower cell plate electrode and the manufacturing method are simpler than those of the first and second embodiments.

The silicon oxide film spacers provided in the sides of the upper node contact holes in the first application example of the third embodiment can be applied to the first and second embodiments, irrespective of the existence of the self alignment of the upper node contact holes with the bit lines.

Figure 26A:
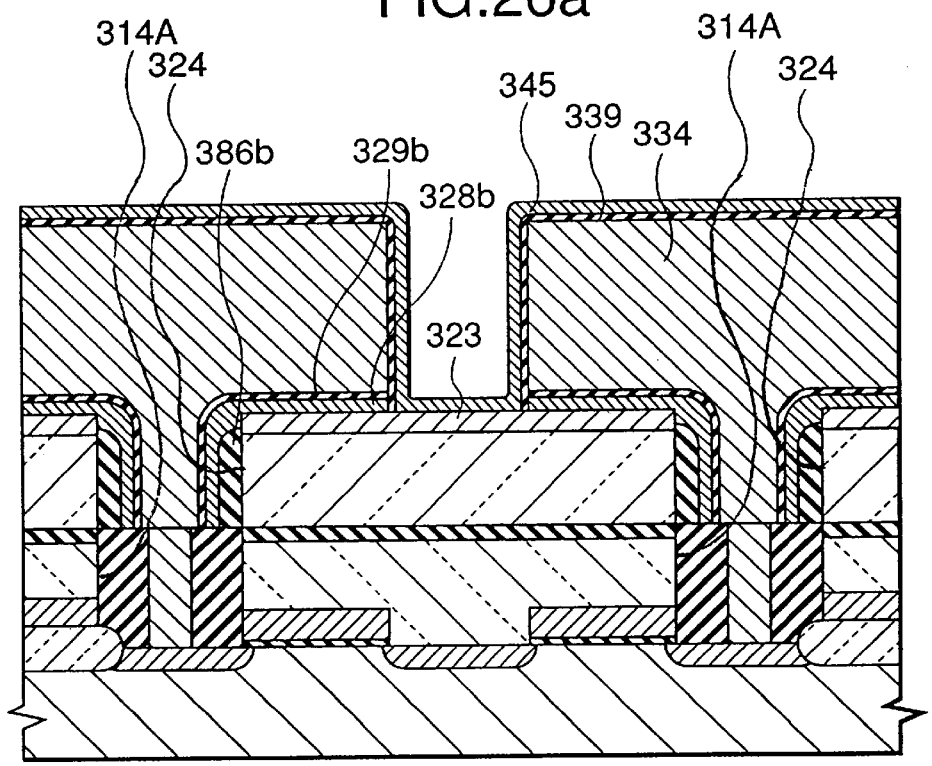
FIGS. 26(a) and 26(b) are schematic section views of a second application example of the third embodiment.
Figure 26B:
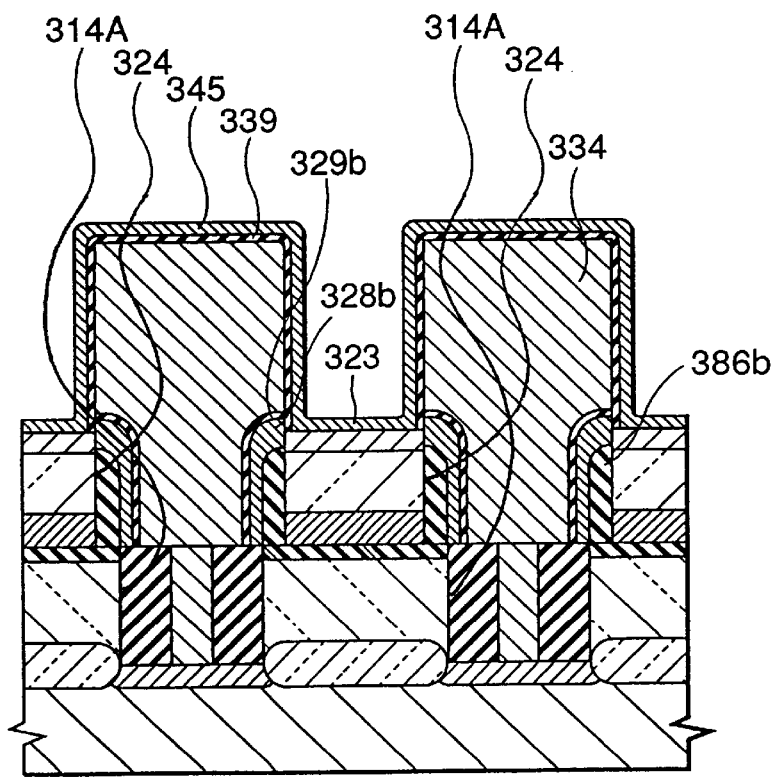

In the first application example of the third embodiment, the upper ends of the silicon oxide film spacers 386a approximately coincide with the upper surfaces of the N-type silicon films 323. In the third embodiment, the silicon oxide film spacer is not limited to such a form. Referring to FIG. 26 which is a schematic section view showing the memory cell of the DRAM and FIG. 27 which is a schematic section view showing the main manufacturing steps of the memory cell of the DRAM, in a second application example of the third embodiment, mainly the forms of silicon oxide film spacers covering the sides of the upper node contact holes are different from those of the first application example of the third embodiment.

The upper ends of the silicon oxide film spacers 386a of the application example directly covering the sides of the upper node contact holes 324 exist between the upper surfaces and the bottom surfaces of the N-type silicon films (in the sides of the N-type silicon films 323 formed in the upper ends of these upper node contact holes 324). The upper ends of the silicon oxide film spacers 386a are positioned higher than the bottom surfaces of the N-type silicon films 323 so as to prevent thermal diffusion of boron from the BPSG film 322 constituting the interlayer insulating film to the titanium nitride film 328b constituting the lower cell plate electrode. Therefore, if a second silicon oxide insulating film constituting the second interlayer insulating film is composed only of a silicon oxide film without including any BPSG films 322, the position of the upper ends of the silicon oxide film spacers 386a may be set higher than the upper surfaces of the bit lines 318 and lower than the bottom surfaces of the N-type silicon films 323.

A titanium nitride film 328b constituting the lower cell plate electrode is also directly connected to the side of the N-type silicon film 323 (of a portion not covered by the silicon oxide film spacer 386a) in the upper ends of the upper node contact holes 324. In the first application example of the third embodiment, in a portion in parallel with the bit lines 318 in the upper ends of the upper node contact holes 324 (see FIG. 22), no connection is made between the N-type silicon film 323 and the titanium nitride film 328aa constituting the upper cell plate electrode via the silicon oxide film spacer 386a and the titanium nitride film 339 as an upper capacitive insulating film (these are connected to each other in a portion in parallel with the word lines 304 in the upper ends of the upper node contact holes 324). In the present application example, however, even in a portion in parallel with the bit lines 318 in the upper ends of the upper node contact holes 324, the N-type silicon film 323 and the titanium nitride film 328b are directly connected to each other. That is, the present application example provides a more reliable lower cell plate electrode than the first application example of the third embodiment.

The main manufacturing steps of the memory cell of the application example comprises forming of silicon oxide film spacer 386bs and forming of titanium nitride films 328b (and titanium oxide films 329b). By means of the same method as that of the first application example of the third embodiment, after forming of upper node contact holes 324, silicon oxide films each having a film thickness of about 40 nm (composed of an HTO film) is formed on the full surface by means of LPCVD and these silicon oxide films are selectively over-etched back, forming silicon oxide film spacers 386b [FIG. 27(a)]. This is possible because of the existence of the silicon nitride film 313 and the silicon nitride film spacers 316 constituting the upper surface of the first interlayer insulating film.

Subsequently, by means of the same method as that of the first application example of the third embodiment, titanium nitride films 327b are formed. The film thickness of each titanium nitride film 327b in a portion directly covering the silicon oxide film spacer 386b is about 30 nm [FIG. 27(b)]. This titanium nitride film 327b does not create any problems in coating of different levels in the upper ends of the upper node contact holes or in the vicinity thereof. This is because LPCVD and sputtering are used together for forming of this film. As a result, no difficulties will occur even if silicon oxide film spacers 386b having the above-noted shapes are provided.

Thereafter, as in the first application example of the third embodiment, the titanium nitride film 327b is etched back by means of different direction etching and plasma-oxidized, forming titanium oxide and titanium nitride films 329b and 328b, and then a storage node electrode 334 is formed [FIG. 27(c)]. The manufacturing steps are the same as those of the first application example of the third embodiment thereafter.

The second application example of the third embodiment has the same effect as that of the first application example of the third embodiment, aside from the above-noted advantage over the first application example of the third embodiment.

As apparent from the foregoing, the structure of the memory cell of the semiconductor memory device of the present invention is as follows.

The capacitive insulating film of the memory cell of the DRAM of the invention is no shared by a plurality of memory cells unlike the conventional DRAM memory cell and composed of lower and upper capacitive insulating films belonging to each memory cell. The cell plate electrode of the invention is, different from the conventional type, composed of lower and upper cell plate electrodes. The storage node electrode of the DRAM memory cell of the invention is directly connected to the N-type source region via the lower node contact holes provided in the first interlayer insulating film having a flat upper surface and the upper node contact holes provided in the second interlayer insulating film having a flat upper surface. Silicon nitride film spacers having flat upper surfaces coinciding with the upper surface of the first interlayer insulating film are provided in the sides of the lower node contact holes and these lower node contact holes are filled with the contact plugs via the silicon nitride film spacers.

The lower cell plate electrode directly covers the upper surface of the second interlayer insulating film and the sides of the upper node contact holes, being in contact only with the upper surfaces of the silicon nitride film spacers in the upper ends of the lower node contact holes. The lower capacitive insulating film is formed in self-alignment with the storage node electrode, directly covering the surface of the lower cell plate electrode in a region excluding the gap of the storage node electrode and being in contact only with the upper surfaces of the silicon nitride film spacers in the upper ends of the lower node contact holes. In the upper node contact holes, the storage node electrode has a shape for filling the upper node contact holes via the lower capacitive insulating film and the lower cell plate electrode. The upper capacitive insulating film directly covers only the side and upper surface of the storage node electrode, being directly connected to the lower capacitive insulating film all around the lower end of the side of the storage node electrode. The upper cell plate electrode covers the side and upper surface of the storage node electrode via the upper capacitive insulating film, being directly connected to the surface of the lower cell plate electrode in the gap of the storage node electrode.

The manufacturing method of the semiconductor memory device of the invention enables manufacturing of the device having the above-discussed structure.

As apparent from the foregoing structure, the DRAM memory cell of the invention has the lower capacitive insulating film and the lower cell plate electrode and thus the capacitor is formed in the region in which the storage node electrode covers the upper surface of the interlayer insulating film and the sides of the node contact holes. As a result, the memory cell of the invention provides an effect that the surface ratio of the storage node electrode, contributing to the capacitor, increases more than the conventional memory cell.

What is claimed is:

1. A semiconductor memory device comprising:

word lines approximately in parallel with a first direction which traverses on surfaces of element formation regions surrounded by field oxide films formed on a semiconductor substrate, and source and drain regions are formed in said element formation regions;

a first interlayer insulating film formed by laminating a silicon nitride film on a first silicon oxide film, said first interlayer insulating film having a flat upper surface covering surfaces of said semiconductor substrate and said word lines, and said interlayer insulating film being provided with a bit contact hole reaching said drain region and a lower node contact hole reaching said source region;

said lower node contact hole having a side surface covered by a silicon nitride film spacer having a flat upper surface coinciding with an upper surface of said silicon nitride film, said lower node contact hole filled with contact plug covering said silicon nitride film spacer;

at least one bit line provided on a surface of said first interlayer insulating film, said bit line being connected to said drain region by means of said bit contact hole approximately in parallel with a second direction orthogonal to said first direction;

a second interlayer insulating film composed of a second silicon oxide insulating film having a flat upper surface, said second intelayer insulating film covering surfaces of said first interlayer insulating film and said bit line and being provided with an upper node contact hole, said upper node contact hole which reaches said lower node contact hole;

a lower cell plate electrode which contacts with an upper surface of said silicon nitride film spacer in an upper end of said lower node contact hole, said lower cell plate electrode directly covering an upper surface of said second intelayer insulating film and a side surface of said second interlayer insulating film exposed by said upper node contact hole;

a lower capacitive insulating film which contacts with an upper surface of said silicon nitride film spacer in an upper end of said lower node contact hole, said lower capacitive insulating film covering a surface of said lower cell plate electrode in said upper node contact hole and a surface of said lower cell plate electrode formed on an upper surface of said second interlayer insulating film;

a storage node electrode which is connected to an upper surface of said contact plug and contacts with an upper surface of said silicon nitride film spacer in the vicinity of said contact plug, said storage node electrode covering said lower capacitive insulating film and formed on a portion of said lower capacitive insulating film on said second interlayer insulating film;

an upper capacitive insulating film composed of same material for said lower capacitive insulating film, said upper capacitive insulating film covering upper and side surfaces of said storage node electrode and being connected to said said lower capacitive insulating film so that said upper capacitive insulating film is sandwiched between said lower cell plate electrode and lower cell plate electrode formed on said second interlayer insulating film; and an upper cell plate electrode covering said upper capacitive insulating film and being connected to a portion of said lower cell plate electrode formed on said second interlayer insulating film.

2. A semiconductor memory device according to claim 1, wherein said bit contact hole and said lower node contact hole are provided in self-alignment with said word lines.

3. A semiconductor memory device according to claim 2, wherein said upper node contact hole is provided with a silicon oxide film spacer, which covers at least a side of second interlayer insulating film exposed by said upper node contact hole and contacts with an upper surface of said nitride film spacer.

4. A semiconductor memory device according to claims 1, wherein at least a part of an upper surface of said contact plug for filling said lower node contact hole is composed of a conductive oxide.

5. A semiconductor memory device according to claim 1, wherein said lower cell plate electrode is composed of a first conductive film, which is provided only in an upper surface of said second interlayer insulating film, and a second conductive film, which is directly connected to a side of said first conductive film and covers a side of said second interlayer insulating film exposed by said upper node contact hole.

6. A semiconductor memory device according to claim 1, wherein said lower cell plate electrode is composed of a first conductive film, which is provided only in an upper surface of said second interlayer insulating film, and a second conductive film, which is covers at least a side of said second interlayer insulating film exposed by said upper node contact hole, and a third conductive film, which is directly connected to an upper surface of said first conductive film and a surface of said second conductive film.

7. A semiconductor memory device according to claim 6, wherein an upper surface of said first conductive film is composed of a conductive oxide.

8. A semiconductor memory device according to 1, wherein said lower cell plate electrode is composed of a first conductive film, which is provided only in an upper surface of said second interlayer insulating film, a second conductive film, which is directly connected to an upper surface of said first conductive film and is provided only in an upper surface of said first conductive film, and a third conductive film, which is directly connected to at least a side of said second conductive film and covers a side of said second interlayer insulating film exposed by said upper node contact hole.

9. A semiconductor memory device according to claim 8, wherein an upper surface of said first conductive film is composed of a conductive oxide.

10. A semiconductor memory device according to 1, wherein said lower cell plate electrode is composed of a first conductive film, which is provided only in an upper surface of said second interlayer insulating film, a second conductive film, which is directly connected to an upper surface of said first conductive film, and covers a side of said second interlayer insulating film exposed by said upper node contact hole.

11. A semiconductor memory device according to claim 10,
wherein an upper surface of said first conductive film is composed of a conductive oxide.

12. A semiconductor memory device comprising:
a semiconductor substrate;
an insulating layer formed over said semiconductor substrate, said insulating layer having a contact hole;
a first conductive film formed on an upper surface of said insulating layer and side surface of said insulating layer in said contact hole;
a first capacitive insulating film formed on said first conductive film so that said first conductive film is sandwiched between said capacitive insulating film and said upper and side surfaces of said insulating layer;
a second conductive film formed on said capacitive insulating film in said contact hole and a portion of an upper surface of said first conductive film;
a second capacitive insulating film formed on side and upper surfaces of said second conductive film; and
a third conductive film formed on said second capacitive insulating film and connected electrically to said first conductive film
said device further comprising:
an insulating spacer formed on a lower side of said insulating layer exposed by said contact hole;
wherein each of said first conductive film and said first capacitive insulating film has the respective end being in contact with an upper surface of said insulating spacer.

13. The device as claimed in claim 12, wherein a thickness of said insulating spacer is thicker than that of first conductive film formed in said contact hole.

14. The device as claimed in claim 12, said device further comprising a contact plug burying a hole defined by said insulating spacer, said contact plug is connected to said second conductive film electrically.

15. The device as claimed in claim 14, wherein said upper surface of said insulating layer is contact with a bottom surface of said first conductive film and said first conductive film formed on said side surface of said insulating layer is vertical.

16. A semiconductor memory device comprising:
a semiconductor substrate having a diffusion region;
an insulating layer formed over said semiconductor substrate, said insulating layer having a contact hole;
a first capacitor electrode layer formed over said insulating layer and into said contact hole so that said first capacitor electrode layer is connected to said diffusion region eclectically;
a capacitor insulating film formed on said first capacitor electrode layer; and
a second capacitor electrode layer formed such that said capacitor insulating film is sandwiched between said second capacitor electrode layer and an upper surface of said first capacitor electrode layer, between said second capacitor electrode layer and a side surface of said first capacitor electrode layer, between said second capacitor electrode layer directly formed on an upper surface of said insulating film and a bottom surface of said first capacitor electrode layer, and between said second capacitor electrode layer formed on a side surface of said insulating film and said first capacitor electrode layer formed in said contact hole;
said device further comprising:
an insulating spacer formed on a lower side of said insulating layer exposed by said contact hole;
wherein each of said second capacitor electrode layer and said capacitor insulating film has the respective end being contact with an upper surface of said insulating spacer.

17. The device as claimed in claim 16, wherein a thickness of said insulating spacer is thicker than that of second capacitor electrode layer formed in said contact hole.

18. The device as claimed in claim 16, said device further comprising a contact plug burying a hole defined by said insulating spacer, said contact plug is connected to said first capacitor electrode layer electrically.

19. The device as claimed in claim 16, wherein a thickness of said insulating spacer is thicker than that of second capacitor electrode layer formed in said contact hole to prevent said second capacitor electrode layer connecting electrically with said contact plug and said second capacitor electrode formed on said side surface of said insulating film is vertical.

20. A semiconductor memory device comprising:
a semiconductor substrate;
an insulating layer formed over said semiconductor substrate, said insulating layer having a contact hole;
a first capacitor electrode layer formed over said insulating layer and into said contact hole so that said first capacitor electrode layer is connected to a diffusion region in said semiconductor substrate;
a capacitor insulating film formed on said first capacitor electrode layer; and
a most far outside second capacitor electrode layer formed on said capacitor insulating film covering upper and side surfaces of said first capacitor electrode, said second capacitor electrode layer is extending such that said second capacitor electrode layer is located between said capacitor insulating film covering a bottom surface of said first capacitor electrode and an upper surface of said insulating layer, and is located between said first capacitor electrode buried in said contact hole and a side surface of said insulating layer,
said device further comprising:
an insulating spacer formed on a lower side of said insulating layer exposed by said contact hole;
wherein each of said second capacitor electrode layer and said capacitor insulating film has the respective end being contact with an upper surface of said insulating spacer.

21. The device as claimed in claim 20, wherein a thickness of said insulating spacer is thicker than that of second capacitor electrode layer formed in said contact hole.

22. A semiconductor memory device comprising;
a semiconductor substrate;
an insulating layer formed over said semiconductor substrate, said insulating layer having a contact hole;
a first capacitor electrode layer formed over said insulating layer and into said contact hole so that said first capacitor electrode layer is connected to a diffusion region in said semiconductor substrate;
a capacitor insulating film formed on said first capacitor electrode layer; and
a most far outside second capacitor electrode layer formed on said capacitor insulating film covering upper and side surfaces of said first capacitor electrode, said second capacitor electrode layer is extending such that said second capacitor electrode layer is located between said capacitor insulating film covering a bottom surface of said first capacitor electrode and an upper surface of said insulating layer, and is located between said first capacitor electrode buried in said contact hole and a side surface of said insulating layer, said device further comprising an insulating spacer formed on a lower side of said insulating layer exposed by said contact hole, a contact plug burying a hole defined by said insulating spacer, said contact plug is connected to said first capacitor electrode layer electrically.

23. The device as claimed in claim 22, wherein the extended second capacitor electrode layer extends horizontally at a portion where said second capacitor electrode is located between said capacitor insulating film covering said bottom surface of said first capacitor electrode film and said upper surface of said insulating layer and extends vertically at a portion where said second capacitor electrode is located between said first capacitor electrode buried in said contact hole and a side surface of said insulating layer.

* * * * *